(12) United States Patent
Zhang et al.

(10) Patent No.: US 10,355,015 B2
(45) Date of Patent: *Jul. 16, 2019

(54) THREE-DIMENSIONAL NAND MEMORY DEVICE WITH COMMON BIT LINE FOR MULTIPLE NAND STRINGS IN EACH MEMORY BLOCK

(71) Applicant: SANDISK TECHNOLOGIES LLC, Plano, TX (US)

(72) Inventors: Yanli Zhang, San Jose, CA (US); James Kai, Santa Clara, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/948,737

(22) Filed: Apr. 9, 2018

(65) Prior Publication Data

US 2018/0233513 A1 Aug. 16, 2018

Related U.S. Application Data

(63) Continuation-in-part of application No. 15/078,555, filed on Mar. 23, 2016.

(51) Int. Cl.
*G11C 16/10* (2006.01)
*G11C 16/26* (2006.01)
(Continued)

(52) U.S. Cl.
CPC .... *H01L 27/11582* (2013.01); *G11C 16/0483* (2013.01); *G11C 16/08* (2013.01);
(Continued)

(58) Field of Classification Search
CPC ..... G11C 16/0483; G11C 16/10; G11C 16/08; G11C 16/26; G11C 16/16; G11C 16/24; G11C 16/12
See application file for complete search history.

(56) References Cited

U.S. PATENT DOCUMENTS 5,915,167 A 6/1999 Leedy
6,028,788 A 2/2000 Choi et al.
(Continued)

FOREIGN PATENT DOCUMENTS

WO WO2002/015277 A1 2/2002

OTHER PUBLICATIONS

U.S. Appl. No. 62/248,373, filed Oct. 30, 2015, Ogawa et al.
(Continued)

*Primary Examiner* — Hien N Nguyen
(74) *Attorney, Agent, or Firm* — The Marbury Law Group PLC

(57) ABSTRACT

A memory device includes an alternating stack of insulating layers and electrically conductive layers. Vertical NAND strings are formed through the alternating stack, each of which includes a drain region, memory cell charge storage transistors, and a pair of drain select transistors in a series connection. A common bit line is electrically connected to drain regions of two vertical NAND strings. The drain select transistors of the two vertical NAND strings are configured such that drain select transistors sharing a first common drain select gate electrode provide a higher threshold voltage for one of the two vertical NAND strings, and drain select transistors sharing a second common drain select gate electrode provide a higher threshold voltage for the other of the two vertical NAND strings. The different threshold voltages can be provided by a combination of a masked ion implantation and selective charge injection.

14 Claims, 48 Drawing Sheets

(51) Int. Cl.
| | |
|---|---|
| *H01L 27/11582* | (2017.01) |
| *H01L 27/1157* | (2017.01) |
| *G11C 16/24* | (2006.01) |
| *G11C 16/04* | (2006.01) |
| *H01L 29/792* | (2006.01) |
| *G11C 16/08* | (2006.01) |
| *H01L 27/11575* | (2017.01) |

(52) U.S. Cl.
CPC .............. *G11C 16/10* (2013.01); *G11C 16/24* (2013.01); *G11C 16/26* (2013.01); *H01L 27/1157* (2013.01); *H01L 29/7926* (2013.01); *H01L 27/11575* (2013.01)

(56) References Cited

U.S. PATENT DOCUMENTS

| | | |
|---|---|---|
| 6,759,333 B2 | 7/2004 | Okajima et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,349,681 B2 | 1/2013 | Alsmeier et al. |
| 8,658,499 B2 | 2/2014 | Makala et al. |
| 9,023,719 B2 | 5/2015 | Pachamuthu et al. |
| 9,177,966 B1 | 11/2015 | Rabkin et al. |
| 9,484,296 B2 | 11/2016 | Takahashi et al. |
| 9,613,975 B2 | 4/2017 | Huang et al. |
| 9,620,514 B2 | 4/2017 | Kai et al. |
| 9,666,594 B2 | 5/2017 | Mizuno et al. |
| 2007/0210338 A1 | 9/2007 | Orlowski |
| 2007/0252201 A1 | 11/2007 | Kito et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0198687 A1 | 8/2011 | Lee |
| 2011/0248327 A1 | 10/2011 | Son et al. |
| 2011/0266606 A1 | 11/2011 | Park et al. |
| 2011/0280077 A1 | 11/2011 | Fishburn |
| 2011/0310670 A1 | 12/2011 | Shim et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0032245 A1 | 2/2012 | Hwang et al. |
| 2012/0092926 A1 | 4/2012 | Whang |
| 2012/0146122 A1 | 6/2012 | Whang et al. |
| 2013/0092994 A1 | 4/2013 | Shim et al. |
| 2013/0264631 A1 | 10/2013 | Alsmeier et al. |
| 2013/0313627 A1 | 11/2013 | Lee et al. |
| 2014/0001530 A1 | 1/2014 | Song |
| 2014/0138760 A1 | 5/2014 | Makala et al. |
| 2014/0284693 A1 | 9/2014 | Sato et al. |
| 2015/0076584 A1 | 3/2015 | Pachamuthu et al. |
| 2015/0179660 A1 | 6/2015 | Yada et al. |
| 2015/0348637 A1 | 12/2015 | Han et al. |
| 2016/0093635 A1 | 3/2016 | Rabkin et al. |
| 2017/0278571 A1* | 9/2017 | Chowdhury ....... G11C 16/0483 |

OTHER PUBLICATIONS

U.S. Appl. No. 15/580,073, filed Dec. 21, 2017, Hosoda et al.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) pp. 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, M., "3D Cells Make Terabit NAND Flash Possible," Nikkei Electronics Asia, Sep. 17, 2009, 6pgs.
International Search Report and Written Opinion, International Application No. PCT/US2011/042566, dated Jan. 17, 2012.
Invitation to Pay Additional Fees & Partial International Search Report, PCT/US2011/042566, dated Sep. 28, 2011.
Chen et al., "Reliability Characteristics of NiSi Nanocrystals Embedded in Oxide and Nitride Layers for Nonvolatile Memory Application," Applied Physics Letters, 92, 152114 (2008).
Invitation to Pay Additional Search Fees, International Application No. PCT/US2013/048508, dated Sep. 18, 2013.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
International Search Report and Written Opinion, International Application No. PCT/US2013/048508, dated Dec. 18, 2013.
Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).
Diaz, "Low-k Dielectrics: Materials and Process Technology," EE518, Penn State University, Apr. 13, 2006.
Saraswat, "Low-k Dieletrics," Department of Electrical Engineering, Stanford University, Jul. 2008.
International Application No. PCT/US2017/014172, Invitation to Pay Additional Fees and Communication Relating to the Results of Partial International Search Report, dated Apr. 28, 2017, 12pgs.
International Application No. PCT/US2017/014172, International Search Report and Written Opinion, dated Jun. 20, 2017, 17pgs.
International Preliminary Report on Patentability from the International Bureau for International Patent Application No. PCT/US2017/014172, dated Oct. 4, 2018, 10 pages.
U.S. Appl. No. 15/078,555, Office Action dated May 7, 2018, 15pgs.

* cited by examiner

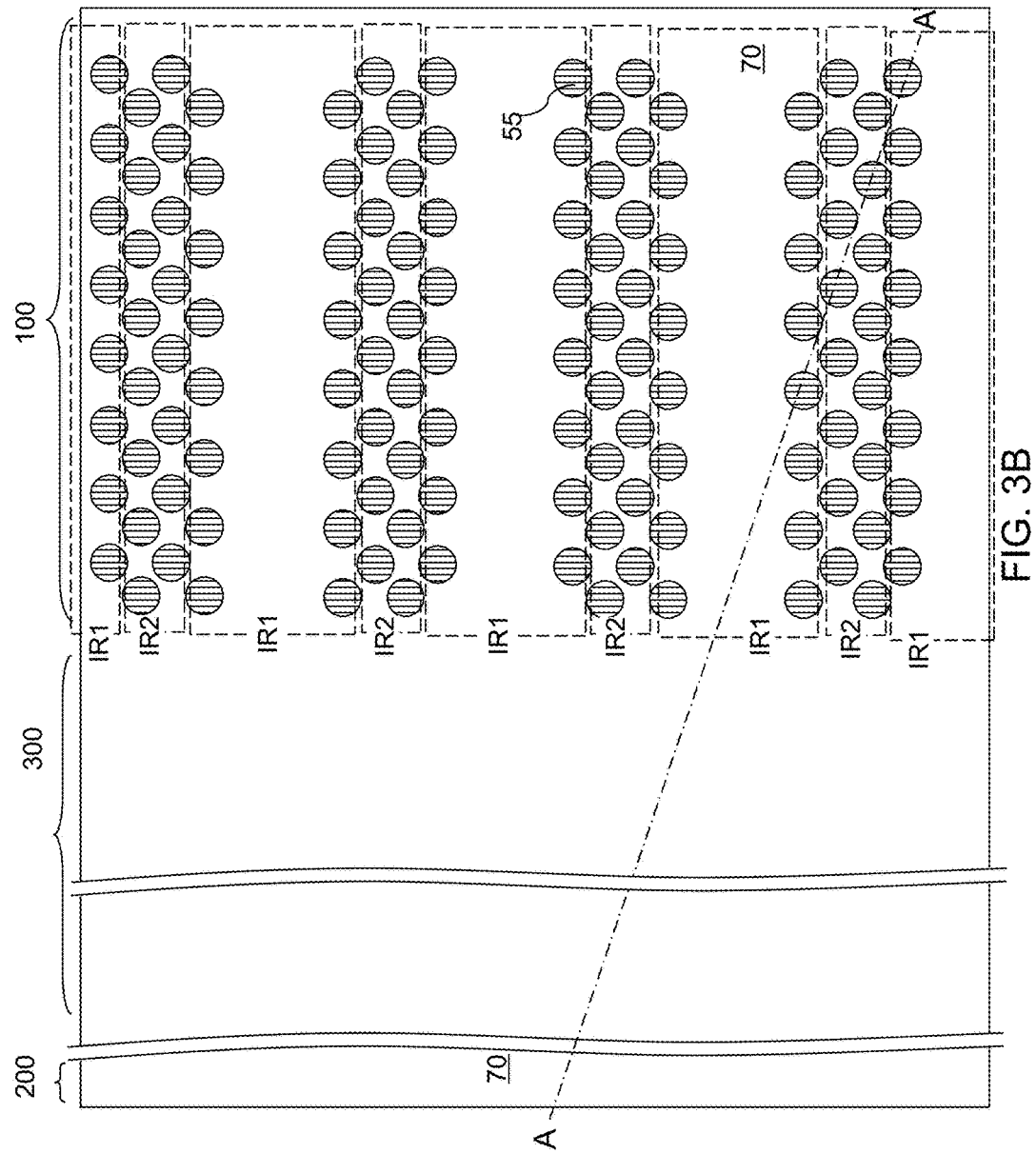

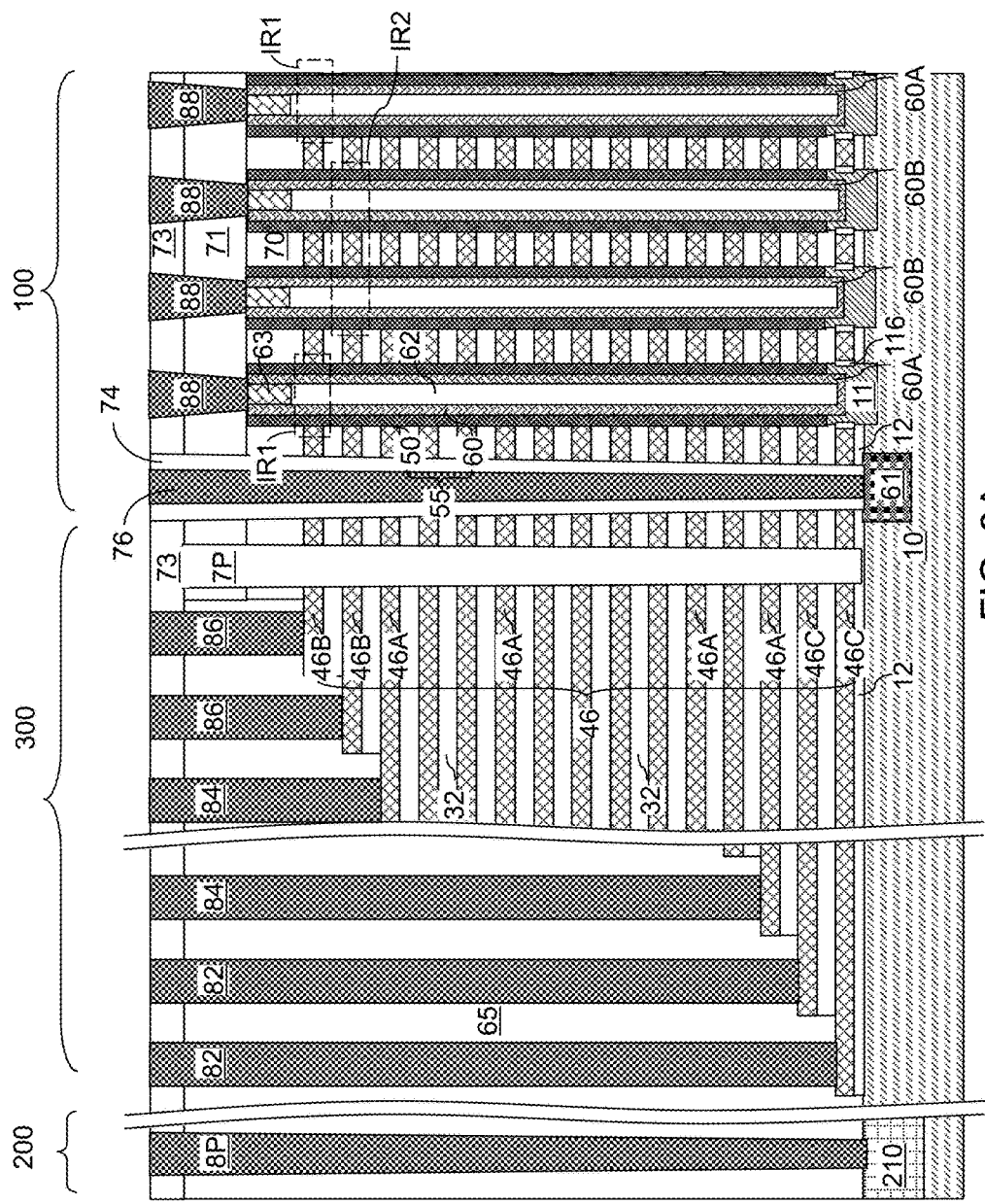

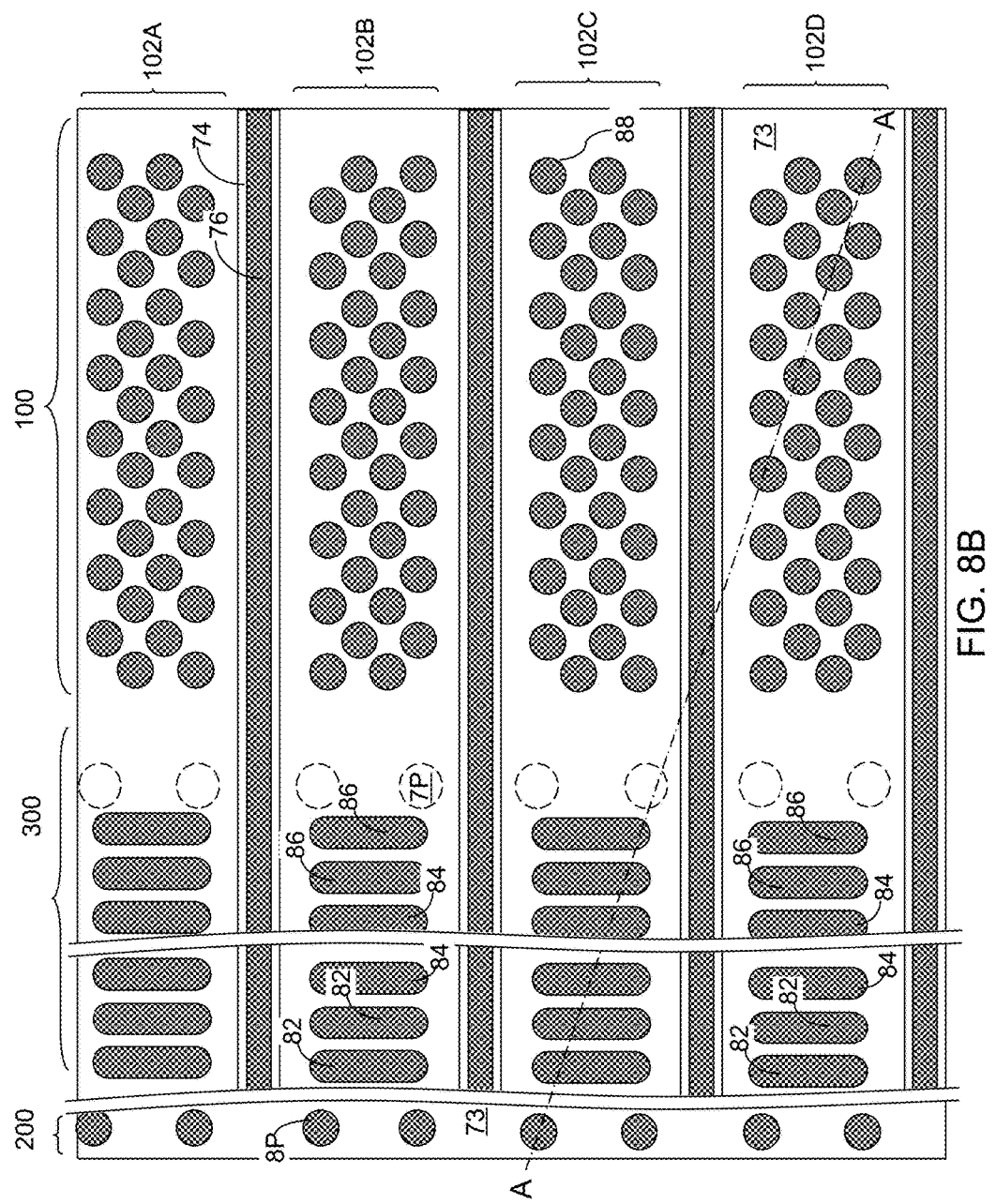

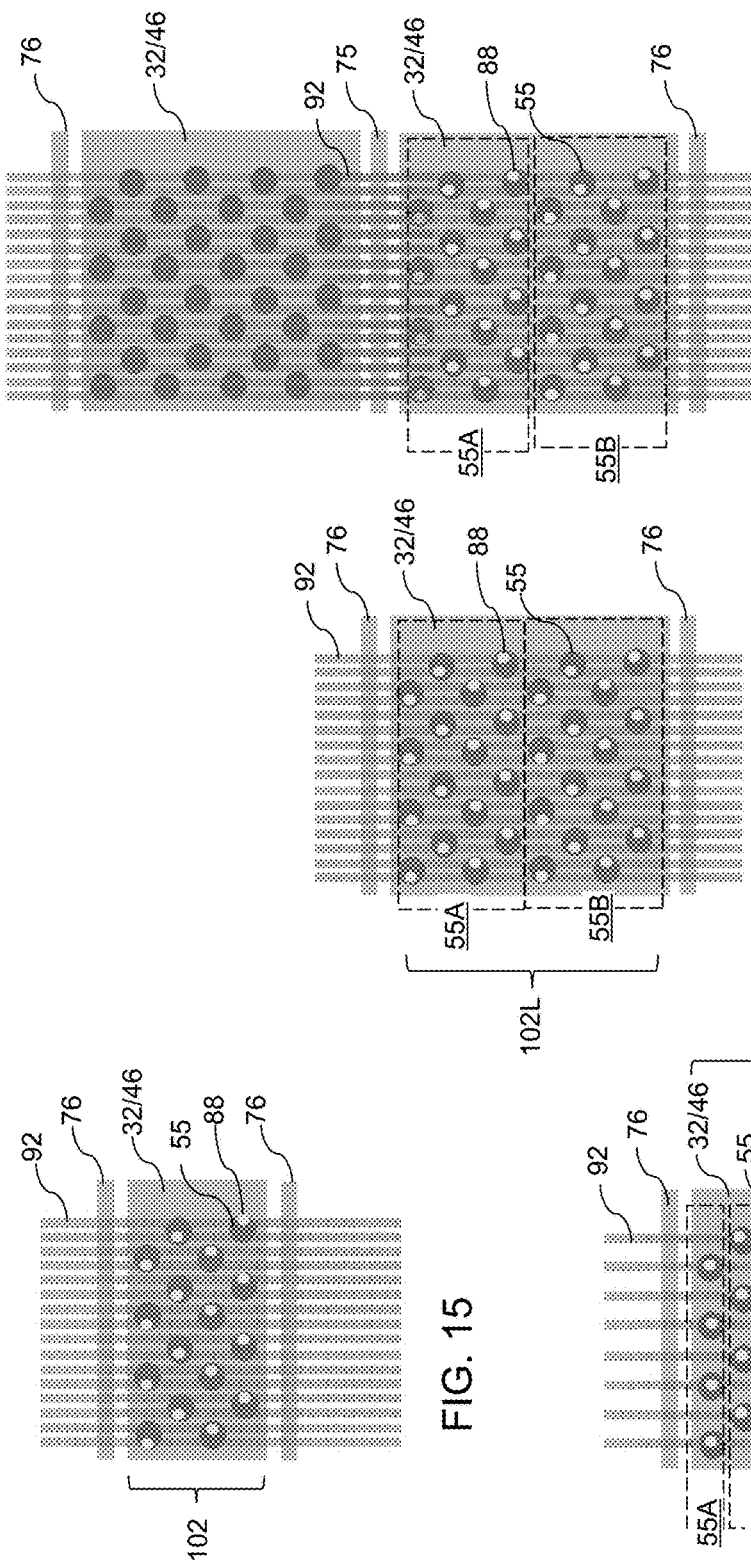

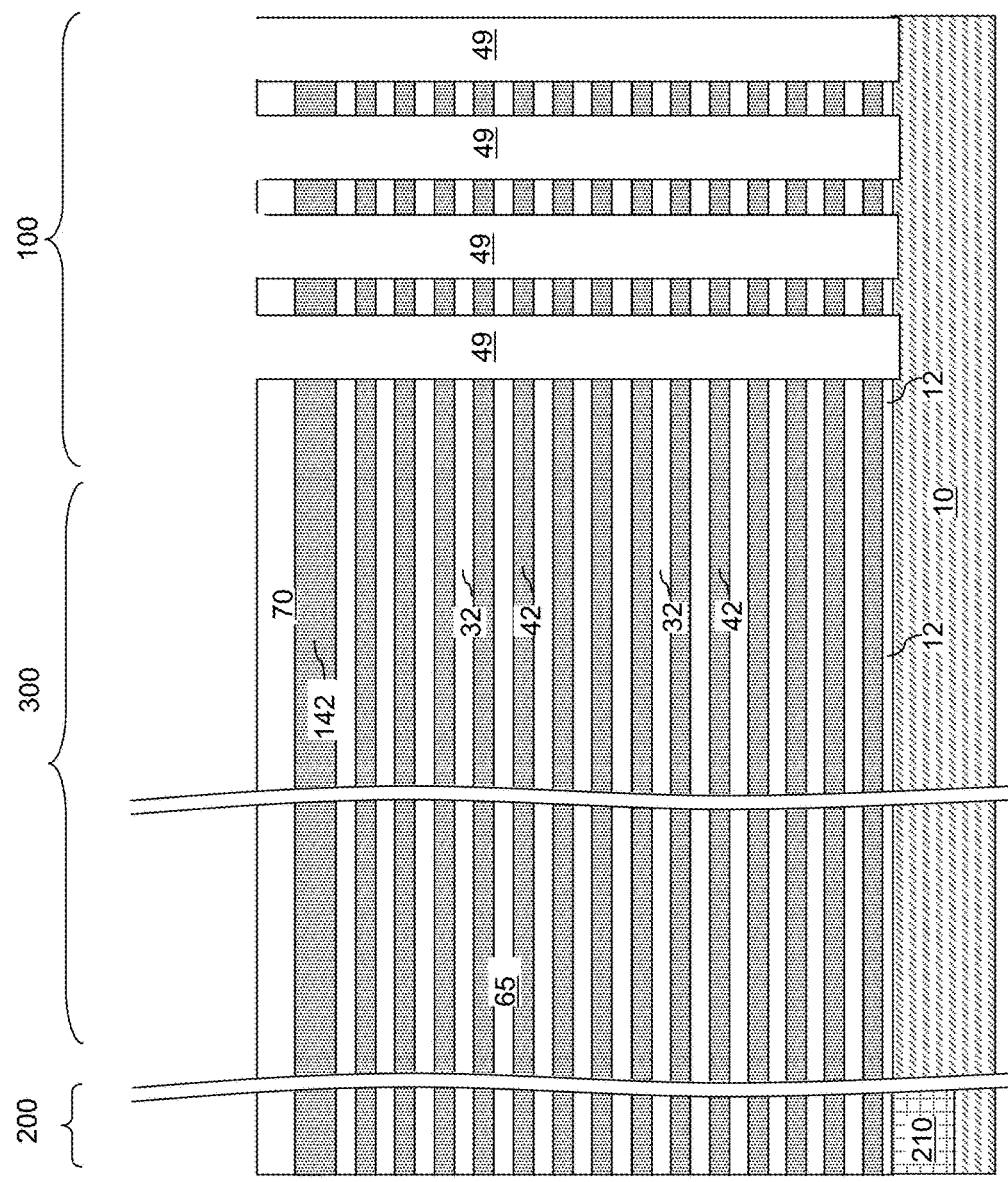

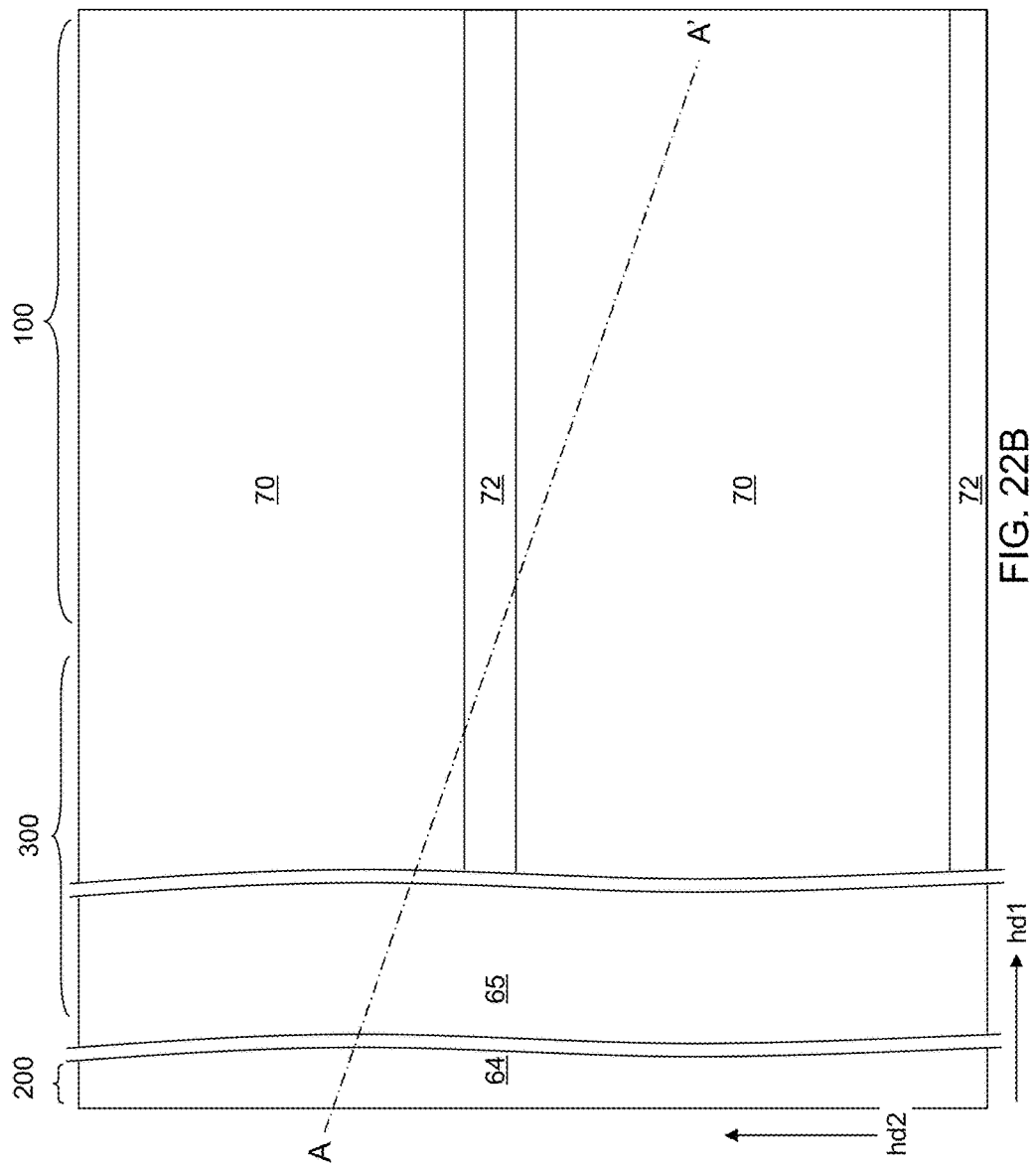

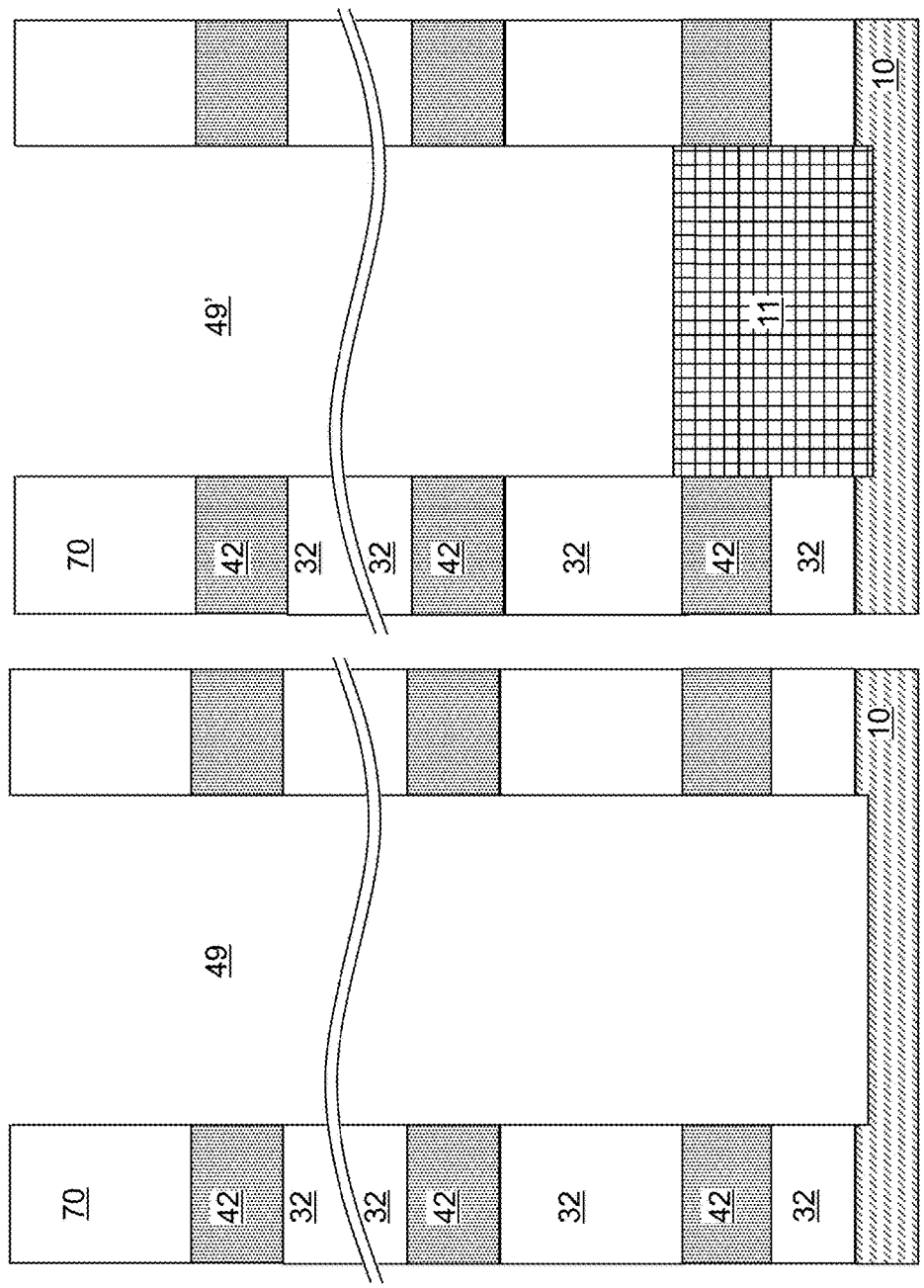

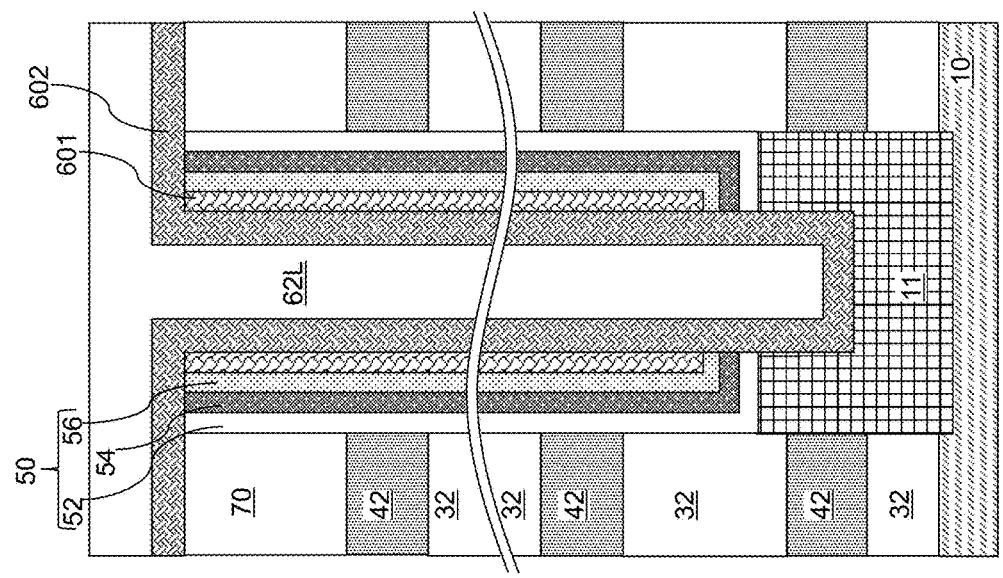
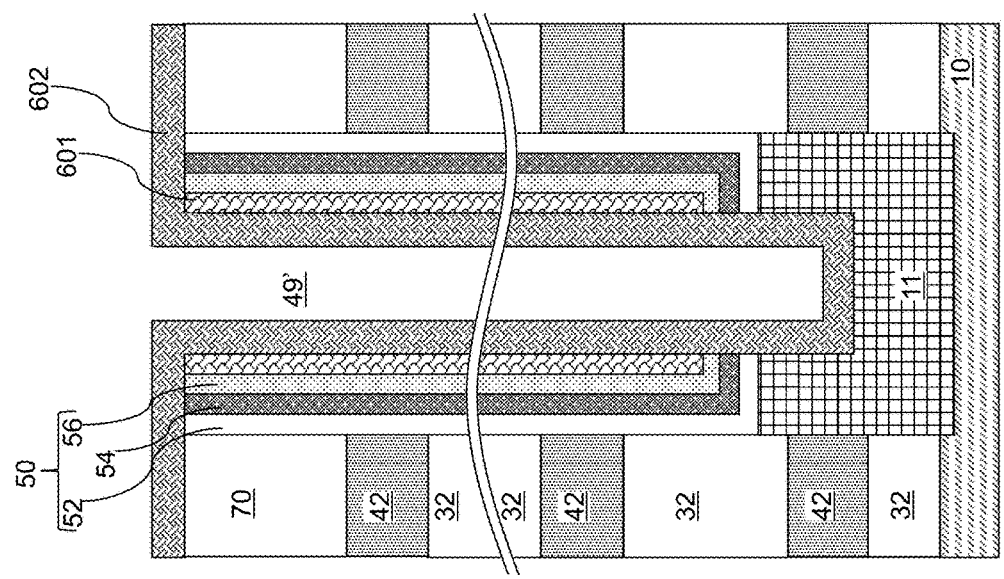

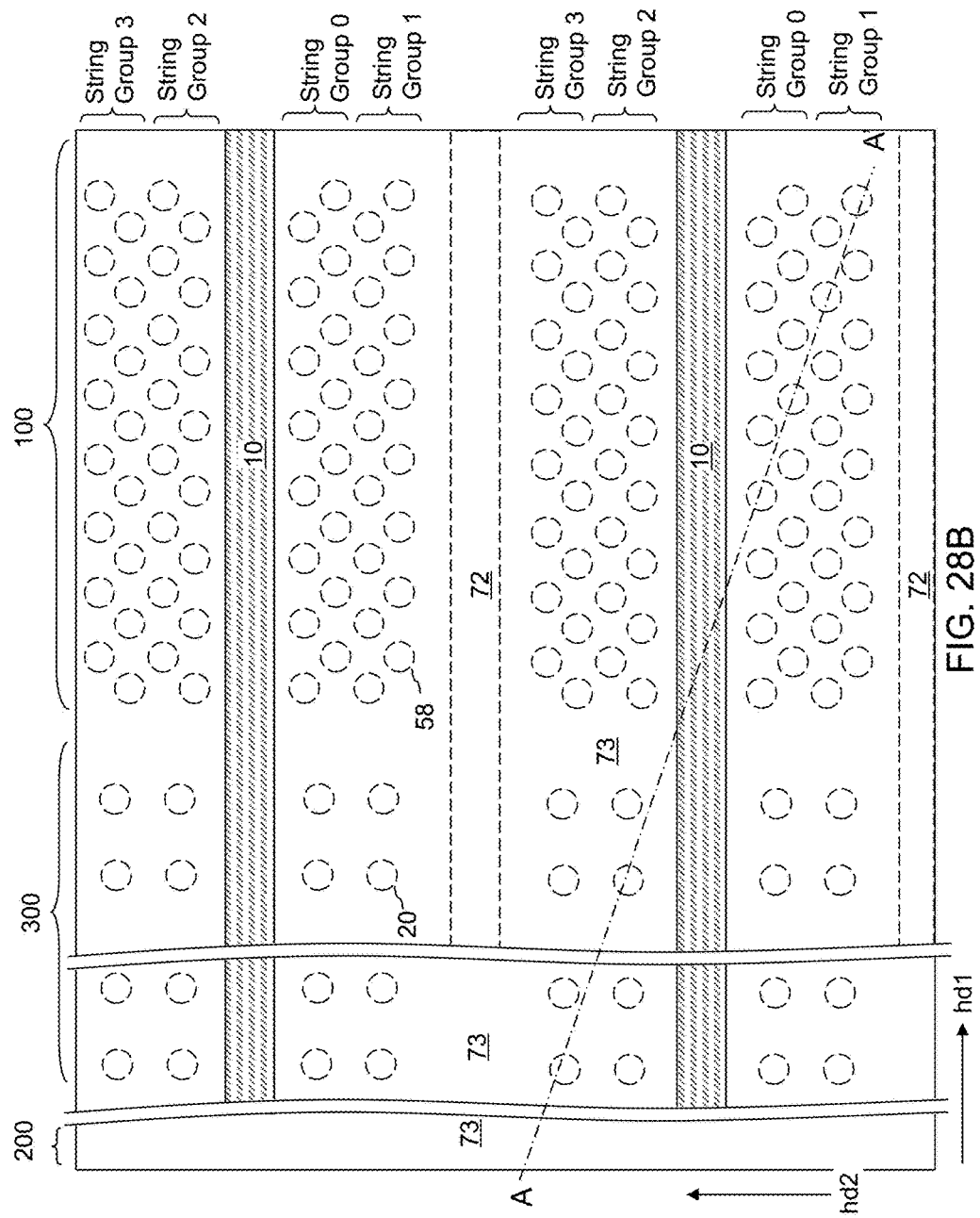

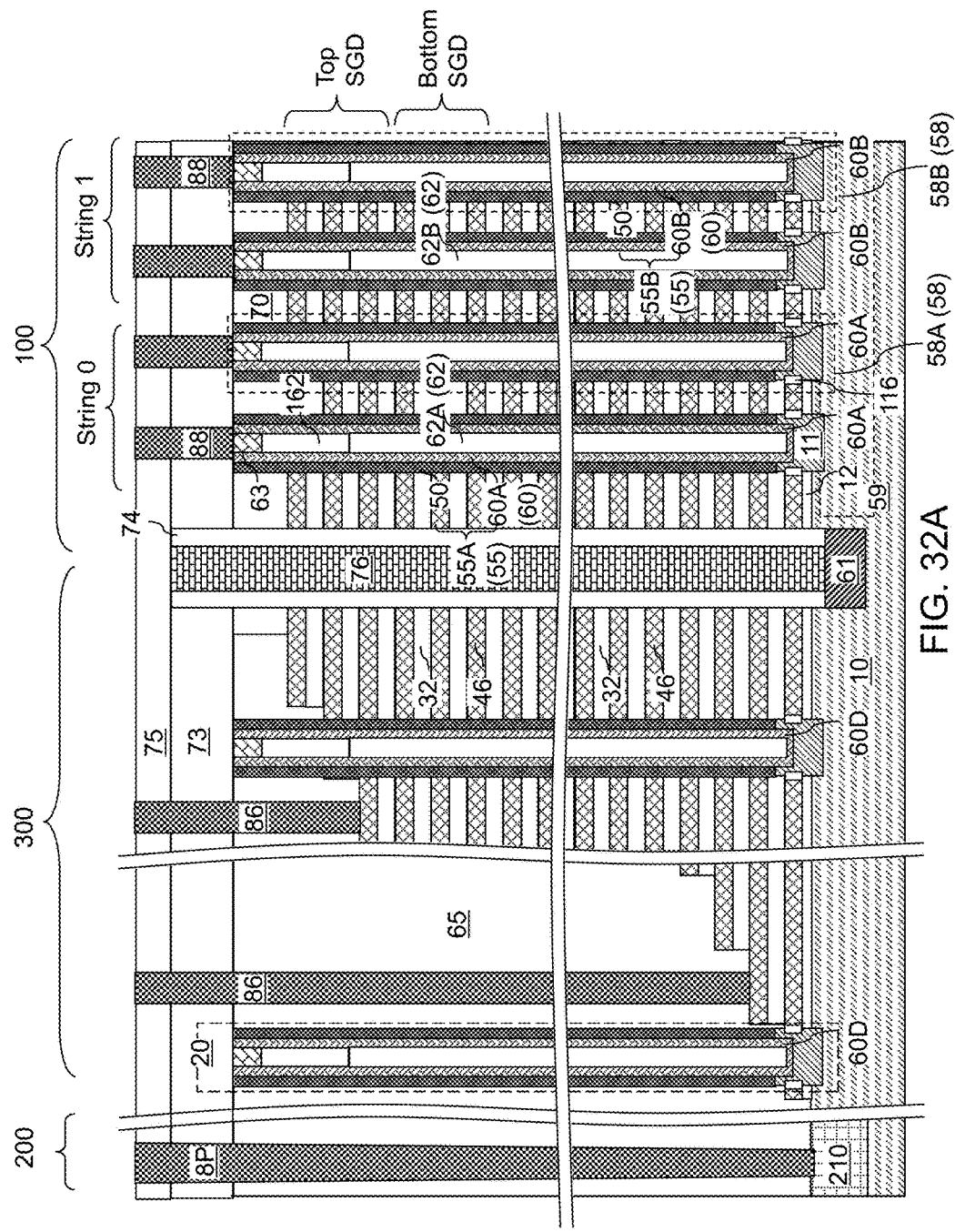

THREE-DIMENSIONAL NAND MEMORY DEVICE WITH COMMON BIT LINE FOR MULTIPLE NAND STRINGS IN EACH MEMORY BLOCK

RELATED APPLICATIONS

The present application is a continuation-in-part (CIP) application of U.S. patent application Ser. No. 15/078,555 filed on Mar. 23, 2016, the entire contents of which care incorporated herein by reference.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a memory device is provided, which comprises: an alternating stack of insulating layers and electrically conductive layers located over a substrate; a first vertical NAND string extending through the alternating stack, the first vertical NAND string comprising a first drain region and first memory cell charge storage transistors in a series connection with a first drain select transistor and a second drain select transistor; a second vertical NAND string extending through the alternating stack, the second vertical NAND string comprising a second drain region and second memory cell charge storage transistors in a series connection with a third drain select transistor and a fourth drain select transistor; and a common bit line electrically connected to the first and the second drain regions. At least one first drain-select-level electrically conductive layer among the electrically conductive layers is a common gate electrode for the first drain select transistor and the third drain select transistor. At least one second drain-select-level electrically conductive layer among the electrically conductive layers is a common gate electrode for the second drain select transistor and the fourth drain select transistor. The first drain select transistor has a higher threshold voltage than the third drain select transistor. The fourth drain select transistor has a higher threshold voltage than the third drain select transistor.

According to another aspect of the present disclosure, a method of making a memory device is provided, which comprises: forming an alternating stack of insulating layers and spacer material layers over a substrate, wherein the spacer material layers are formed as, or subsequently replaced with, electrically conductive layers; forming a first vertical NAND string through the alternating stack, the first vertical NAND string comprising a first drain region and first memory cell charge storage transistors in a series connection with a first drain select transistor and a second drain select transistor; forming a second vertical NAND string through the alternating stack, the second vertical NAND string comprising a second drain region and second memory cell charge storage transistors in a series connection with a third drain select transistor and a fourth drain select transistor, wherein at least one first drain-select-level electrically conductive layer among the electrically conductive layers is formed as a common gate electrode for the first drain select transistor and the third drain select transistor, and at least one second drain-select-level electrically conductive layer among the electrically conductive layers is formed as a common gate electrode for the second drain select transistor and the fourth drain select transistor; adjusting a threshold voltage for the first drain select transistor such that the first drain select transistor has a higher threshold voltage than the third drain select transistor; forming a bit line electrically connected to the first and the second drain regions; and adjusting a threshold voltage for the fourth drain select transistor such that the fourth drain select transistor has a higher threshold voltage than the third drain select transistor.

According to an aspect of the present disclosure, a memory device comprises an alternating stack of insulating layers and electrically conductive layers located over a substrate, a first vertical NAND string extending through the alternating stack, the first vertical NAND string comprising a first drain region and first memory cell charge storage transistors in a series connection with a first drain select transistor and a second drain select transistor, a second vertical NAND string extending through the alternating stack, the second vertical NAND string comprising a second drain region and second memory cell charge storage transistors in a series connection with a third drain select transistor and a fourth drain select transistor; and a common bit line electrically connected to the first and the second drain regions, wherein the first vertical NAND string and the second vertical NAND string are located in a same memory block.

According to another aspect of the present disclosure, a method of making a memory device is provided. An alternating stack of insulating layers and spacer material layers is formed over a substrate. The spacer material layers are formed as, or subsequently replaced with, electrically conductive layers. A first vertical NAND string comprises a first drain select transistor and a second drain select transistor is formed through the alternating stack. A second vertical NAND string comprises a third drain select transistor and a fourth drain select transistor is formed through the alternating stack. The first and third drain select transistors are formed at a level of a first electrically conductive layer. The second and fourth drain select transistors are formed at a level of a second electrically conductive layer. The first drain select transistor and the fourth drain select transistor have higher threshold voltages than threshold voltages of the second and third drain select transistors.

According to another aspect of the present disclosure, a memory device comprise an alternating stack of insulating layers and electrically conductive layers located over a substrate, a first vertical NAND string extending through the alternating stack, the first vertical NAND string comprising first memory cell charge storage transistors in a series connection with a first drain select transistor and a second drain select transistor. And a second vertical NAND string extending through the alternating stack, the second vertical NAND string comprising second memory cell charge storage transistors in a series connection with a third drain select transistor and a fourth drain select transistor. A first electrically conductive layer among the electrically conductive layers comprises a first common gate electrode for the first drain select transistor and the third drain select transistor; and a second electrically conductive layer among the electrically conductive layers comprises a second common gate electrode for the second drain select transistor and the fourth drain select transistor. The first drain select transistor and the fourth drain select transistor have higher threshold voltages than threshold voltages of the second and third drain select transistors.

BRIEF DESCRIPTION OF THE DRAWINGS

FIG. 3B is a top-down view of the first exemplary structure of FIG. 3A.

FIG. 8A is a vertical cross-sectional view of the first exemplary structure after formation of additional contact via structures according to an embodiment of the present disclosure.

FIG. 8B is a top-down view of the first exemplary structure of FIG. 8A.

FIG. 15 is a first exemplary wiring scheme for bit lines for a plurality of pairs of vertical NAND strings according to a comparative example.

FIG. 16 is a first exemplary wiring scheme for bit lines for a plurality of pairs of vertical NAND strings according to an embodiment of the present disclosure.

FIG. 17 is a second exemplary wiring scheme for bit lines for a plurality of pairs of vertical NAND strings according to an embodiment of the present disclosure.

FIG. 18 is a third exemplary wiring scheme for bit lines for a plurality of pairs of vertical NAND strings according to an embodiment of the present disclosure.

FIGS. 19A and 19B are vertical cross-sectional views of steps in a method of making a vertical NAND device according to an alternative embodiment of the present disclosure.

FIG. 22B is a top-down view of the second exemplary structure of FIG. 22A. The vertical plane A-A' is the plane of the vertical cross-sectional view of FIG. 22A.

FIGS. 24A-24F are sequential vertical cross-sectional views of a memory opening in the second exemplary structure up to the processing step for formation of a dielectric core material layer according to an embodiment of the present disclosure.

FIG. 28B is a top-down view of the second exemplary structure of FIG. 28A. The vertical plane A-A' is the plane of the vertical cross-sectional view of FIG. 28A.

FIG. 32A is a vertical cross-sectional view of the second exemplary structure after formation of word line contact via structures and drain contact via structures according to an embodiment of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1:
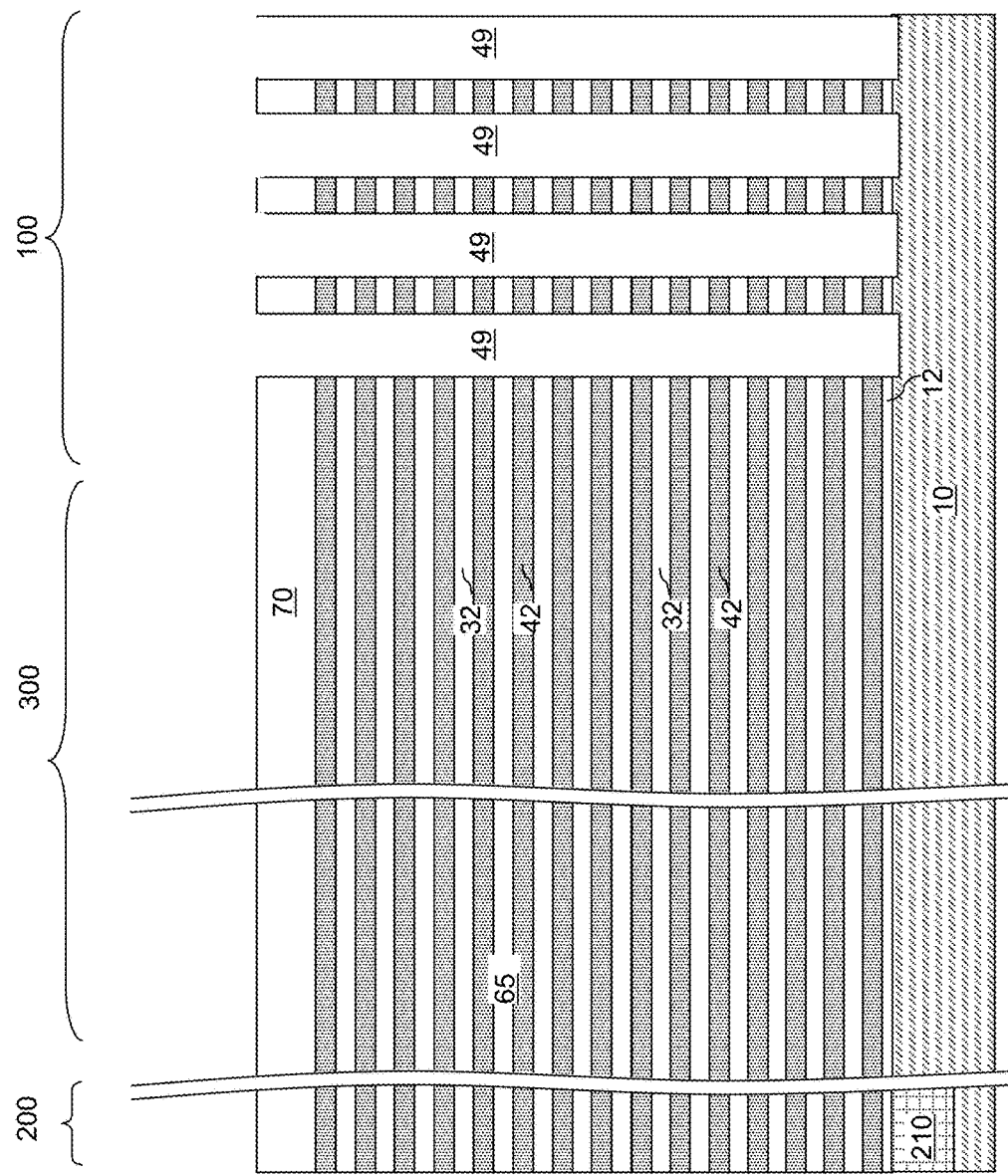
FIG. 1 is a vertical cross-sectional view of a first exemplary structure after formation of an alternating stack of insulating layers and sacrificial material layers and memory openings according to an embodiment of the present disclosure.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 10. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10.

At least one semiconductor device 210 for a peripheral circuitry can be formed on a portion of the substrate semiconductor layer 10. The at least one semiconductor device 210 can include, for example, field effect transistors. The region including the semiconductor devices is herein referred to as a peripheral device region 200. The peripheral device region 200 can include various peripheral devices needed to operate the memory devices of the present disclosure.

A gate dielectric layer 12 can be optionally formed above the substrate semiconductor layer 10. The gate dielectric layer 12 can be, for example, silicon oxide layer. The thickness of the gate dielectric layer 12 can be in a range from 3 nm to 30 nm, although lesser and greater thicknesses can also be employed.

A stack of an alternating plurality of first material layers (which can be insulating layers 32) and second material layers (which can be sacrificial material layers 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. The sacrificial material layers 42 (which are spacer material layers) are subsequently replaced with control gate electrodes, source select gate electrodes, and drain select gate electrodes for a NAND string.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the substrate semiconductor layer 10. In one embodiment, an overetch into the substrate semiconductor layer 10 may be optionally performed after the top surface of the substrate semiconductor layer 10 is physically exposed at a bottom of each memory opening 49. The overetch may be performed prior to, or after, removal of the lithographic material stack. In other words, the recessed surfaces of the substrate semiconductor layer 10 may be vertically offset from the undressed top surfaces of the substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the substrate semiconductor layer 10. Each of the memory openings 49 can include a sidewall (or a plurality of sidewalls) that extends substantially perpendicular to the topmost surface of the substrate. The region in which the array of memory openings 49 is formed is herein referred to as a memory array region 100. A contact region 300 can be provided between the memory array region 100 and the peripheral device region 200.

Each memory opening 49 extends through the insulating cap layer 70, the alternating stack (32, 42), the gate dielectric layer 12, and optionally into an upper portion of the substrate semiconductor layer 10. The recess depth of the bottom surface of each memory opening with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Figure 2:
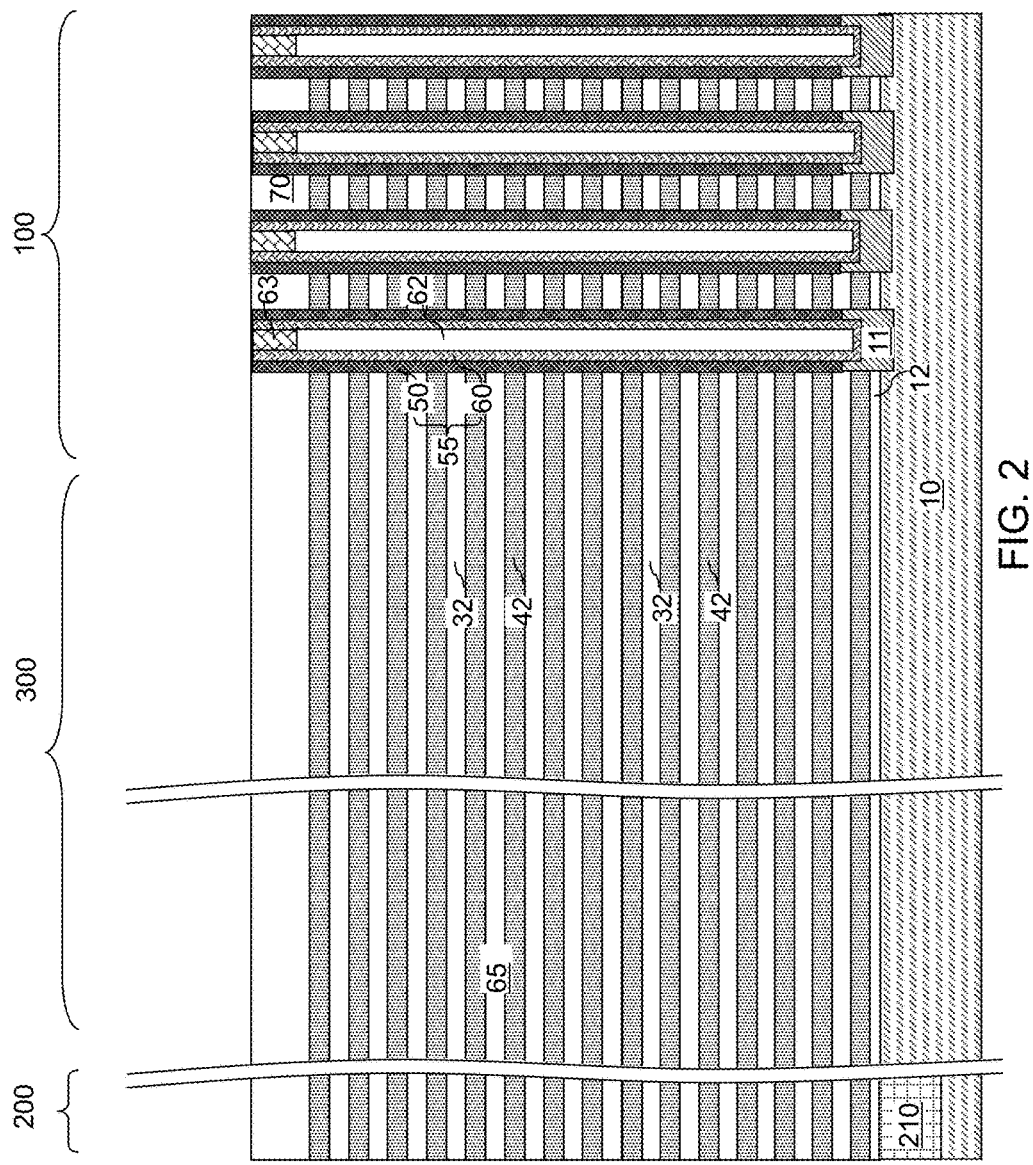
FIG. 2 is a vertical cross-sectional view of the first exemplary structure after formation of memory stack structures according to an embodiment of the present disclosure.

Referring to FIG. 2, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the substrate semiconductor layer 10. In one embodiment, the epitaxial channel portion 11 can be doped with electrical dopants of the same conductivity type as the substrate semiconductor layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

A memory stack structure 55 can be formed in each memory opening 49. An optional blocking dielectric layer and a charge trapping layer can be sequentially deposited in the memory openings 49. The blocking dielectric layer can include a single dielectric material layer or a layer stack of multiple dielectric material layers. The blocking dielectric layer can be deposited on the sidewalls of each memory opening 49 by a conformal deposition method. The blocking dielectric layer can be deposited, for example, by chemical vapor deposition (CVD), atomic layer deposition (ALD), pulsed laser deposition (PLD), liquid source misted chemical deposition, or a combination thereof. The thickness of the blocking dielectric layer can be in a range from 1 nm to 20 nm, although lesser and greater thicknesses can also be employed. The blocking dielectric layer can subsequently function as a dielectric material portion that blocks leakage of stored electrical charge to control gate electrodes.

In one embodiment, the blocking dielectric layer includes a dielectric metal oxide. As used herein, a dielectric metal oxide refers to a dielectric material that includes at least one metallic element and at least oxygen. Alternatively or additionally, the blocking dielectric layer can include silicon oxide, silicon oxynitride, silicon nitride, or a combination thereof. In one embodiment, the blocking dielectric layer can include silicon oxide. The blocking dielectric layer can be formed by a conformal deposition method such as low pressure chemical vapor deposition, atomic layer deposition, or a combination thereof. The thickness of the blocking dielectric layer can be in a range from 1 nm to 20 nm, although lesser and greater thicknesses can also be employed.

Subsequently, the charge trapping layer can be deposited as a continuous material layer over the blocking dielectric layer. In one embodiment, the charge trapping layer can be deposited as a conformal layer having a substantially same thickness throughout. As used herein, an element has a substantially same thickness throughout if the thickness of the element does not deviate from the average thickness of the element by more than 20% at all locations of the element. In one embodiment, the charge trapping layer can be a charge trapping material including a dielectric charge trapping material, which can be, for example, silicon nitride. In one embodiment, the charge trapping layer includes a silicon nitride layer.

A tunneling dielectric layer can be deposited on the physically exposed surfaces of the blocking dielectric layer and the charge trapping layer. The tunneling dielectric layer can be formed directly on the physically exposed inner sidewall of the upper portion of the blocking dielectric layer and directly on a sidewall of the remaining lower portions of the charge trapping layer. The tunneling dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed.

An optional first semiconductor channel layer can be formed on the tunneling dielectric layer. The first semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer includes amorphous silicon or polysilicon. The first semiconductor channel layer can be formed by a conformal deposition method such as low pressure chemical vapor deposition (LPCVD). The thickness of the first semiconductor channel layer can be in a range from 2 nm to 10 nm, although lesser and greater thicknesses can also be employed.

The optional first semiconductor channel layer, the tunneling dielectric layer, the charge trapping layer, and the optional blocking dielectric layer are sequentially anisotropically etched employing at least one anisotropic etch process. The portions of the first semiconductor channel layer, the tunneling dielectric layer, the charge trapping layer, and the blocking dielectric layer located above the top surface of the insulating cap layer 70 can be removed by the at least one anisotropic etch process. Further, the horizontal portions of the first semiconductor channel layer, the tunneling dielectric layer, the charge trapping layer, and the blocking dielectric layer at a bottom of each cavity can be removed to form openings in remaining portions thereof.

Each remaining portion of the first semiconductor channel layer constitutes a first semiconductor channel portion. A surface of the epitaxial channel portion 11 can be physically exposed underneath the opening through the first semiconductor channel portion, the tunneling dielectric layer, the charge trapping layer, and the blocking dielectric layer. Optionally, the physically exposed portion of the epitaxial channel portion 11 can be vertically recessed. Each tunneling dielectric layer is embedded within a charge trapping layer.

Within each memory opening, a set of a tunneling dielectric layer, a charge trapping layer, and a blocking dielectric layer collectively constitutes a memory film 50. In one embodiment, the first semiconductor channel portion, the tunneling dielectric layer, the charge trapping layer, and the blocking dielectric layer can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

A second semiconductor channel layer can be deposited directly on the semiconductor surface of the epitaxial channel portion 11 over the substrate 10, and directly on the first semiconductor channel portion. The second semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer includes amorphous silicon or polysilicon. The second semiconductor channel layer can be formed by a conformal deposition method such as low pressure chemical vapor deposition (LPCVD). The thickness of the second semiconductor channel layer can be in a range from 2 nm to 10 nm, although lesser and greater thicknesses can also be employed. The second semiconductor channel layer may partially fill the cavity in each memory opening, or may fully fill the cavity in each memory opening.

The materials of the first semiconductor channel portion and the second semiconductor channel layer are collectively referred to as a semiconductor channel material. In other words, the semiconductor channel material is a set of all semiconductor material in the first semiconductor channel portion and the second semiconductor channel layer.

In case the cavity in each memory opening is not completely filled by the second semiconductor channel layer, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer above the insulating cap layer 70 can be removed, for example, by a recess etch from above the top surface of the insulating cap layer 70. Further, the horizontal portion of the second semiconductor channel layer located above the top surface of the insulating cap layer 70 can be removed by a planarization process, which can employ a recess etch or chemical mechanical planarization (CMP). Each remaining portion of the second semiconductor channel layer within a memory opening constitutes a second semiconductor channel portion.

Each adjoining pair of a first semiconductor channel portion and a second semiconductor channel portion can collectively form a vertical semiconductor channel 60 through which electrical current can flow when a vertical NAND device including the vertical semiconductor channel 60 is turned on. A tunneling dielectric layer is embedded within a charge trapping layer, and laterally surrounds a portion of the vertical semiconductor channel 60. Each adjoining set of a blocking dielectric layer, a charge trapping layer, and a tunneling dielectric layer collectively constitute a memory film 50, which can store electrical charge with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62. Each vertical semiconductor channel 60 is formed within a respective memory film 50. Each dielectric core 62 is formed inside a respective vertical semiconductor channel 60.

A drain region 63 can be formed at an upper end of the vertical semiconductor channel 60. The drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Each set of a memory film 50 and a vertical semiconductor channel 60 in a same memory opening constitutes a memory stack structure 55. The memory stack structures 55 are formed through the in-process alternating stack of the insulating layers 32 and sacrificial material layers 42.

Figure 3A:
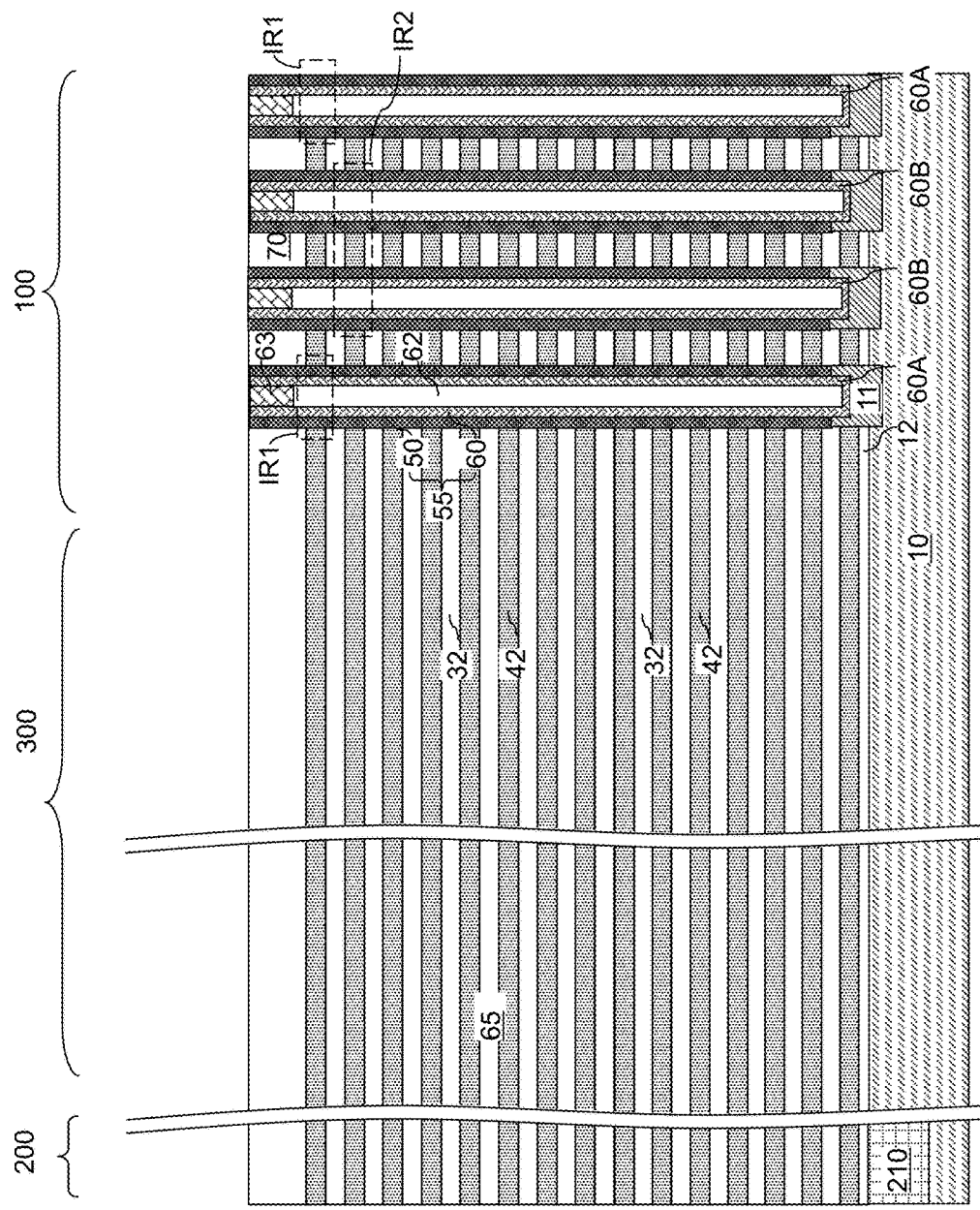
FIG. 3A is a vertical cross-sectional view of the first exemplary structure after ion implantation into portions of the semiconductor channels of the memory stack structures according to an embodiment of the present disclosure.

Referring to FIGS. 3A and 3B, ion implantation processes can be performed to form first implanted channel regions IR1 and second implanted channel regions IR2. The first implanted channel regions IR1 can be formed in a first subset of the memory stack structures 55 employing a first masked ion implantation process, and the second implanted channel regions IR2 can be formed in a second subset of the memory stack structures 55 in a second masked ion implantation process. As used herein, a "masked ion implantation process" refers to an ion implantation process that employs a patterned mask that limits the area of implantation.

The area of implantation during the first masked ion implantation process is herein referred to as a first implantation area, and the area of implantation during the second masked ion implantation process is herein referred to as a second implantation area. In one embodiment, electrical dopants can be implanted into a portion of each first vertical semiconductor channel 60A located at the level of a first spacer material layer (such as a first sacrificial material layer 42) while preventing implantation of electrical dopants into the second vertical semiconductor channels 60B in a first masked ion implantation process that employs a first ion implantation mask that includes opening over the first vertical semiconductor channels 60A. Further, additional electrical dopants can be implanted into a portion of each second vertical semiconductor channel 60B located at the level of a second spacer material layer (such as a second sacrificial material layer 42) while preventing implantation of electrical dopants into the first vertical semiconductor channels 60A in a second masked ion implantation process that employs a second ion implantation mask that includes opening over the second vertical semiconductor channels 60B.

The first implanted channel regions IR1 are formed within the first implantation area at a first level of the select drain gate electrodes, which is herein referred to as a first select drain gate electrode level. The second implanted channel regions IR2 are formed within the second implantation area at a second level of the select drain gate electrodes, which is different from the first select drain gate electrode level and is herein referred to as a second select drain gate electrode level. In one embodiment, the first select drain gate electrode level can be the level of the topmost sacrificial material layer 42 and the second select drain gate electrode level can be the sacrificial material layer 42 of the level that is the second from the top as illustrated in FIG. 3A. Alternatively, the second select drain gate electrode level can be the level of the topmost sacrificial material layer 42 and the first select drain gate electrode level can be the sacrificial material layer 42 of the level that is the second from the top. Yet alternatively, more than two select drain gate electrode levels may be provided, and the first and second select drain gate electrode levels can be any two levels among the select drain gate electrode levels.

The second subset of the memory stack structures 55 can be a complementary subset to the first subset of the memory stack structures 55. In other words, the second subset of the memory stack structures 55 can include all memory stack structures 55 that do not belong to the first subset of the memory stack structures. In one embodiment, the first subset of the memory stack structures 55 and the second subset of the memory stack structures 55 can be equal in number.

In one embodiment, the first subset of the memory stack structures 55 and the second subset of the memory stack structures 55 can be arranged in clusters within each block of memory stack structures 55. In one exemplary layout, the first subset of the memory stack structures 55 can be located in outer rows of each block of memory stack structures 55, and the second subset of the memory stack structures 55 can be located in inner rows of each block of memory stack structures 55. In another exemplary layout, the first subset of the memory stack structures 55 can be located in inner rows of each block of memory stack structures 55, and the second subset of the memory stack structures 55 can be located in outer rows of each block of memory stack structures 55. While an illustrative layout is employed to describe embodiments of the present disclosure, any other layout may be employed for placing the first implantation area and the second implantation area such that the memory stack structures 55 including respective first implanted channel regions IR1 and the memory stack structures 55 including respective second implanted channel regions IR2 are located in proximity to one another and bit lines can be subsequently formed such that each bit line is electrically connected to a memory stack structure 55 including a first implanted channel region IR1 and a memory stack structure 55 including a second implanted channel region IR2 in the same memory block. In one embodiment, each memory stack structure 55 can include only one of a first implanted channel region IR1 formed at a first select drain gate electrode level and a second implanted channel region IR2 formed at a second select drain gate electrode level.

The vertical semiconductor channels 60 in which respective first implanted channel regions IR1 are formed are herein referred to as first vertical semiconductor channels 60A. The vertical semiconductor channels 60 in which respective second implanted channel regions IR2 are formed are herein referred to as second vertical semiconductor channels 60B.

In one embodiment, the electrical dopants can be selected to change (e.g., raise or lower) the threshold voltage for the vertical field effect transistors including the first implanted channel regions IR1 or the second implanted channel regions IR2 to increase or decrease threshold voltages compared to unimplanted regions. Each memory opening includes a series connection of vertical field effect transistors that form a NAND string, and vertical field effect transistor having the changed (e.g., raised or lowered) threshold voltage can be located in the first level of the select drain gate electrodes if the vertical semiconductor channel 60 therein includes a first implanted channel region IR1, or in the second level of the select drain gate electrodes if the vertical semiconductor channel 60 therein includes a second implanted channel region IR2. In other words, the level at which a first implanted channel region IR1 or a second implanted channel region IR2 is formed is the level at which the corresponding vertical field effect transistor has a raised threshold voltage. In one non-limiting embodiment, region IR1 may be formed by using a shallower ion implantation than the ion implantation used to form region IR2.

In one embodiment, a first portion of each first vertical semiconductor channel 60A laterally surrounded by a first sacrificial material layer 42 (located at the level of the first select drain gate electrode to be subsequently formed) has a greater dopant concentration than a second portion of the first vertical semiconductor channel 60A laterally surrounded by a second sacrificial material layer 42 (located at the level of the second select drain gate electrode to be subsequently formed). Further, a first portion of each second vertical semiconductor channel 60B laterally surrounded by the first sacrificial material layer has a lesser dopant concentration than a second portion of the second vertical semiconductor channel 60B laterally surrounded by the second sacrificial material layer.

The unimplanted portions of the first and second vertical semiconductor channels (60A, 60B) can have the same dopant concentration throughout. In this case, the second portion of each first vertical semiconductor channel 60A and the first portion of each second vertical semiconductor channel 60B can have the same dopant concentration as the portions of the first and second vertical semiconductor channels (60A, 60B) that constitute channels of the memory cells (i.e., memory cell charge storage transistors including control gate electrodes) of the vertical NAND strings. In an alternative embodiment, a selective (e.g., masked) ion implantation may be performed into parts of the substrate semiconductor layer 10 and/or into some of the pillar structures 11 to change the threshold voltage of the source select transistors located at the bottom of the stack. For example, a first selective ion implantation may be made into the substrate semiconductor layer 10 adjacent to a first channel 60A but not into part of layer 10 adjacent to the second channel 60B. A second selective ion implantation may be made into the pillar structure 11 that is part of the second channel 60B but not into the pillar structure that is part of the first channel 60A. The ion implantation into the substrate semiconductor layer 10 may be performed prior to forming the stack (32, 42), while the ion implantation into the pillar structures 11 may be performed at any time between forming the pillar structures 11 and forming the core dielectric 62.

Figure 4:
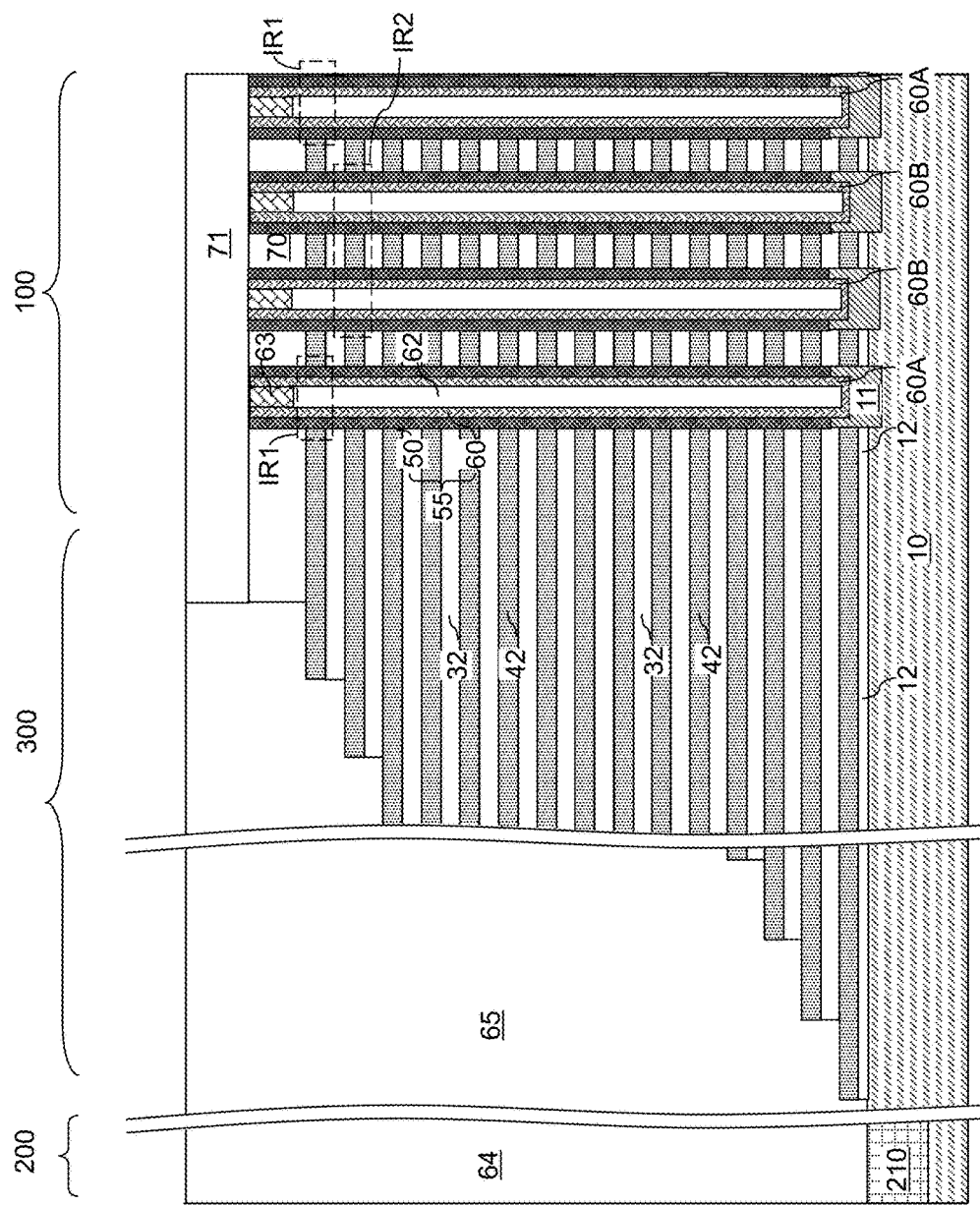
FIG. 4 is a vertical cross-sectional view of the first exemplary structure after formation of a stepped terrace and a retro-stepped dielectric material portion according to an embodiment of the present disclosure.

Referring to FIG. 4, an optional first contact level dielectric material layer 71 can be formed over the substrate 10. As an optional structure, the first contact level dielectric material layer 71 may, or may not, be formed. In case the first contact level dielectric material layer 71 is formed, the first contact level dielectric material layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric material layer 71 can be formed over a horizontal plane including the top surface of the insulating cap layer 70 and the top surfaces of the drain regions 63. The first contact level dielectric material layer 71 can be deposited by chemical vapor deposition, atomic layer deposition (ALD), spin-coating, or a combination thereof. The thickness of the first contact level dielectric material layer 71 can be in a range from 10 nm to 300 nm, although lesser and greater thicknesses can also be employed.

In one embodiment, the first contact level dielectric material layer 71 can be formed as a dielectric material layer having a uniform thickness throughout. The first contact level dielectric material layer 71 may be formed as a single dielectric material layer, or can be formed as a stack of a plurality of dielectric material layers. Alternatively, formation of the first contact level dielectric material layer 71 may be merged with formation of at least one line level dielectric material layer (not shown). While the present disclosure is described employing an embodiment in which the first contact level dielectric material layer 71 is a structure separate from an optional second contact level dielectric material layer or at least one line level dielectric material layer to be subsequently deposited, embodiments in which the first contact level dielectric material layer 71 and at least one line level dielectric material layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a memory array region 100 that includes an array of memory stack structures 55. Subsequently, the trench can be filled with an optional dielectric material such as silicon oxide. Excess portions of the dielectric material can be removed from above the top surface of the first contact level dielectric material layer 71 by a planarization process such as chemical mechanical planarization and/or a recess etch. The top surfaces of the first contact level dielectric material layer 71 can be employed as a stopping surface during the planarization. The remaining optional dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity may be formed just in the stack (32, 42). The stepped cavity can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric material layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. In an alternative configuration, the dielectric material portion 64 may be omitted and the retro-stepped dielectric material portion 65 fills the space in regions 200 and 300. In an alternative embodiment, the steps and the retro-stepped dielectric material portion 65 may be formed prior to forming the memory openings 49 and the memory stack structures 55.

Figure 5A:
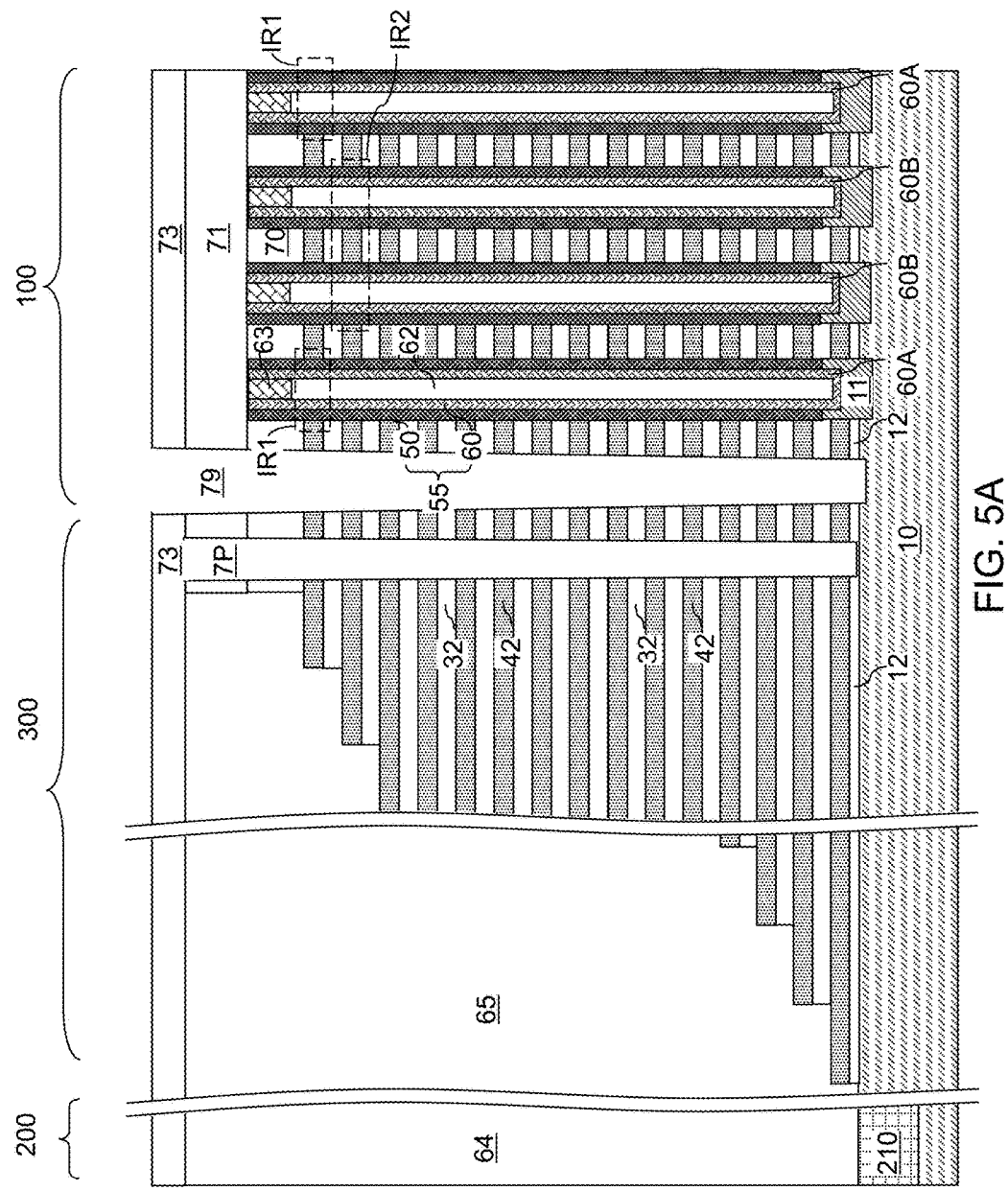
FIG. 5A is a vertical cross-sectional view of the first exemplary structure after formation of a backside trench according to an embodiment of the present disclosure.
Figure 5B:
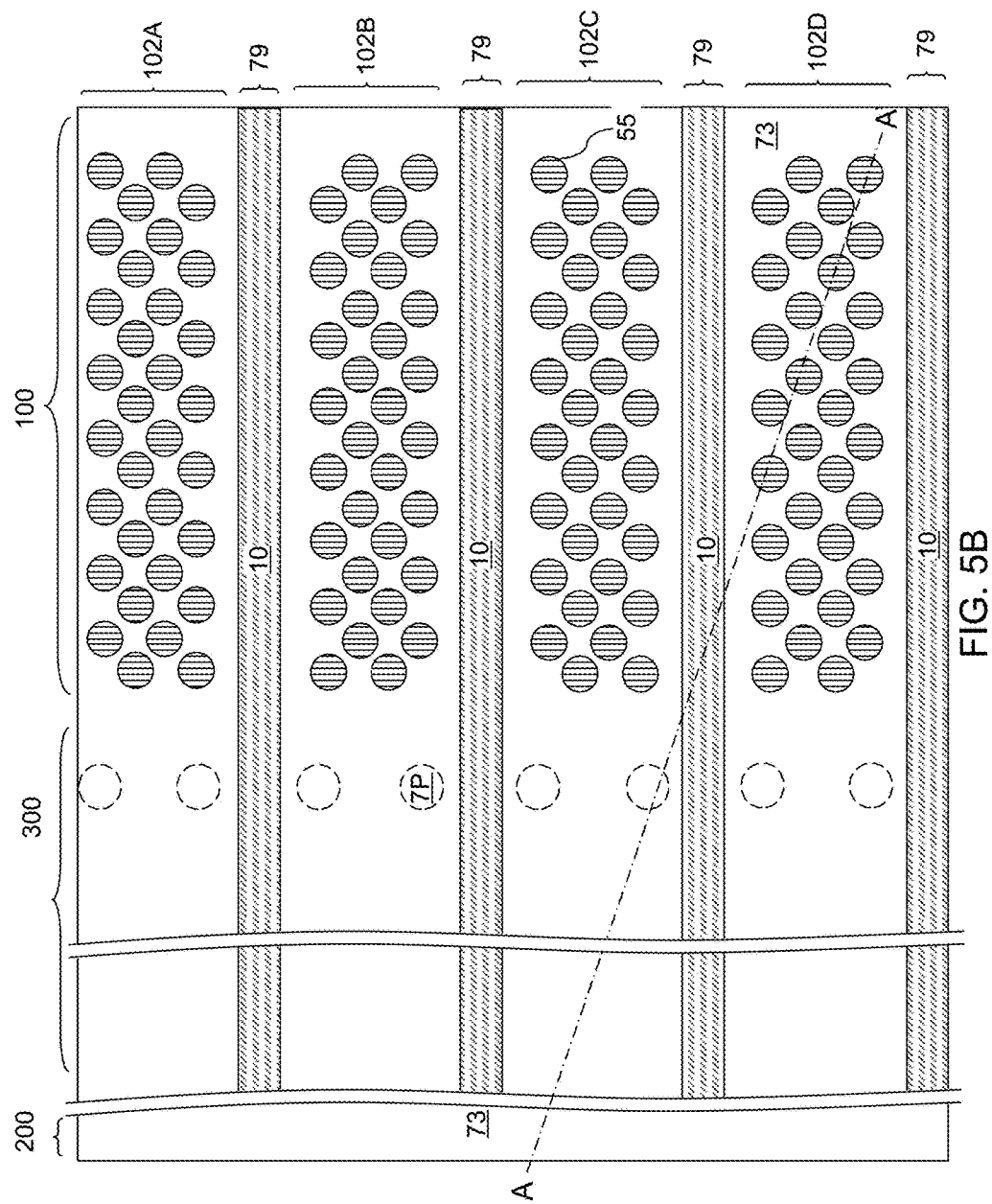
FIG. 5B is a partial see-through top-down view of the first exemplary structure of FIG. 5A. The vertical plane A-A' is the plane of the vertical cross-sectional view of FIG. 5A.
Figure 5C:
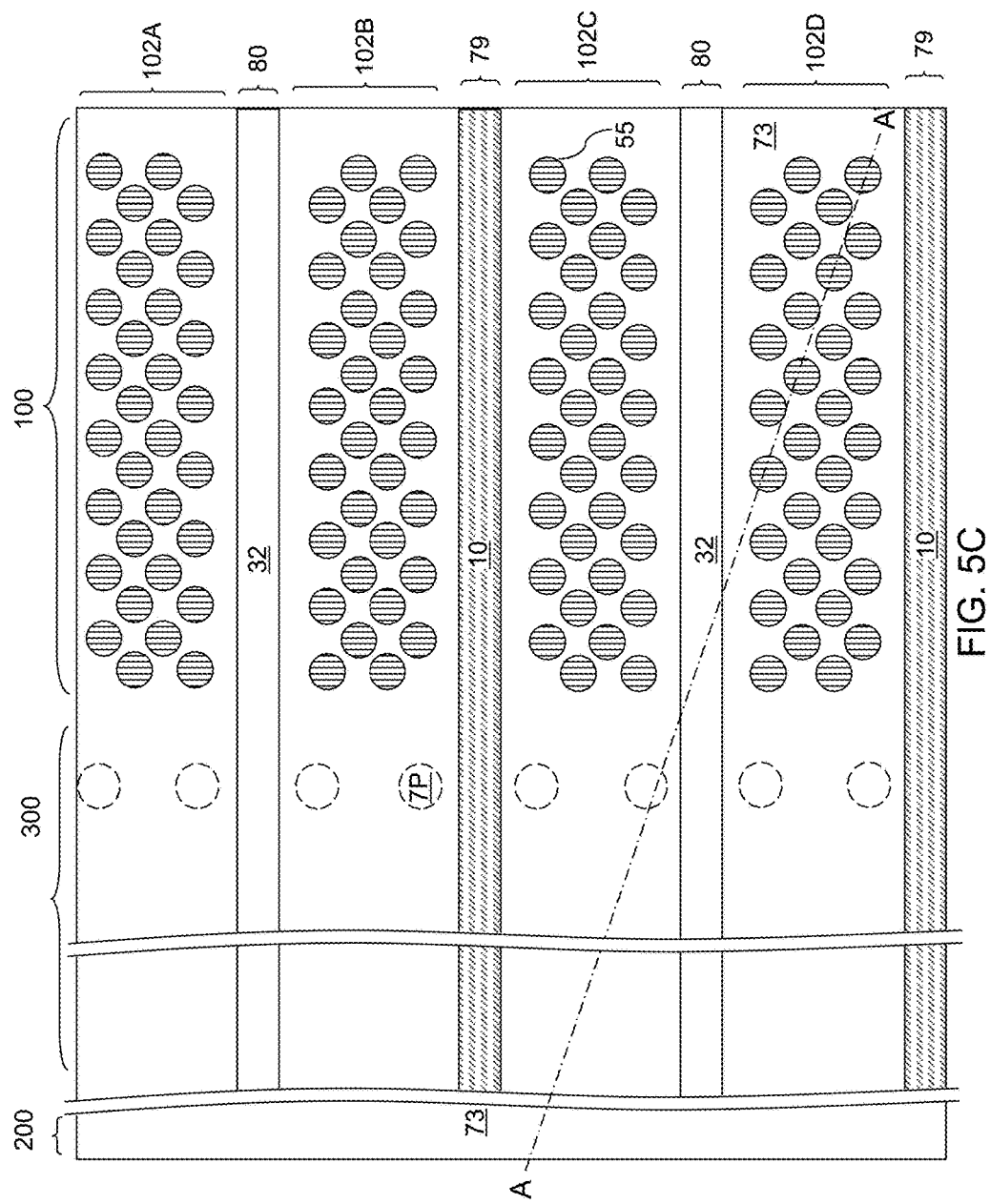
FIG. 5C is a partial see-through top-down view of an alternative structure based on FIG. 5A. The vertical plane A-A' is the plane of the vertical cross-sectional view of FIG. 5A.

Referring to FIGS. 5A-5C, at least one dielectric support pillar 7P may be optionally formed through the retro-stepped dielectric material portion 65 and/or through the first contact level dielectric material layer 71 and/or through the alternating stack (32, 42). The plane A-A' in FIGS. 5B and 5C corresponds to the plane of the vertical cross-sectional view of FIG. 5A. In one embodiment, the at least one dielectric support pillar 7P can be formed in the contact region 300, which is located adjacent to the memory array region 100. The at least one dielectric support pillar 7P can be formed, for example, by forming an opening extending through the retro-stepped dielectric material portion 65 and/or through the alternating stack (32, 42) and at least to the top surface of the substrate 10, and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric material layer 71 concurrently with deposition of the at least one dielectric support pillar 7P can be present over the first contact level dielectric material layer 71 as a second contact level dielectric material layer 73. Each of the at least one dielectric support pillar 7P and the second contact level dielectric material layer 73 is an optional structure. As such, the second contact level dielectric material layer 73 may, or may not, be present over the insulating cap layer 70 and the retro-stepped dielectric material portion 65. The first contact level dielectric material layer 71 and the second contact level dielectric material layer 73 are herein collectively referred to as at least one contact level dielectric material layer (71, 73). In one embodiment, the at least one contact level dielectric material layer (71, 73) can include both the first and second contact level dielectric material layers (71, 73), and optionally include any additional via level dielectric material layer that can be subsequently formed. In another embodiment, the at least one contact level dielectric material layer (71, 73) can include only the first contact level dielectric material layer 71 or the second contact level dielectric material layer 73, and optionally include any additional via level dielectric material layer that can be subsequently formed. Alternatively, formation of the first and second contact level dielectric material layers (71, 73) may be omitted, and at least one via level dielectric material layer may be subsequently formed, i.e., after formation of a substrate contact via structure.

The second contact level dielectric material layer 73 and the at least one dielectric support pillar 7P can be formed as a single continuous structure of integral construction, i.e., without any material interface therebetween. In another embodiment, the portion of the dielectric material that is deposited over the first contact level dielectric material layer 71 concurrently with deposition of the at least one dielectric support pillar 7P can be removed, for example, by chemical mechanical planarization or a recess etch. In this case, the second contact level dielectric material layer 73 is not present, and the top surface of the first contact level dielectric material layer 71 can be physically exposed.

A photoresist layer (not shown) can be applied over the alternating stack (32, 42) and/or the retro-stepped dielectric material portion 65, and lithographically patterned to form at least one trench, as shown in FIG. 5B. Each of the at least one trench is referred to as a backside trench 79, i.e., a trench that is located in a different region than the memory stack structures 55 that are formed in the memory openings (which are referred to as front side openings). Each backside trench 79 can be formed in an area in which formation of a substrate contact via structure is desired. The trench 79 may extend through region 100 or through both regions 100 and 300. The pattern in the photoresist layer can be transferred through the alternating stack (32, 42) and/or the retro-stepped dielectric material portion 65 employing an anisotropic etch to form the at least one backside trench 79, which extends at least to the top surface of the substrate 10. In one embodiment, the at least one backside trench 79 can include a source contact opening in which a source contact via structure can be subsequently formed. The backside trench 79 divides the stack into separate memory blocks 102A, 102B, 102C, 102D in which the memory stack structures 55 of the NAND strings will share the same word lines/control gate electrodes, source select gate electrodes and drain select gate electrodes.

FIG. 5C illustrates an alternative structure which contains two different types of trenches 79, 80. The structure of FIG. 5C includes the same deep backside trenches 79 which extend through the entire stack (32, 42) as in the structure of FIG. 5B. However, some of the trenches 80 in the structure of FIG. 5C comprise shallower trenches than the backside trenches 79. The shallow trenches 80 extend only through sacrificial material layers 42 which will be replaced by drain select gate electrodes in a subsequent step. The shallow trenches 80 may extend down to an intermediate insulating layer 32 in the stack which will separate the control gate electrodes from the drain select gate electrode(s). The shallow trenches 80 separate the stack into separate memory blocks. For example, memory blocks 102A and 102B will share the same control gate electrodes and source select gate electrodes, but will have different drain select gate electrodes which are separated by the shallow trench 80. The separate drain select gate electrodes in memory blocks 102A and 102B allow the memory cells in block 102A to be electrically accessed for programming, reading and/or erasing separately from those in block 102B and vice versa. If desired, dummy memory stack structures may be formed in the regions of the shallow trenches 80 to function as support pillars during replacement of the sacrificial layers 42 with electrically conductive layers. The dummy memory stack structures have the same configuration as the functional memory stack structures 55, but will not be electrically connected to the bit lines.

Figure 6:
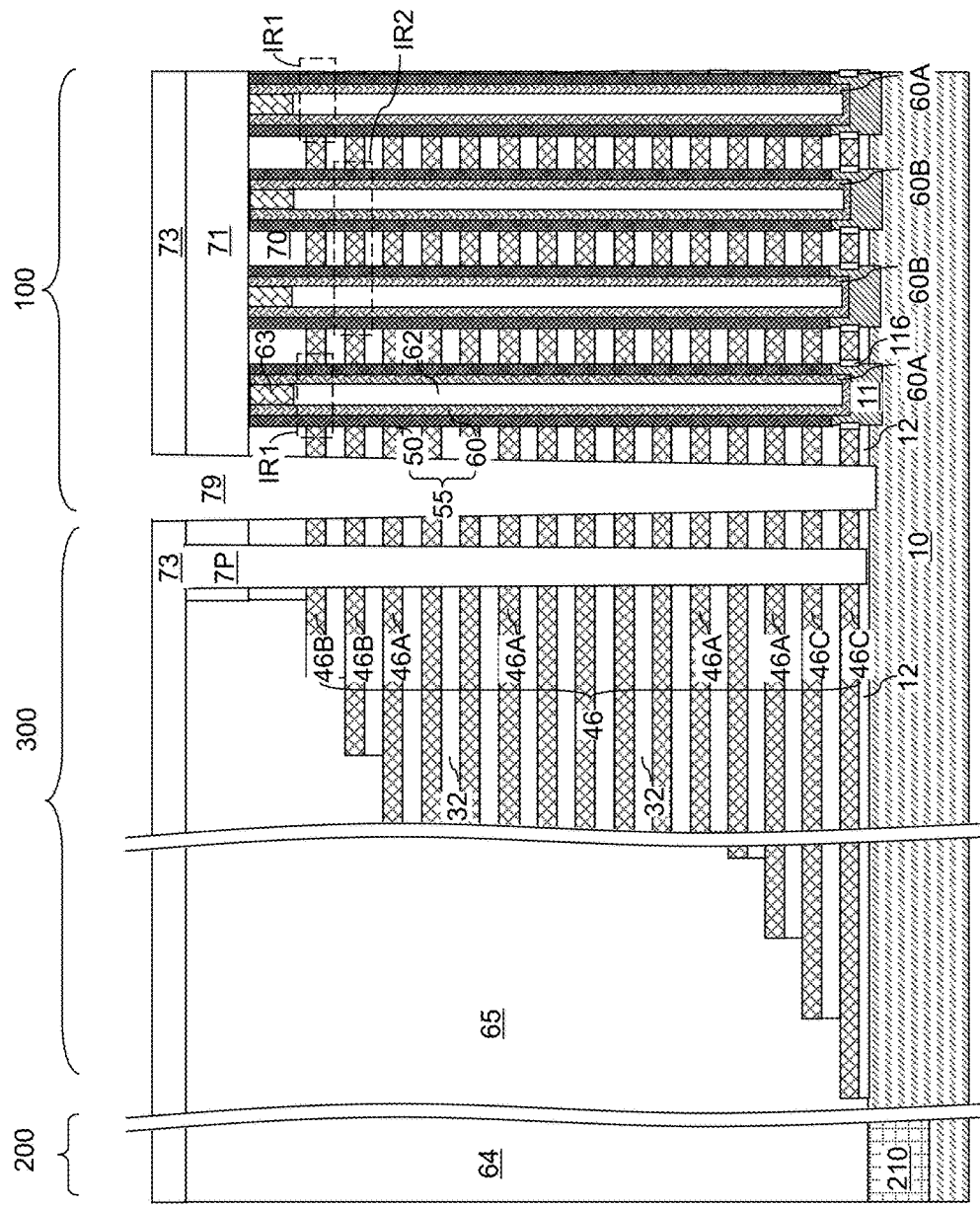
FIG. 6 is a vertical cross-sectional view of the first exemplary structure after replacement of the sacrificial material layers with electrically conductive layers according to an embodiment of the present disclosure.

Referring to FIG. 6, an etchant that selectively etches the second material of the sacrificial material layers 42 with respect to the first material of the insulating layers 32 can be introduced through the at least one backside trench 79, for example, employing an etch process. Backside recesses are formed in volumes from which the sacrificial material layers 42 are removed.

The removal of the second material of the sacrificial material layers 42 can be selective to the first material of the insulating layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the substrate semiconductor layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses are present within volumes previously occupied by the sacrificial material layers 42.

Each backside recess can be a laterally extending cavity having a lateral dimension that is greater than the vertical extent of the cavity. In other words, the lateral dimension of each backside recess can be greater than the height of the backside recess. A plurality of backside recesses can be formed in the volumes from which the second material of the sacrificial material layers 42 is removed. The memory openings in which the memory stack structures 55 are formed are herein referred to as front side recesses or front side cavities in contrast with the backside recesses. In one embodiment, the memory array region 100 comprises an array of monolithic three-dimensional NAND strings having a plurality of device levels disposed above the substrate 10. In this case, each backside recess can define a space for receiving a respective word line of the array of monolithic three-dimensional NAND strings.

Each of the plurality of backside recesses can extend substantially parallel to the top surface of the substrate 10. A backside recess can be vertically bounded by a top surface of an underlying insulating layer 32 and a bottom surface of an overlying insulating layer 32. In one embodiment, each backside recess can have a uniform height throughout. Optionally, a backside blocking dielectric layer can be formed in the backside recesses.

Physically exposed surface portions of the optional epitaxial channel portions 11 and the substrate semiconductor layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the substrate semiconductor layer 10 into a sacrificial dielectric portion (not shown). In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion includes a dielectric material that includes the same semiconductor element as the substrate semiconductor layer 10 and additionally includes at least one non-metallic element such as oxygen and/or nitrogen such that the material of the sacrificial dielectric portions is a dielectric material. In one embodiment, the sacrificial dielectric portions can include a dielectric oxide, a dielectric nitride, or a dielectric oxynitride of the semiconductor material of the substrate semiconductor layer 10.

A backside blocking dielectric layer (not shown) can be optionally formed. The backside blocking dielectric layer, if present, comprises a dielectric material that functions as a control gate dielectric for the control gates to be subsequently formed in the backside recesses. In case a blocking dielectric layer is present within each memory opening, the backside blocking dielectric layer is optional. In case a blocking dielectric layer is omitted, the backside blocking dielectric layer is present.

At least one metallic material can be deposited in the plurality of backside recesses, on the sidewalls of the at least one the backside trench 79, and over the top surface of the second contact level dielectric material layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses, and a continuous metallic material layer (not shown) can be formed on the sidewalls of each backside trench 79 and over the at least one contact level dielectric material layer (71,73). The electrically conductive layers 46 can include word line contact via structures 84 (which are a first subset of the electrically conductive layers 46), drain select gate contact via structures 86 (which are a second subset of the electrically conductive layers 46), and source select gate contact via structures 82 (which are a third subset of the electrically conductive layers 46). Thus, each sacrificial material layer 42 can be replaced with an electrically conductive layer 46. A backside cavity is present in the portion of each backside trench 79 that is not filled with the backside blocking dielectric layer 66 and the continuous metallic material layer.

The deposited metallic material of the continuous metallic material layer is etched back from the sidewalls of each backside trench 79 and from above the second contact level dielectric material layer 73, for example, by isotropic wet etch or dry etch, or a combination of isotropic wet etch and dry etch. Each remaining portion of the deposited metallic material in the backside recesses constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions can be removed from above the substrate semiconductor layer 10 during the last processing step of the anisotropic etch.

In one embodiment, the spacer material layers in the initial alternating stack can include sacrificial material layers 42, and the sacrificial material layers 42 can be replaced with electrically conductive layers 46. In this case, the in-process alternating stack of the insulating layers 32 and sacrificial material layers 42 is modified during the processing steps of FIGS. 8-10 to form an alternating stack of the insulating layer 32 and the electrically conductive layers 46. In one embodiment, the remaining portions of the charge trapping layer comprises charge storage regions for a NAND string.

Alternatively, the spacer material layers can be formed as electrically conductive layers 46. In this case, the epitaxial channel portions 11 can be omitted, or can be formed to a lesser height, to avoid electrical shorts with the electrically conductive layers 46.

Figure 7:
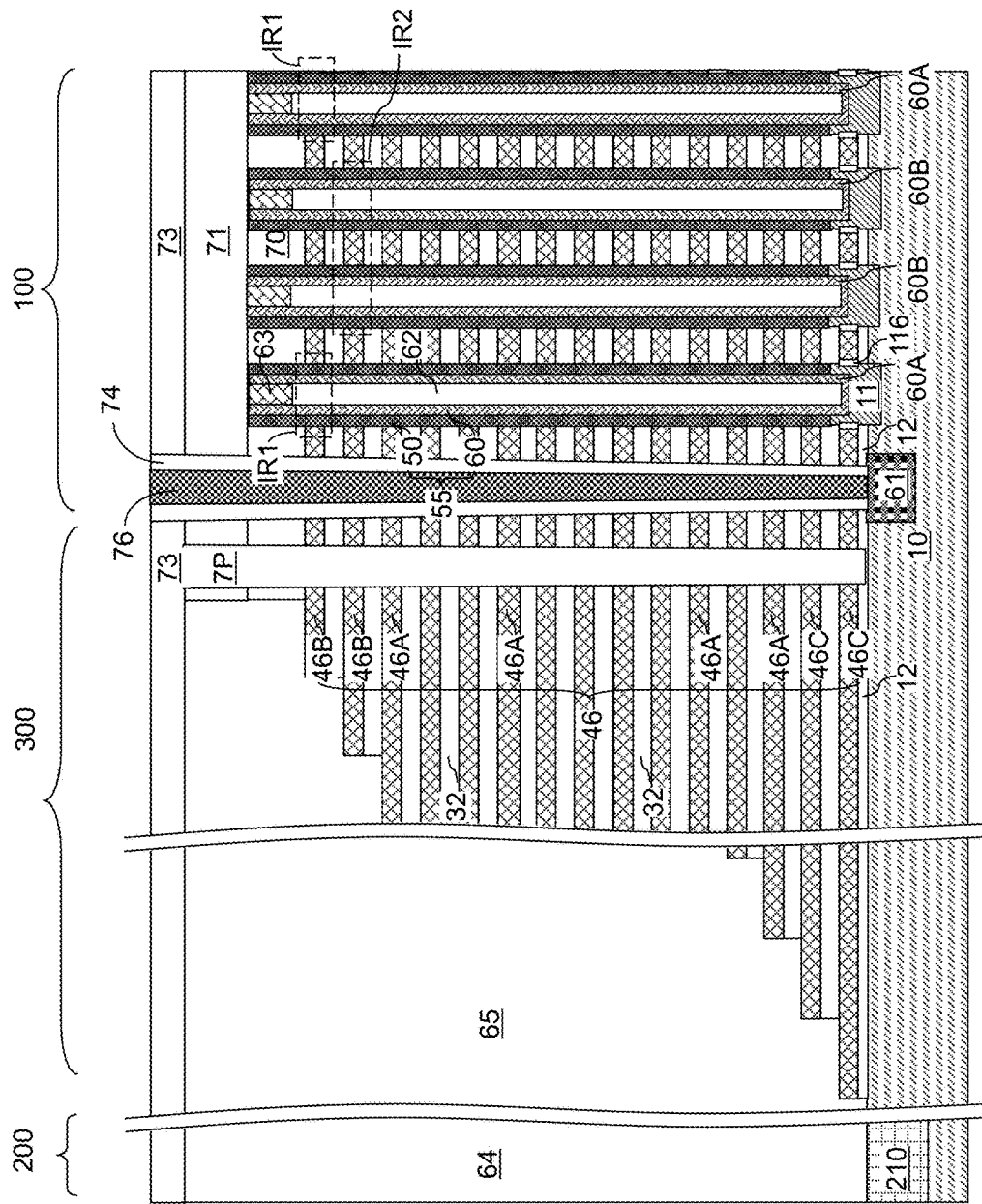
FIG. 7 is a vertical cross-sectional view of the first exemplary structure after formation of source regions, insulating spacers, and backside contact via structures according to an embodiment of the present disclosure.

Referring to FIG. 7, a source region 61 can be formed in a surface portion of the substrate (e.g., in the substrate semiconductor layer 10) underneath each backside trench 79. Each source region 61 can be formed by implanting electrical dopants through each backside trench 79 into a semiconductor portion located on, or within, the substrate 10. For example, a source region 61 may be formed by implantation of dopant atoms into a portion of the substrate semiconductor layer 10 through each backside trench 79. Alternatively, a source region 61 can be formed on the substrate 10 as a doped semiconductor portion by deposition of a semiconductor material, for example, by selective epitaxy, and by implantation of electrical dopants into the deposited semiconductor portion.

An insulating material layer 74 can be deposited by a conformal deposition process such as a chemical vapor deposition process. The insulating material layer includes a dielectric material such as silicon oxide, silicon nitride, silicon oxynitride, or a combination thereof. In one embodiment, the insulating material can include undoped silicate glass (USG). The thickness of the insulating material layer can be in a range from 3 nm to 30 nm, although lesser and greater thicknesses can also be employed.

An anisotropic etch can be performed to remove horizontal portions of the insulating material layer from above the at least one contact level dielectric material layer (71, 73) and from a bottom portion of each backside trench 79. The anisotropic etch can be a reactive ion etch that etches the dielectric material of the insulating material layer selective to the aluminum oxide material of the continuous conformal aluminum oxide layer. In one embodiment, the reactive ion etch can employ at least one fluorocarbon etchant such as $CF_4$ and/or $CHF_3$, and optionally oxygen. Such fluorocarbon-based reactive ion etch chemistries are generally selective to aluminum oxide. Each remaining portion of the insulating material layer constitutes an insulating spacer 74.

In case a portion of the backside trench 79 has a substantially rectangular horizontal cross-sectional area, the insulating spacer 74 can have a pair of parallel vertical portions laterally spaced from each other by a uniform distance. Further, each parallel vertical portion of the insulating spacer 74 can have a uniform lateral thickness at a bottom portion and a middle portion. The anisotropic etch can cause formation of tapers at the top portion of each insulating spacer 74. In this case, each insulating spacer 74 can have a tapered profile at a top portion. In other words, the lateral thickness of each insulating spacer 74 can decrease with a vertical distance from the top surface of the substrate 10.

At least one conductive material can be deposited to fill each backside cavity laterally surrounded by a respective insulating spacer 74. The at least one conductive material can include, for example, a combination of a conductive metallic nitride (such as TiN, TaN, or WN) that can be employed to form a conductive diffusion barrier layer, and a conductive fill material (such as W, Cu, Al, Ru, Co, and/or a heavily doped conductive semiconductor material). The at least one conductive material can be deposited by physical vapor deposition (PVD), chemical vapor deposition (CVD), electroplating, electroless plating, or a combination thereof. Excess portions of the at least one conductive material can be removed from above the top surface of the at least one contact level dielectric material layer (71, 73) by a planarization process, which may employ a recess etch or chemical mechanical planarization (CMP). A contact via structure is formed within each backside trench 79, which is herein referred to as a substrate contact via structure 76. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Figure 8C:
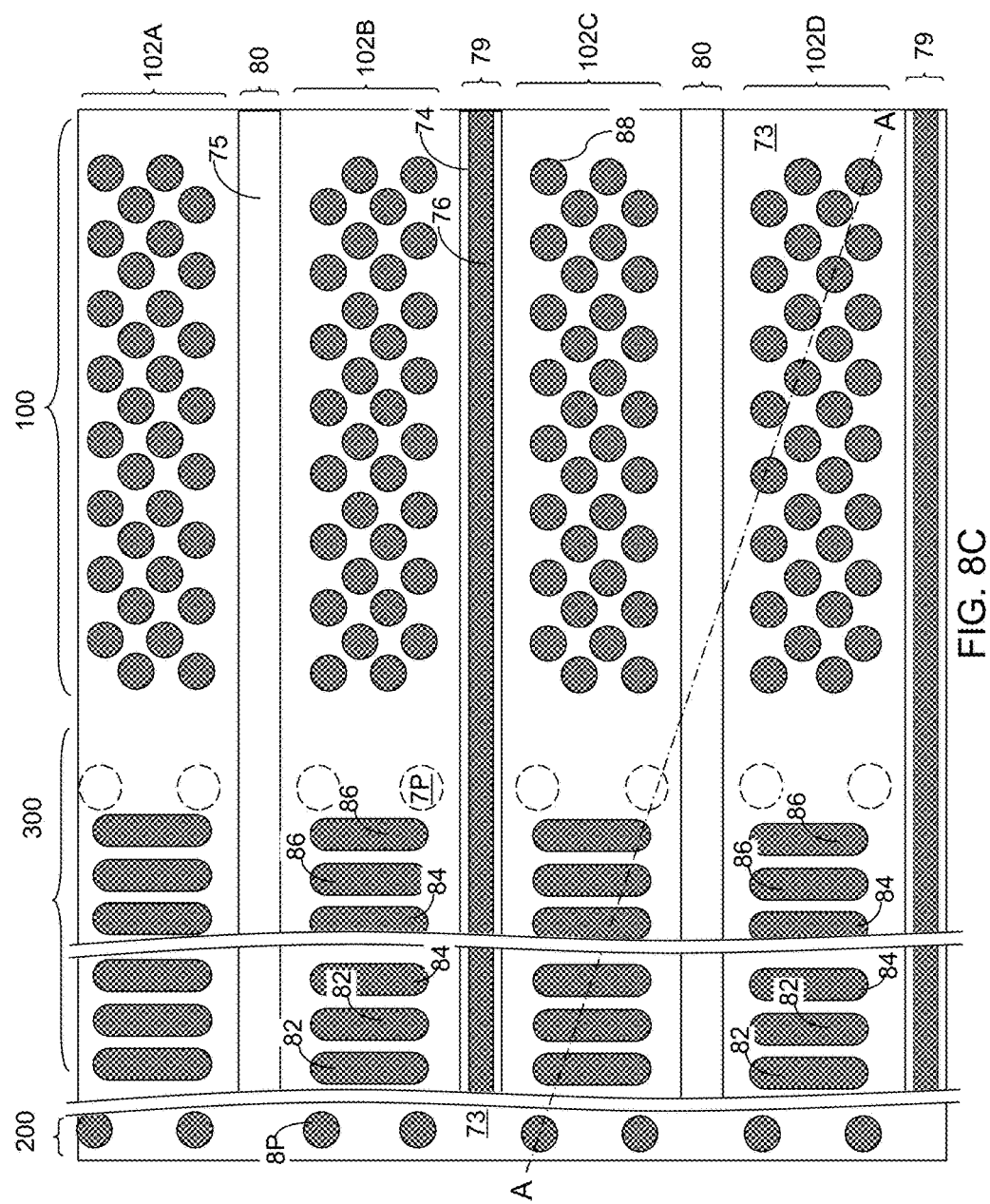
FIG. 8C is a top-down view of an alternative structure of FIG. 8A derived from the alternative structure of FIG. 5C.

Referring to FIGS. 8A-8C, additional contact via structures (8P, 82, 84, 86, 88) can be formed through the at least one contact level dielectric material layer (71, 73), the dielectric material portion 64, and/or the retro-stepped dielectric material portion 65 to various nodes of the devices in the first exemplary structure. The additional contact via structures (8P, 82, 84, 86, 88) can include drain contact via structures 88 that contact the drain regions 63, word line contact via structures 84 (which are a first subset of the electrically conductive layers 46) that contact word lines 46A of the memory cell array, drain select gate contact via structures 86 (which are a second subset of the electrically conductive layers 46) that contact drain select gate electrodes 46B for the memory cell array, source select gate contact via structures 82 (which are a third subset of the electrically conductive layers 46) that contact source select gate electrodes 46C for the memory cell array, and peripheral device contact via structures 8P that contact various nodes of the at least one peripheral device 210.

The structure of FIG. 8B is derived from the structure of FIG. 5B in which all trenches are the deep backside trenches 79 which are filled with the spacers 74 and the substrate contact via structures (i.e., source electrodes or local interconnects) 76. Memory blocks 102A to 102D are separated by the backside trenches 79. The structure of FIG. 8C is derived from the structure of FIG. 5C in which some of the trenches are the deep backside trenches 79 which are filled with spacers 74 and substrate contact via structures 76, and other trenches comprise shallow trenches 80. In this structure, the shallow trenches 80 may be filled with any suitable insulating material 75, such as silicon oxide, which electrically isolates the drain select gate electrodes 46B of adjacent memory blocks. For example, memory blocks 102B and 102C are separated by the backside trench 79, while the drain select gate electrodes 46B in memory blocks 102A and 102B are separated by the shallow trench 80 filled with the insulating material 75. Thus, memory blocks 102A and 102B comprise separate memory blocks because they do not share the same drain select gate electrodes 46B. It should be noted that the NAND strings in each block may comprise multi-charge state cells where two or more control gate electrodes/word lines 46A may be located adjacent to different parts of the same memory stack structure 55 or of the same NAND string at the same device level in the same memory block, as described in U.S. patent application Ser. No. 14/748,575, filed on Jun. 24, 2015 and U.S. patent application Ser. No. 14/721,198, filed on May 26, 2015, both of which are incorporated herein by reference in their entirety.

Figure 9:
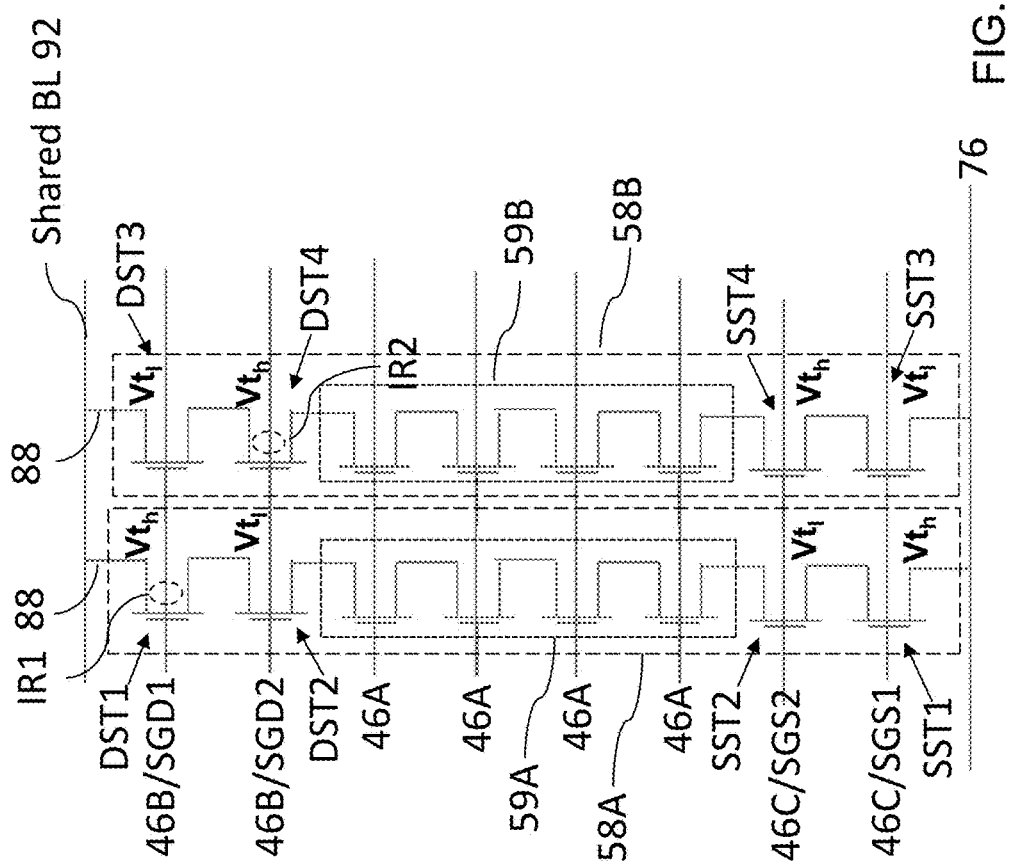
FIG. 9 is a schematic of a circuit including a pair of vertical NAND strings and additional devices attached thereto according to an embodiment of the present disclosure.

FIG. 9 shows a circuit including a pair of vertical NAND strings (58A, 58B) containing memory cell charge storage transistors (59A, 59B) and additional select transistor devices (DST1, DST2, SST1, SST2, DST3, DST4, SST3, SST4). Referring collectively to FIGS. 8A, 8B, 8C, and 9, the pair of vertical NAND strings (58A, 58B) can be embodied as any pair of memory stack structures 55 and elements that are electrically coupled to the pair of memory stack structures 55 (e.g., gate electrodes 46A, 46B and 46C). The pair of vertical NAND strings share a common bit line 92, which is electrically connected (i.e., shorted) by the respective drain contact via structures 88 to the two drain regions 63 in contact with the vertical semiconductor channels (60A, 60B) of the pair of vertical NAND strings (58A, 58B).

Each vertical NAND string includes a series connection of vertical field effect transistors. Each vertical memory cell charge storage transistor employs a respective portion of a vertical semiconductor channel 60 as a channel, and a respective word line 46A (located at the same level as the respective channel) as a control gate electrode. The additional devices include a series connection of at least two drain select gate transistors and a series connection of at least two source select gate transistors. For example, a series connection of the at least two drain select gate transistors can include a first drain select transistor DST1 and a second drain select transistor DST2 for the first vertical NAND string 58A, or a third drain select transistor DST3 and a fourth drain select transistor DST4 for the second vertical NAND string 58B. A series connection of the at least two source select gate transistors can include a first source select transistor DST1 and a second source select transistor DST2 for the first vertical NAND string 58A, or a third source select transistor DST3 and a fourth source select transistor DST4 for the second vertical NAND string 58B.

The first drain select transistor DST1 and the fourth drain select transistor DST4 can be formed as high threshold voltage devices having respective high threshold voltages. As used herein, a high threshold voltage device refers to a field effect transistor device that requires a higher gate voltage for full turn on of the field effect transistor relative to a reference turn-on voltage. The notation "Vth" next to a transistor denotes that the transistor is a high threshold voltage device. The second drain select transistor DST2 and the third drain select transistor DST3 can be formed as low threshold voltage devices having respective low threshold voltages. As used herein, a low threshold voltage device refers to a field effect transistor device that requires a lower gate voltage for full turn on of the field effect transistor relative to the reference turn-on voltage. The notation "Vtl" next to a transistor denotes that the transistor is a low threshold voltage device, such as that Vtl<Vth. Each NAND string has at least one low threshold voltage select transistor and at least one high threshold voltage select transistor on the same side of the memory cell transistors (59A, 59B). In other words, each NAND string has at least two drain select transistors with a different threshold voltage from each other and/or at least two source select transistors with a different threshold voltage from each other.

The first source select transistor SST1 and the fourth source select transistor SST4 can be formed as high threshold voltage devices having respective high threshold voltages. The second source select transistor SST2 and the third source select transistor SST3 can be formed as low threshold voltage devices having respective low threshold voltages.

According to an embodiment of the present disclosure, an alternating stack of insulating layers 32 and spacer material layers can be formed over a substrate. The spacer material layers 32 can be formed as, or can be subsequently replaced with, the electrically conductive layers 46. A first vertical NAND string 58A can be formed with first memory cell charge storage transistors 59A in a series connection with a first drain select transistor DST1 and a second drain select transistor DST2 through the alternating stack. A second vertical NAND string 58B can be formed with second memory cell charge storage transistors 59B in a series connection with a third drain select transistor DST3 and a fourth drain select transistor DST4 through the alternating stack. The first and third drain select transistors (DST1, DST3) are formed at the level of a first electrically conductive layer, which may be the level of the first implanted channel regions IR1. The second and fourth drain select transistors (DST2, DST4) can be formed at the level of a second electrically conductive layer, which may be the level of the second implanted channel regions IR2. The first drain select transistor DST1 and the fourth drain select transistor DST4 can have higher threshold voltages than the threshold voltages of the second and third drain select transistors (DST2, DST3).

In one embodiment, a first electrically conductive layer among the electrically conductive layers 46 can be located at the level of the first implanted channel regions IR1, and can comprise a first common gate electrode SGD1 (which can be a first drain select gate electrode 46B) for the first drain select transistor DST1 and the third drain select transistor DST3. A second electrically conductive layer among the electrically conductive layers 46 can be located at the level of the second implanted channel regions IR2, and can comprise a second common gate electrode SGD2 (which can be a second drain select gate electrode 46B) for the second drain select transistor DST2 and the fourth drain select transistor DST4.

The first vertical NAND string 58A can include a first vertical semiconductor channel 60A as shown in FIG. 8A that extends through the alternating stack of insulating layers 32 and electrically conductive layers 46. The first vertical semiconductor channel 60A includes channels of the first memory cell charge storage transistors 59A and channels of the first and second drain select transistors (DST1, DST2). The second vertical NAND string 58B can include a second vertical semiconductor channel 60B that extends through the alternating stack (32, 46). The second vertical semiconductor channel 60B includes channels of the second memory cell charge storage transistors 59B and channels of the third and fourth drain select transistors (DST3, DST4).

As discussed above, electrical dopants can be implanted into a portion of each first vertical semiconductor channel 60A located at the level of the first electrically conductive layer (e.g., one of the drain select gate electrodes 46B), while preventing implantation of electrical dopants into the second vertical semiconductor channels 60B during the first masked implantation process. Additional electrical dopants can be implanted into a portion of each second vertical semiconductor channel 60B located at the level of the second electrically conductive layer (e.g., another of the drain select gate electrodes 46B), while preventing implantation of electrical dopants into the first vertical semiconductor channels 60A.

In one embodiment, a first portion of the first vertical semiconductor channel 60A laterally surrounded by a first common gate electrode SGD1 (i.e., a drain select gate electrode 46B located at the level of the first implanted channel region IR1) has a greater dopant concentration than a second portion of the first vertical semiconductor channel 60A laterally surrounded by the second common gate electrode SGD2 (i.e., another drain select gate electrode 46B located at the level of the second implanted channel region IR2). A first portion of the second vertical semiconductor channel 60B laterally surrounded by the first common gate electrode SGD1 has a lesser dopant concentration than a second portion of the second vertical semiconductor channel 60B laterally surrounded by the second common gate electrode SGD2.

In one embodiment, the second portion of the first vertical semiconductor channel 60A and the first portion of the second vertical semiconductor channel 60B have a same dopant concentration as portions of the first and second vertical semiconductor channel 60A and 60B that constitute channels of the first and second memory cell charge storage transistors 59A and 59B, respectively.

A first drain region 63 can be formed on an upper end of each first vertical semiconductor channel 60A, and a second drain region 63 can be formed on an upper end of each second vertical semiconductor channel 60B. A first vertical semiconductor channel 60A includes channels of the first memory cell charge storage transistors 59A of NAND string 58A and the first and second drain select transistors (DST1, DST2). A second vertical semiconductor channel 60B includes channels of the second memory cell charge storage transistors 59B of NAND string 58B and the third and fourth drain select transistors (DST3, DST4).

A common bit line 92 is formed over the first and second drain regions 63. The bit line is electrically shorted to the first and second drain regions 63.

A source region 61 is formed in, or on, the substrate 10. The source region 61 is connected to vertical semiconductor channels (60A, 60B) of the first vertical NAND string 58A and the second vertical NAND string 58B through a common horizontal semiconductor channel (i.e., the surface portion of the substrate semiconductor layer 10 between the source region 61 and the epitaxial channel portions 11) located in the substrate 10. The vertical semiconductor channels 60 of the first vertical NAND string 58A and the second vertical NAND string 58B can be adjoined to a common horizontal semiconductor channel located in the substrate.

A first source select transistor SST1 and a second source select transistor SST2 can be in a series connection with the first vertical NAND string 58A, and a third source select transistor SST3 and a fourth source select transistor SST4 can be in a series connection with the second vertical NAND string 58B. The first and third source select transistors (SST1, SST3) can be formed at a level of a third electrically conductive layer 46, which can be a first source select gate electrode SGS1 (i.e., one of the source select gate electrodes 46C). The second and fourth source select transistors (SST2, SST4) can be formed at a level of a fourth electrically conductive layer 46, which can be a second source select gate electrode SGS2 (i.e., another of the source select gate electrodes 46C).

The first, second, third, and fourth source select transistors (SST1, SST2, SST3, SST4) can be formed as field effect transistors having the same threshold voltages. During operation of the device of the present disclosure, the first source select transistor SST1 and the fourth source select transistor SST4 can be programmed to have higher threshold voltages than threshold voltages of the second and third source select transistors (SST2, SST3) employing a select gate transistor threshold voltage programming process to be subsequently described. The second and third source select transistors (SST2, SST3) may optionally be programmed to increase the respective threshold voltages provided that the increased threshold voltages are less than the high threshold voltages of the first and fourth source select transistors (SST1, SST4). Upon programming, the first and fourth source select transistors (SST1, SST4) can have higher threshold voltages than the second and third source select transistors (SST2, SST3). In this case, the first and fourth source select transistors (SST1, SST4) can be high threshold voltage devices, and the second and third source select transistors (SST2, SST3) can be low threshold voltage devices.

In one embodiment, a third electrically conductive layer 46 among the electrically conductive layers 46 comprises a third common gate electrode SGS1 (which is one of the source select gate electrodes 46C) for the first source select transistor SST1 and the third source select transistor SST3. A fourth electrically conductive layer 46 among the electrically conductive layers 46 comprises a fourth common gate electrode SGS2 (which is another one of the source select gate electrodes 46C) for the second source select transistor SST2 and the fourth source select transistor SST4.

In one embodiment, the drain select transistors DST1 and DST4 may be programmed in a similar manner as the source select transistors to change their threshold voltage instead of or in addition to ion implanting regions IR1 and IR2 to change the transistor threshold voltage. Furthermore, the source select transistor threshold voltage may be changed by ion implantation into layer 10 and/or structure 11 instead of or in addition to using programming described above. Furthermore, other fabrication methods in addition to ion implantation may be used to change the threshold voltage of the source and/or drain select transistors, such as by varying a thickness of the select gate electrodes and/or by varying a composition of the select gate electrodes, as will be described below with respect to FIGS. 19A and 19B, and FIGS. 20A and 20B, respectively. Thus, the threshold voltage of the select transistors may be changed during fabrication (e.g., by selective ion implantation into the channel, varying gate thickness and/or varying gate composition) and/or by programming after fabrication. For example, the end select transistors (i.e., DST1 and/or SST1) in the first string 58A may be fabricated with a higher threshold voltage than the other respective end select transistors (i.e., DST3 and/or SST3) in the second string 58B, while the intermediate select transistors (i.e., DST4 and/or SST4) in the second string 58B may be programmed with and/or fabricated with a higher threshold voltage then the other respective intermediate select transistors (i.e., DST2 and/or SST2) in the first string 58A.

In one embodiment, the memory device of the embodiments of the present disclosure can include a monolithic three-dimensional NAND memory device. The electrically conductive layers 46 can include a first electrically conductive layer located at a first level and a second electrically conductive layer located at a second level that is different from the first level. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Figure 10:
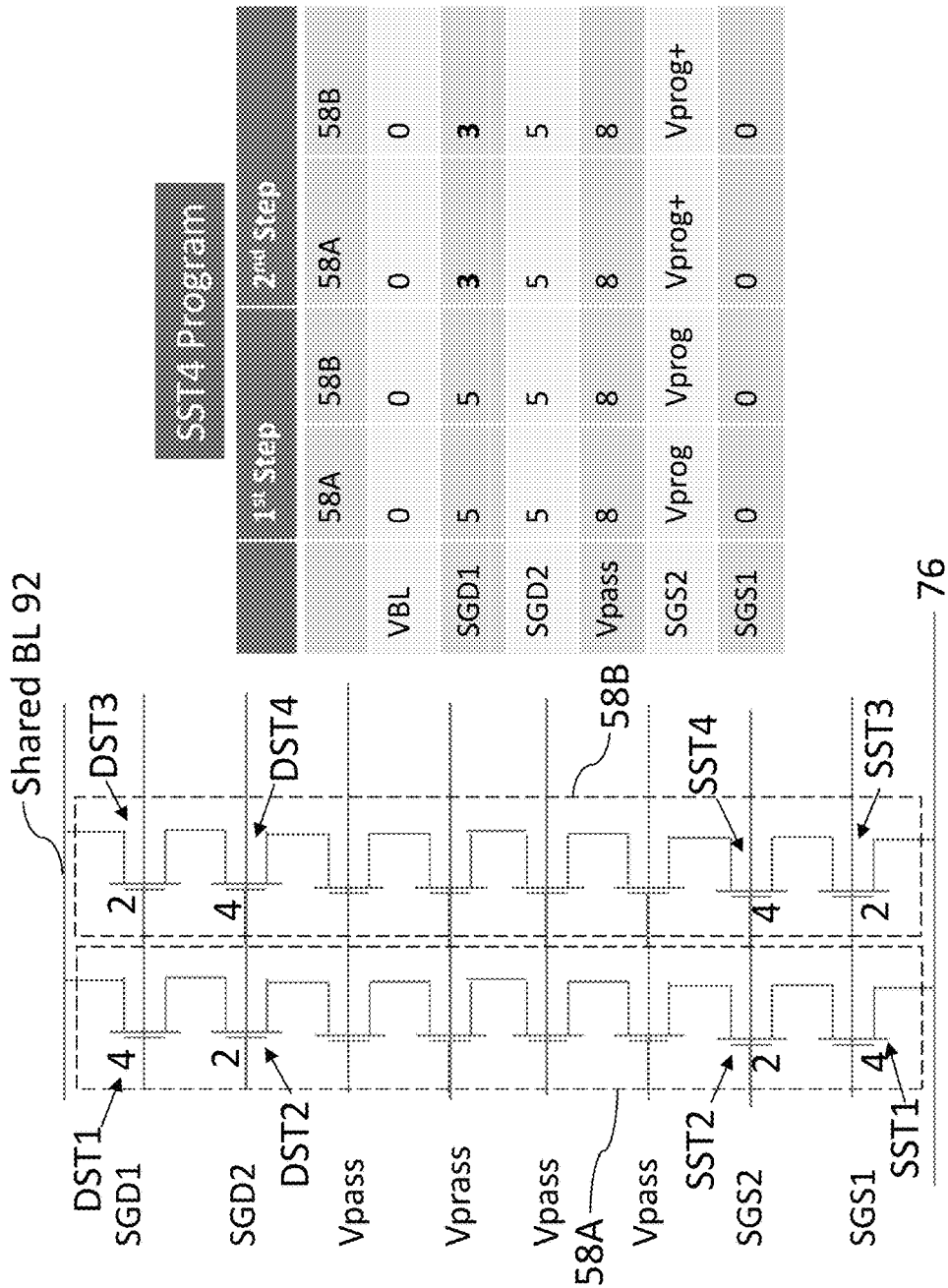
FIG. 10 illustrates operating conditions of the circuit of FIG. 9 during programming of a fourth source select transistor according to an embodiment of the present disclosure.

Referring to FIG. 10, operating conditions of the circuit of FIG. 9 is illustrated during programming of the fourth source select transistor SST4 according to an embodiment of the present disclosure. For illustrative purposes, the first and fourth drain select transistors (DST1, DST4) can be formed with the same high threshold voltage of 4 V, and the second and third drain select transistors (DST2, DST3) can be formed with the same low threshold voltage of 2 V.

The threshold voltage values and applied bias values shown in FIG. 10 and subsequent figures are for illustrative purposes only. It is understood that the applied voltage required to turn on a device needs to be higher than the threshold voltage, and that the actual value of the applied voltage employed to turn on the device can be determined by respective transistor's I-V characteristics. Likewise, the applied voltage required to turn off the device needs to be lower than the threshold voltage of the device, and the actual value of the applied voltage employed to turn off the device can be determined, among others, by the I-V characteristics of the respective transistor.

Application of a bias voltage less than 2V to the first and second select drain gate electrodes (SGD1, SGD2) turns off each of the drain select transistors (DST1, DST2, DST3, DST4). In this case, the first vertical NAND string 58A and the second vertical NAND string 58B are deactivated, i.e., electrically disconnected from the shared bit line.

Application of a bias voltage greater than 4V (such as 5V) to the first and second select drain gate electrodes (SGD1, SGD2) turns on each of the drain select transistors (DST1, DST2, DST3, DST4). In this case, the first vertical NAND string 58A and the second vertical NAND string 58B can be activated, i.e., turned on, electrically connected to the shared bit line.

Application of a bias voltage greater than 4V (such as 5V) to the first select drain gate electrode SGD1 and an intermediate bias voltage (such as 3V) between the high and low bias voltages (e.g., between 2V and 4V) to the second select drain gate electrode SGD2 turns on the first, second and third drain select transistors (DST1, DST2, DST3) and turns off the fourth drain select transistor DST4. In this case, the first vertical NAND string 58A can be activated by application of an electrical bias voltage to the shared bit line, while the second vertical NAND string 58B remains deactivated.

Application of a high bias voltage (e.g., greater than 4V, such as 5V) to the second select drain gate electrode SGD2 and an intermediate bias voltage between 2V and 4V (such as 3V) to the first select drain gate electrode SGD1 turns on the second, third and fourth drain select transistors (DST1, DST3, DST4) and turns off the first drain select transistor DST1. In this case, the second vertical NAND string 58B can be activated by application of an electrical bias voltage to the shared bit line, while the first vertical NAND string 58A remains deactivated.

As discussed above, in one embodiment, the first, second, third, and fourth source select transistors (SST1, SST2, SST3, SST4) can be formed as field effect transistors having the same initial threshold voltage. In this case, channel regions of the first, second, third, and fourth source select transistors (SST1, SST2, SST3, SST4) can have the same dopant concentration. In one embodiment, the initial threshold voltage can be less than the low threshold voltages that the second and third source select transistors (SST2, SST3) will have during read and programming operations. For example, such an initial threshold voltage may be between 0.5 V and 1.9 V). In another embodiment, the initial threshold voltage can be the same as the low threshold voltage that the second and third source select transistors (SST2, SST3) will have during read and programming operations. For example, such an initial threshold voltage may be about 2.0 V.

In one embodiment, the differences in the threshold voltages of the source select transistors (SST1, SST2, SST3, SST4) can be provided by injecting different amount of electrical charge to the charge trapping material portions of the source select transistors (SST1, SST2, SST3, SST4). The different amounts of injected charges can cause the various charge trapping material portions of the source select transistors (SST1, SST2, SST3, SST4) to include different amounts of trapped electrical charge. Specifically, charge trapping material portions (which may be portions of a charge trapping layer such as a silicon nitride layer within the memory films 50) within the first and fourth source select gate transistors (SST1, SST4) can have a different trapped electrical charge density than charge trapping material portions within the second and third source select gate transistors by employing a charge injection scheme.

In an illustrative example shown in FIG. 10, each high threshold voltage source select transistor can be programmed employing a single step threshold voltage programming process or a two-step threshold voltage programming process. The optional first step of the programming process is omitted in the single step threshold voltage programming process, and is performed in the two-step threshold voltage programming process. If the optional first step of the programming process, all of the drain select transistors (DST1, DST2, DST3, DST4) are turned on by applying to the control gate electrode of the memory cell charge storage transistors a high bias voltage (such as 5 V) that is greater than the high threshold voltages of the drain select transistors (DST1, DST2, DST3, DST4), and the first and third source select transistors (SST1, SST3) are turned off by applying a turn-off gate voltage (such as 0 V) to the first source select gate electrode SGS1. A low-threshold-voltage programming voltage Vprog (which is greater than Vth) can be applied to the second source select gate electrode SGS2, which may be, for example, in a range from 12V to 24 V. Electrical charge can be injected to the charge trapping material portions (which may be silicon nitride portions) in the memory films 50 of the second and fourth source select transistors (SST2, SST4) to set the threshold voltages of the second and fourth source select transistors (SST2, SST4) at the low threshold voltage Vtl (such as 2V). A pass voltage, Vpass (e.g., 8V) which is lower than Vprog is applied to the control gate electrodes 46A of the memory cell charge storage transistors (59A, 59B), while zero volts is applied to the common bit line 92.

In the second step of the two-step programming process or in the single step programming process, the first drain select gate electrode SGD1 is biased with the intermediate voltage (such as 3V) that is between the low threshold voltages and the high threshold voltages of the drain select transistors (DST1, DST2, DST3, DST4), and the second drain select gate electrode SGD2 is biased with a voltage (such as 5 V) that is greater than the high threshold voltages of the drain select transistors (DST1, DST2, DST3, DST4). The second, third, and fourth drain select transistors (DST2, DST3, DST4) are turned on, and the first drain select transistor DST1 is turned off. The first and third source select transistors (SST1, SST3) are turned off by applying a turn-off gate voltage (such as 0 V) to the first source select gate electrode SGS1. A high-threshold-voltage programming voltage Vprog+ can be applied to the second source select gate electrode SGS2, which may be, for example, in a range from 18 V to 36 V. Additional electrical charge can be injected to the charge trapping material portion (which may be silicon nitride portions) in the memory film 50 of the fourth source select transistor SST4 to set the threshold voltage of the fourth source select transistor SST4 at the high threshold voltage Vth (such as 4V).

Thus, the threshold voltage for the fourth source select transistor SST4 can be increased by injecting electrical charge to charge trapping material portion within the fourth source select gate transistor SST4, while not injecting electrical charge to charge trapping material portions within the second source select gate transistor SST2 which is turned off or any other charge trapping material portions at the second step of the two-step programming process, or at the single step programming process (in case the first step of the two-step programming process is omitted).

Subsequently, the first source select transistor SST1 can be programmed to become a high threshold voltage transistor by reversing the voltages applied to the first and second source select gate electrodes (SGS1, SGS2), reversing the voltages applied to the first and second drain select gate electrodes (SGD1, SGD2), and performing the two-step programming process or a single step programming process described above.

Thus, the threshold voltages for the first source select transistor SST1 and the fourth source select transistor SST4 can be increased by injecting electrical charge to charge trapping material portions within the first and fourth source select gate transistors (SST1, SST4), while not injecting electrical charge to charge trapping material portions within the second and third source select gate transistors (SST2, SST3) at the second step (or the only step) of the programming process.

In case the first step of the two-step programming process is employed, the second and third source select transistors (SST2, SST3) may be programmed to increase the respective threshold voltages provided that the increased threshold voltages are less than the high threshold voltages of the first and fourth source select transistors (SST1, SST4). Upon programming, the first and fourth source select transistors (SST1, SST4) can have higher threshold voltages than the second and third source select transistors (SST2, SST3). In this case, the first and fourth source select transistors (SST1, SST4) can be high threshold voltage devices, and the second and third source select transistors (SST2, SST3) can be low threshold voltage devices.

Figure 11:
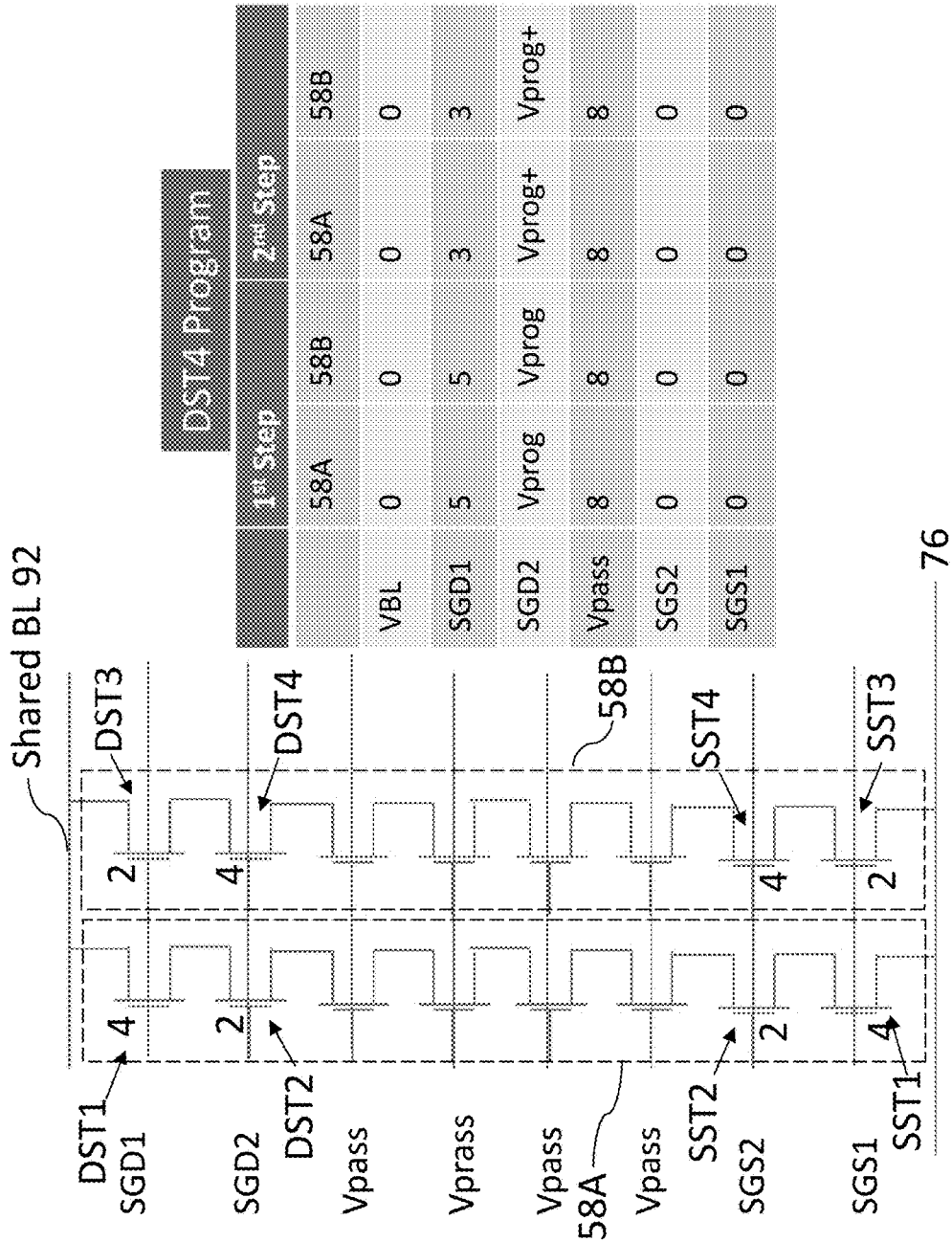
FIG. 11 illustrates operating conditions of the circuit of FIG. 9 during programming of a fourth drain select transistor according to an embodiment of the present disclosure.

Referring to FIG. 11, the threshold of the some of the drain select transistors may also be varied (e.g., increased or decreased) by programming after the drain select transistors are manufactured with the same threshold voltage. Alternatively, the programming step shown in FIG. 11 may be an optional step of enhancing the threshold voltages of the high threshold voltage drain select transistors (DST1, DST4) which are manufactured with a higher threshold voltage (e.g., by ion implantation) than the low threshold voltage drain select transistors (DST2, DST3). In other words, the high threshold voltages of the first and fourth drain select transistors (DST1, DST4) can be increased above the original (i.e., as manufactured) high threshold voltages provided by the first implanted channel region IR1 (for example, within the channel of the first drain select transistor DST1) and the second implanted channel region IR2 (for example, within the channel of the fourth drain select transistor DST4).

For example, in order to program the fourth drain select transistor DST4 as an enhanced high threshold voltage device (i.e., a device having a higher threshold voltage than the original high threshold voltage), a programming process can be employed, which may be a single step process or a two-step process. In the optional first step, the first and third drain select transistors (DST1, DST3) are turned on by applying a high voltage (such as 5V) to the first drain select gate electrode SGD1, and a programming voltage Vprog (which is higher than the high voltage and the Vth, and which may be in a range from 12V to 24V) can be applied to the second select drain gate electrode SGD2. Electrical charge can be injected to the charge storage regions within the second and fourth drain select gate transistors (DST2, DST4) to raise the threshold voltages of the second and fourth drain select gate transistors (DST2, DST4) to an intermediate level. In the second step (or the only step in case the first step is omitted), the third drain select transistor DST3 can be turned on and the first drain select transistor DST1 can be turned off by applying a bias voltage (such as 3V) between the low threshold voltage and the high threshold voltage of the first and third drain select transistors (DST1, DST3) to the first drain select gate electrode SGD1. A higher programming voltage Vprog+ (which is higher than Vprog and which may be in a range from 18 V to 36 V) can be applied to the second drain select gate electrode SGD2, thereby inducing injection of additional electrical charge only to the charge trapping material portion of the fourth drain select transistor DST4, while no charge injection occurs in the second drain select transistor DST2 because the first NAND string 58A is off due to the intermediate voltage being lower than Vth of transistor DST1. The pass voltage, Vpass (e.g., 8V) is applied to the control gate electrodes 46A and zero volts is applied to the common bit line 92.

A similar programming process can be performed for the first drain select transistor DST1 by activating the circuitry connected to the first vertical NAND string 58A and deactivating the circuitry connected to the second vertical NAND string 58B, and by applying the higher programming voltage Vprog+ to the first drain select gate electrode SGD1 (e.g., a reverse of the steps described above).

Figure 12:
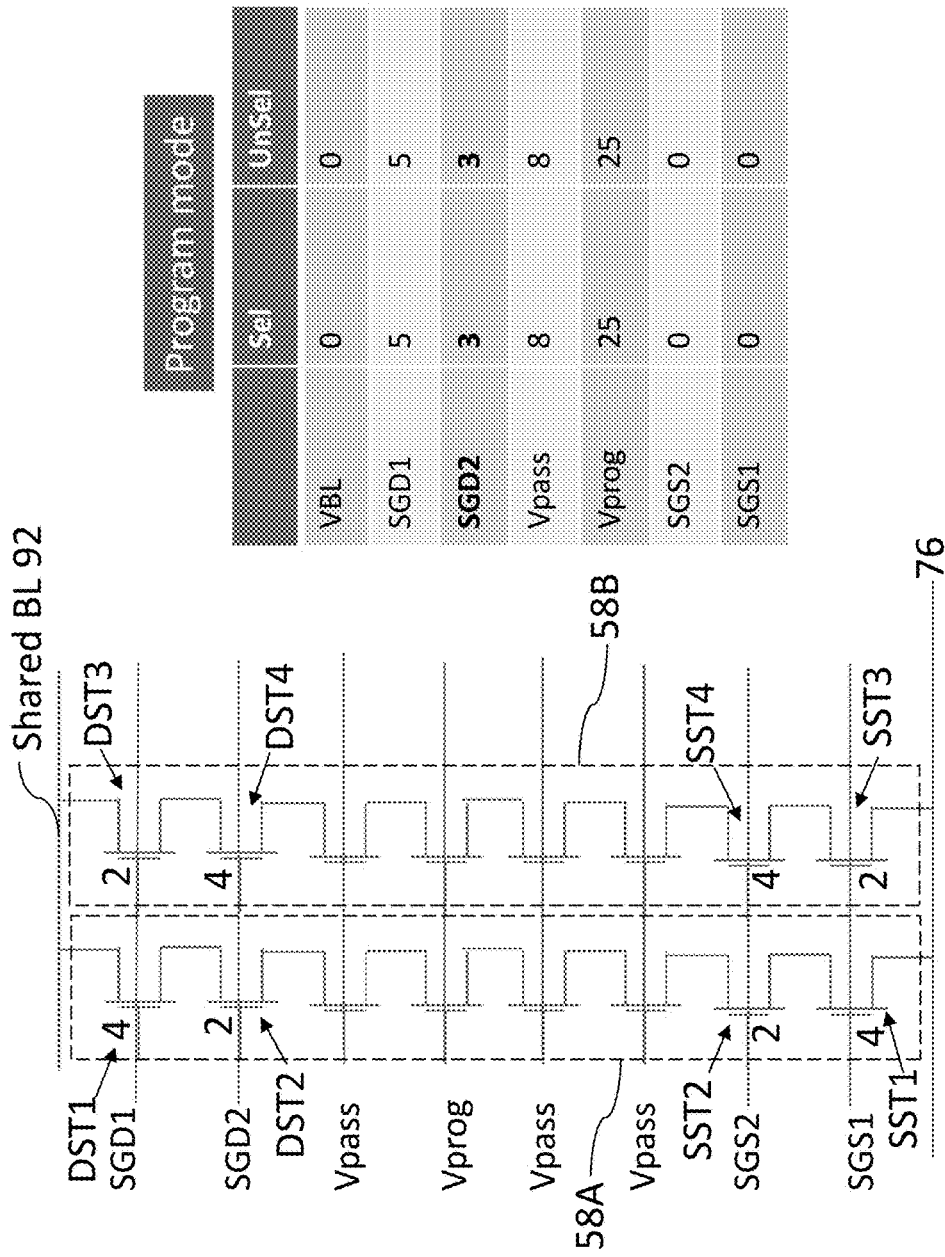
FIG. 12 illustrates operating conditions of the circuit of FIG. 9 during a programming mode according to an embodiment of the present disclosure.
Figure 13:
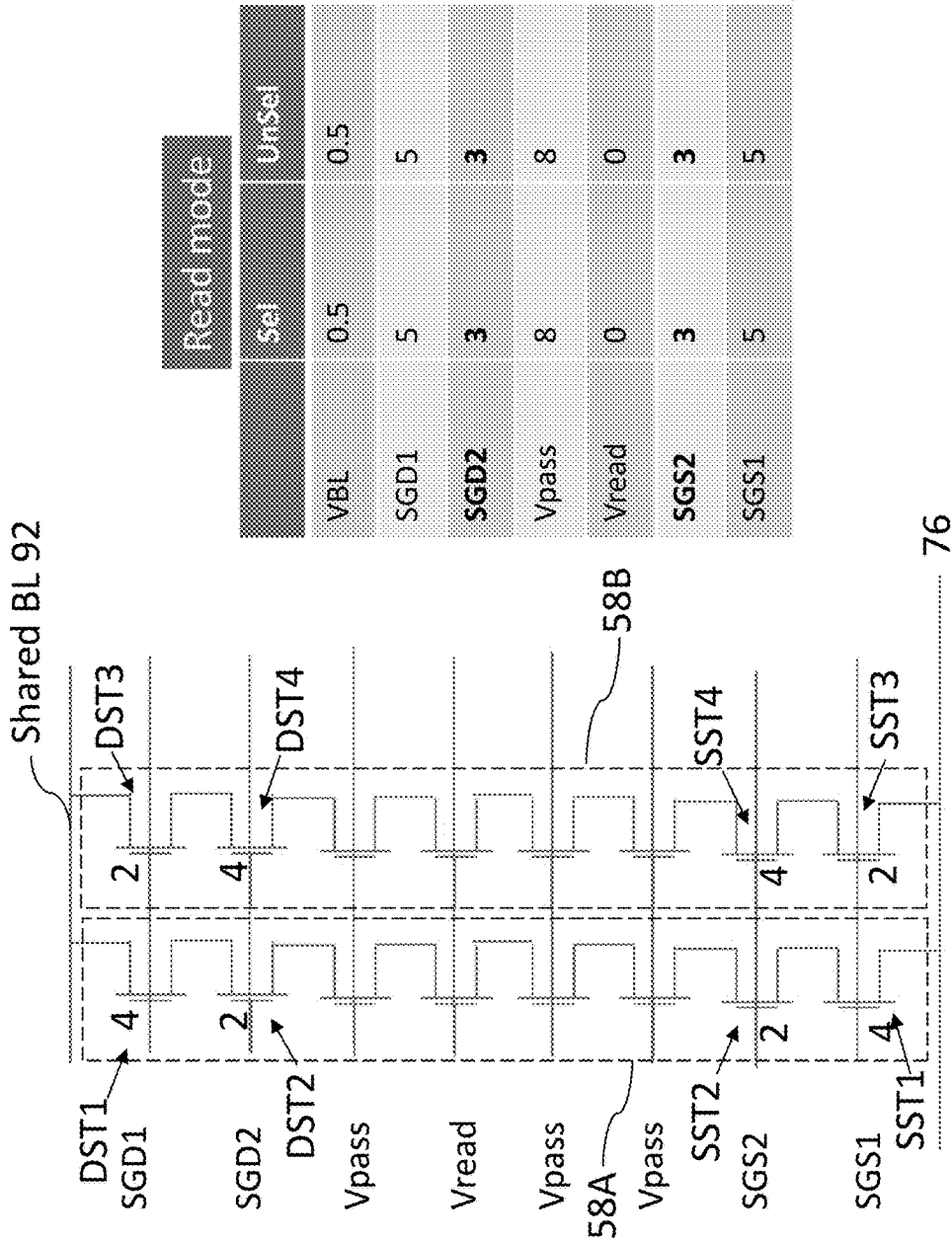
FIG. 13 illustrates operating conditions of the circuit of FIG. 9 during a read mode according to an embodiment of the present disclosure.

Referring to FIGS. 12 and 13, operating conditions of the circuit of FIG. 9 are shown during a programming mode and during a read mode, respectively. Specifically, only one of the first vertical NAND string 58A and the second vertical NAND string 58B can be activated by turning on only three of the first, second, third, and fourth drain select transistors. Only one of the first vertical NAND string 58A and the second vertical NAND string 58B can be activated by applying a set of selection control voltages to the first and second drain select gate electrodes (SGD1, SGD2) and to the first and second source select gate electrodes (SGS1, SGS2).

In an illustrative example, during a programming operation for the first vertical NAND string 58A, a high bias voltage (e.g., 5V) greater than the high threshold voltage of the first drain select transistor DST1 can be applied to the first drain select gate electrode SGD1 to turn on both the first and third drain select transistors (DST1, DST3), and an intermediate bias voltage (e.g., 3V) between the two threshold voltages of the second and fourth drain select transistors (DST2, DST4) can be applied to the second drain select gate electrode SGD2 to turn on the second drain select transistor DST2, while turning off the fourth drain select transistor DST4. While the second vertical NAND string 58B is deactivated, i.e., electrically disconnected from the shared (i.e., common) bit line 92 because transistor DST4 is off, suitable bias conditions can be applied to the word lines 46A, the source select gate electrodes 46C, the bit line 92 and the source region 61 through the backside contact via structure 76 (e.g., source electrode or local interconnect) to program each memory cell in the first vertical NAND string 58A. For example, zero volts is applied to the bit line 92, 3V is applied to electrode SGD1, Vprog+ is applied to electrode SGD2, Vpass is applied to the control gate electrodes 46A, and zero volts is applied to electrodes SGS1 and SGS2.

For programming of the second vertical NAND string 58B, the first vertical NAND string 58A can be deactivated while the second vertical NAND string 58B is activated by applying suitable bias voltages to the drain select gate electrodes (SGD1, SGD2). Specifically, a high bias voltage greater than the high threshold voltage of the fourth drain select transistor DST4 can be applied to the second drain select gate electrode SGD2 to turn on both the second and fourth drain select transistors (DST2, DST4), and an intermediate bias voltage between the two threshold voltages of the first and third drain select transistors (DST1, DST3) can be applied to the first drain select gate electrode SGD1 to turn on only the third drain select transistor DST3 and to turn off the first drain select transistor DST1. While the first vertical NAND string 58A is deactivated, i.e., electrically disconnected from the shared bit line 92, suitable bias conditions can be applied to the word lines 46A, the source select gate electrodes 46C, the bit line and the source region 61 through the backside contact via structure 76 to program each memory cell in the second vertical NAND string 58B, similar to that described above.

The read operations can be performed in a similar manner, as shown in FIG. 13. One of the two vertical NAND strings (58A, 58B) is activated and the other of the two vertical NAND strings (58A, 58B) is deactivated by application of suitable electrical bias voltages to the drain select gate electrodes (SGD1, SDG2). Further, suitable electrical bias voltages can be applied to the source select gate electrodes (SGS1, SGS2) to turn on only one series connection of the source select transistors of the activated vertical NAND string (58A or 58B). Thus, as shown in FIG. 13, in case the first vertical NAND string 58A is activated, the series connection of the first and second source select transistors (SST1, SST2) is turned on and the series connection of the third and fourth source select transistors (SST3, SST4) can be turned off. In case the second vertical NAND string 58B is activated, the series connection of the third and fourth source select transistors (SST3, SST4) can be turned on and the series connection of the first and second source select transistors (SST1, SST2) can be turned off. Thus, the high voltage (e.g., 5V) is applied to electrodes SGD1 and SGS1 and the intermediate voltage (e.g., 3V) is applied to electrodes SGD2 and SGS2 to turn on the first NAND string 58A and to turn off the second NAND string 58B. A low voltage, VBL (e.g., 0.5V) is applied to the common bit line 92, a pass voltage, Vpass, (e.g., 8V) is applied to the control gate electrodes 46A of the unselected memory cells, while a read voltage, Vread, (e.g., 0V) which is lower than Vpass and VBL, is applied to the control gate electrode(s) 46A of the selected memory cells to be read.

Generally speaking, an operation selected from a programming operation and a read operation on only the activated vertical NAND string can be performed while applying a bias voltage, VBL, to the bit line 92. VBL may be lower than Vpass, the intermediate voltage and the high voltage, but higher than Vread.

In order to perform a programming operation or a read operation on the first vertical NAND string 58A, a first voltage can be applied to the first common gate electrode (i.e., the first drain select gate electrode SGD1) and a second voltage can be applied to the second common gate electrode (i.e., the second drain select gate electrode SGD2). The first voltage is greater than threshold voltages of the first and third drain select transistors (DST1, DST3), and the second voltage is between the threshold voltages of the second and fourth drain select transistors (DST2, DST4). The first, second, and third drain select transistors (DST1, DST2, DST3) are turned on and the fourth drain select transistor DST4 is turned off. An operation selected from a programming operation and a read operation on more or more of the memory cells of the first NAND string 58A (e.g., by application of Vprog or Vread to the control gate electrode(s) 46A of the selected memory cell(s)) while the second NAND string 58B remains inactive due to turn-off of the fourth drain select transistor DST4.

In order to perform a programming operation or a read operation on the second vertical NAND string 58B, a first voltage can be applied to the first common gate electrode (i.e., the first drain select gate electrode SGD1) and a second voltage can be applied to the second common gate electrode (i.e., the second drain select gate electrode SGD2). The first voltage is between the threshold voltages of the first and third drain select transistors (DST1, DST3), and the second voltage is greater than the threshold voltages of the second and fourth drain select transistors (DST2, DST4). The second, third, and fourth drain select transistors (DST2, DST3, DST4) are turned on, and the first drain select transistor DST1 is turned off. An operation selected from a programming operation and a read operation on the second NAND string 58B while the first NAND string 58A remains inactive due to turn-off of the first drain select transistor DST1.

Figure 14:
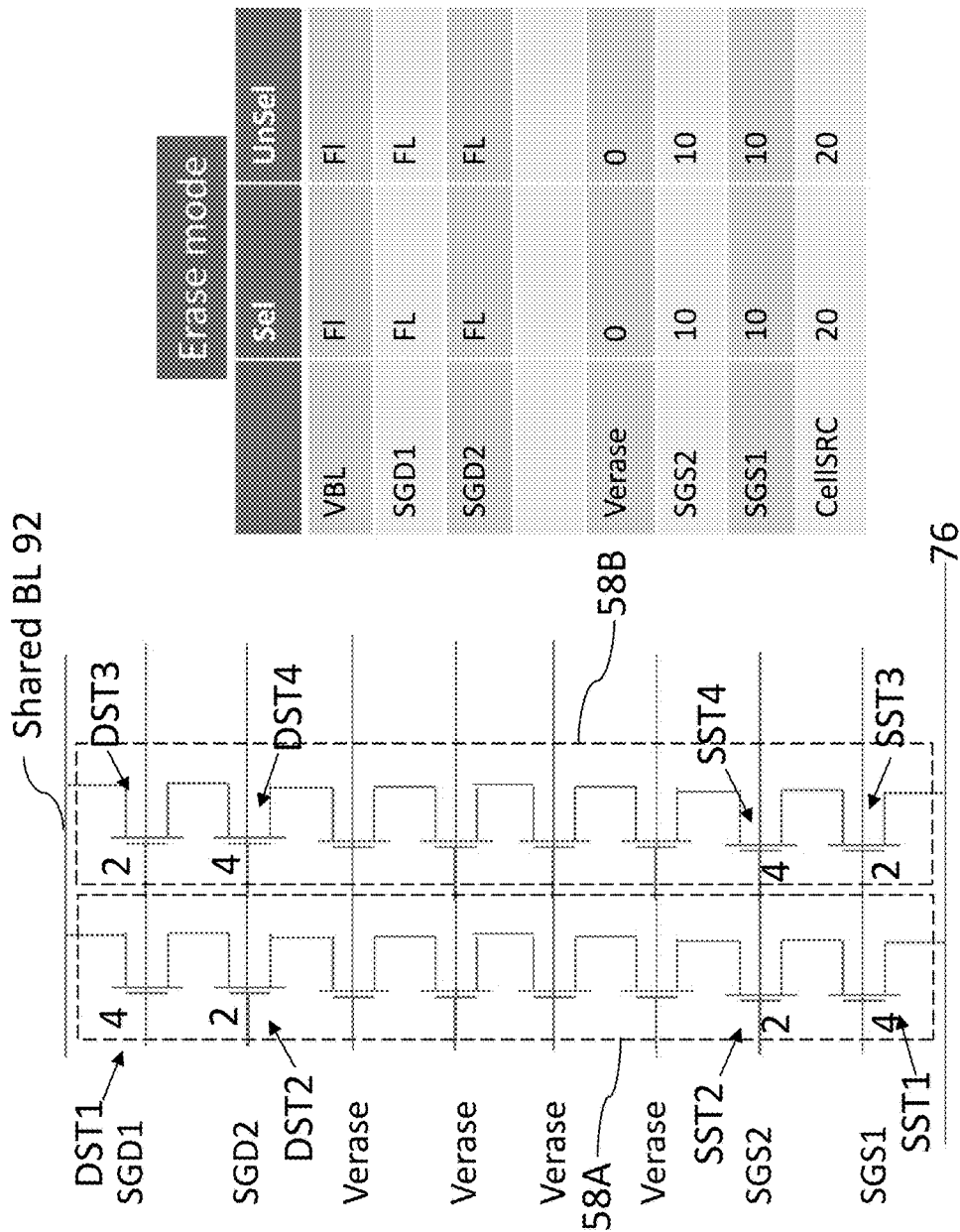
FIG. 14 illustrates operating conditions of the circuit of FIG. 9 during an erase mode according to an embodiment of the present disclosure.

Referring to FIG. 14, an erase operation can be performed simultaneously on both vertical NAND strings (58A, 58B). A high voltage CellSRC of about 20V (which is higher than Vth) can be applied to the source region 61 through the backside contact via structure 76. The bit line 92 and the drain select gate electrodes (SGD1, SGD2) can be electrically floating, the source select electrodes (SGS1, SGS2) are set to a high voltage (e.g., 10V) which is between CellSRC and Vth, and the control gate electrodes 46A are set to an erase voltage, Verase (e.g., zero volts).

FIG. 15 illustrates a wiring scheme of a comparative example in which all NAND strings in the same memory block 102 are connected to different bit lines 92. Specifically, the drain regions located on each memory stack structure 55 extending through the alternating stack (32, 46) in the same memory block 102 are connected to different bit lines 92 using a respective drain contact via structure 88. This requires a dense bit line 92 arrangement with a tight pitch which undesirably increases the bit line capacitance and increases the difficulty of photolithography and patterning of the bit lines.

FIGS. 16, 17 and 18 illustrate embodiment exemplary wiring schemes for connecting two NAND stings in the same memory block 102 to a single, common (i.e., shared) bit line 92. Specifically, two drain regions located on pairs of memory stack structure 55 extending through the alternating stack (32, 46) in the same memory block 102 are connected to the same bit line 92 using a respective drain contact via structure 88.

FIG. 16 illustrates an embodiment which contains four rows of NAND stings/memory stack structures 55 per block 102. In this embodiment, the pitch of the bit lines 92 is increased compared to the device of FIG. 15. This decreases the bit line capacitance and decreases the difficulty of photolithography and patterning of the bit lines.

FIG. 17 illustrates an embodiment with a larger memory block 102L which contains eight rows of NAND stings/memory stack structures 55 per memory block. In this embodiment, the pitch of the bit lines 92 is the same as that in the device of FIG. 15, but the size of the memory block is increased, which increases the number of NAND strings per substrate and decreases the device cost.

FIG. 18 illustrates an embodiment in which the memory blocks are separated by the shallow trench 80 filled with the insulating layer 75, similar to the device shown in FIG. 8C. The same advantages of the device shown in FIGS. 16 and 17 may be realized with the shallow trench 80 isolated memory blocks of FIG. 18.

As shown in FIGS. 16-18, first memory stack structures 55A including first implanted channel regions IR1 may be located on outer rows in a cluster of memory stack structures 55, and second memory stack structures 55B including second implanted channel regions IR2 may be located on inner rows in the cluster of memory stack structures 55 between a pair of backside contact via structures 76 as illustrated in FIGS. 16-18. Alternatively, first memory stack structures 55A including first implanted channel regions IR1 and second memory stack structures 55B including second implanted channel regions IR2 may be located on each side of a cluster of memory stack structures 55 between a pair of backside contact via structures 76. In either case, each bit line 92 is electrically connected (i.e., shorted) to two drain regions 63, one of which contacts a vertical semiconductor channel 60 within a first memory stack structure 55A in a first vertical NAND string 58A and another vertical semiconductor channel 60 within a second memory stack structure 55B in a second vertical NAND string 58B.

FIGS. 19A, 19B, 20A and 20B illustrate steps in alternative device fabrication methods which may increase the threshold voltage differences between select transistors of the same type (e.g., either drain or source select transistors) located in different device levels (i.e., at different distances from the substrate) on the same side of the memory cell charge storage transistors (59A, 59B).

Figure 19B:
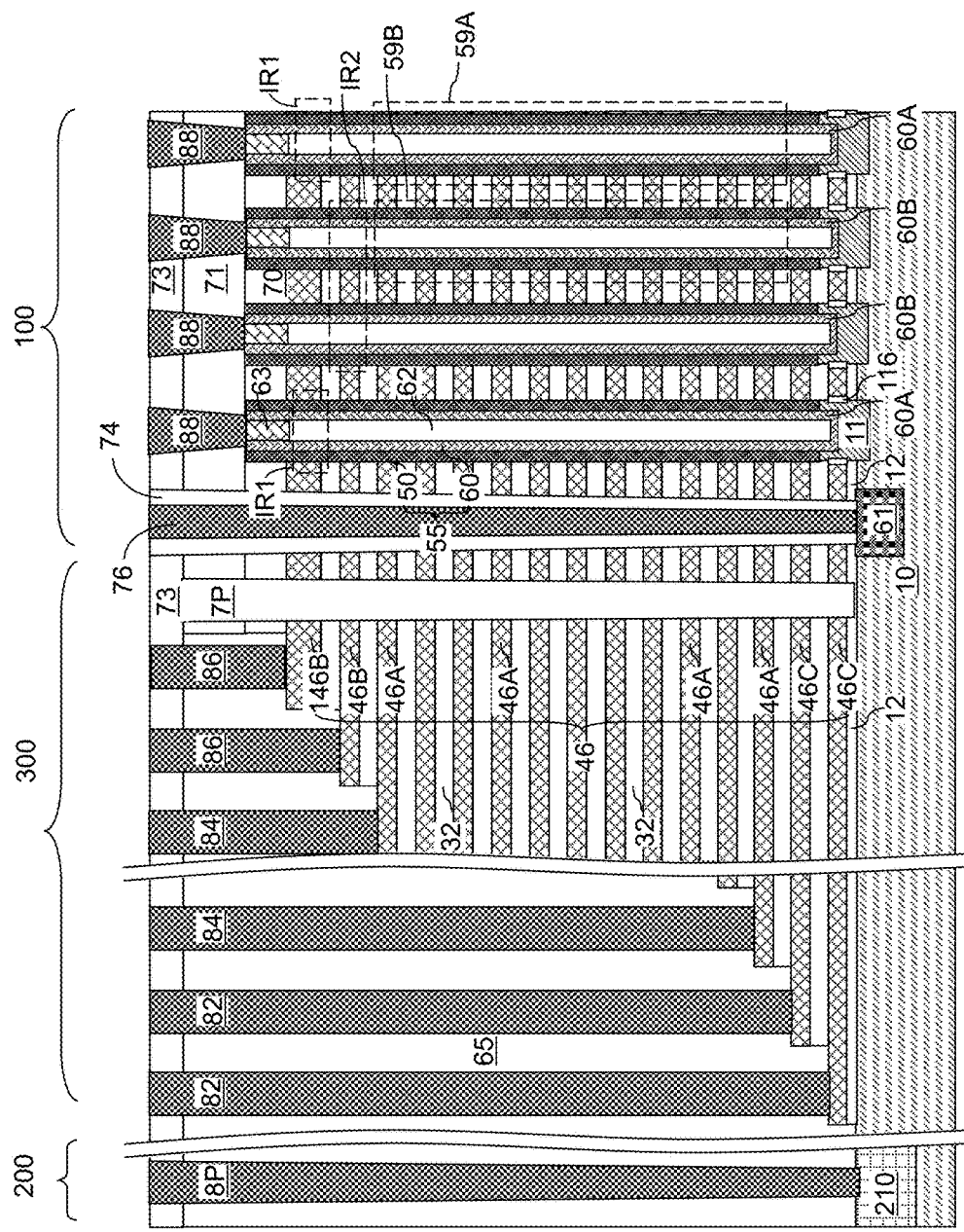

In FIG. 19B, one of the select gate electrodes (e.g., SGD1) is thicker than another select gate electrode (e.g., SGD2) of the same type (e.g., drain select gate electrode located on the same side of the memory cell transistors 59A, 59B). This configuration may be achieved by forming one or more of the sacrificial layers 142 with a greater (or lesser) thickness than the other sacrificial layers 42 in the alternating stack, as shown in FIG. 19A. During replacement of the sacrificial layers with the electrically conductive layers, the different thickness (e.g., thicker or thinner) sacrificial layer 142 is replaced with an electrically conductive select gate layer 146B with different thickness (e.g., thicker or thinner) than the other electrically conductive select gate layers 46B of the same type located on the same side of the memory cell transistors 59A, 59B.

Figure 20A:
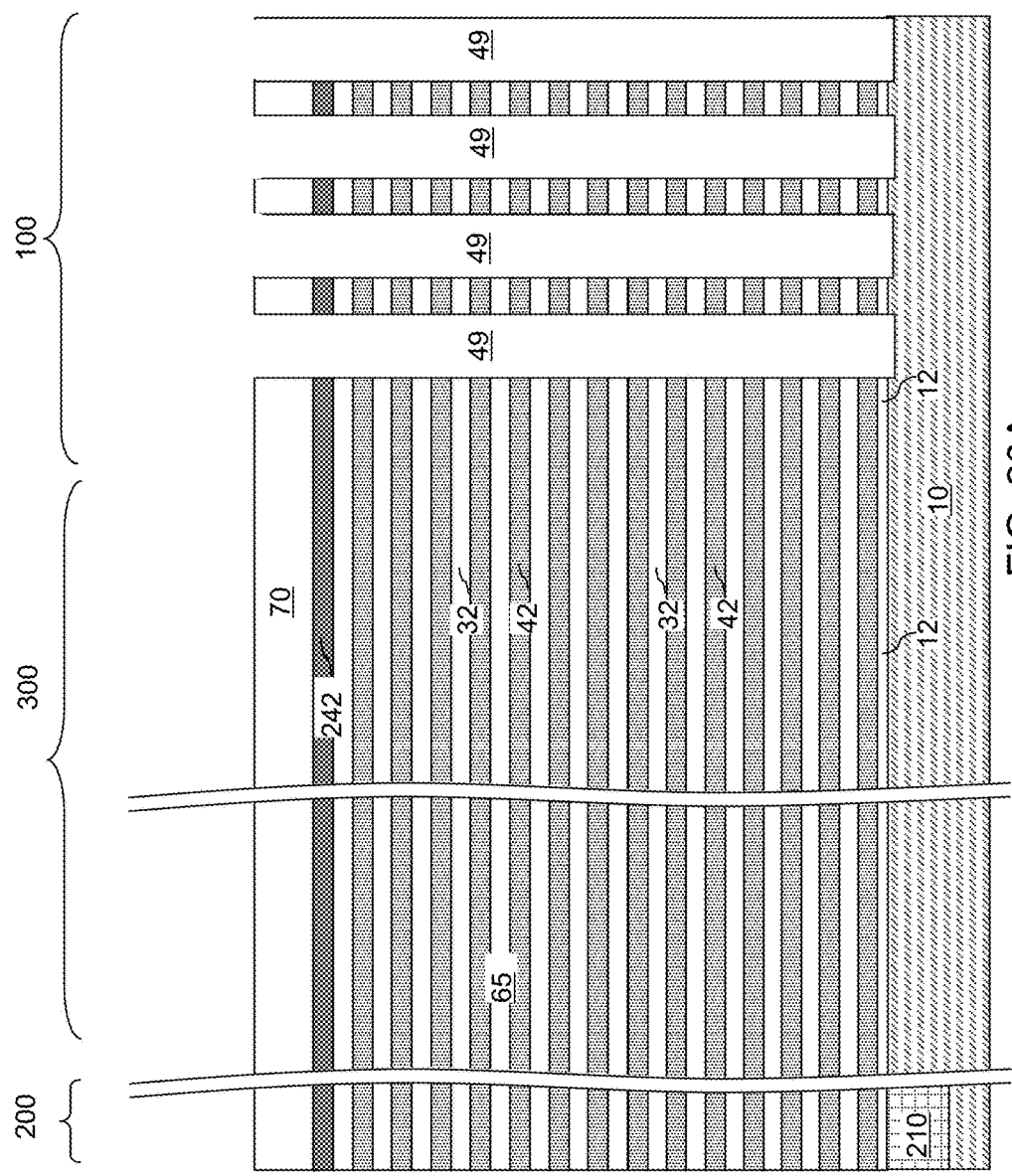
FIGS. 20A and 20B are vertical cross-sectional views of steps in a method of making a vertical NAND device according to another alternative embodiment of the present disclosure.
Figure 20B:
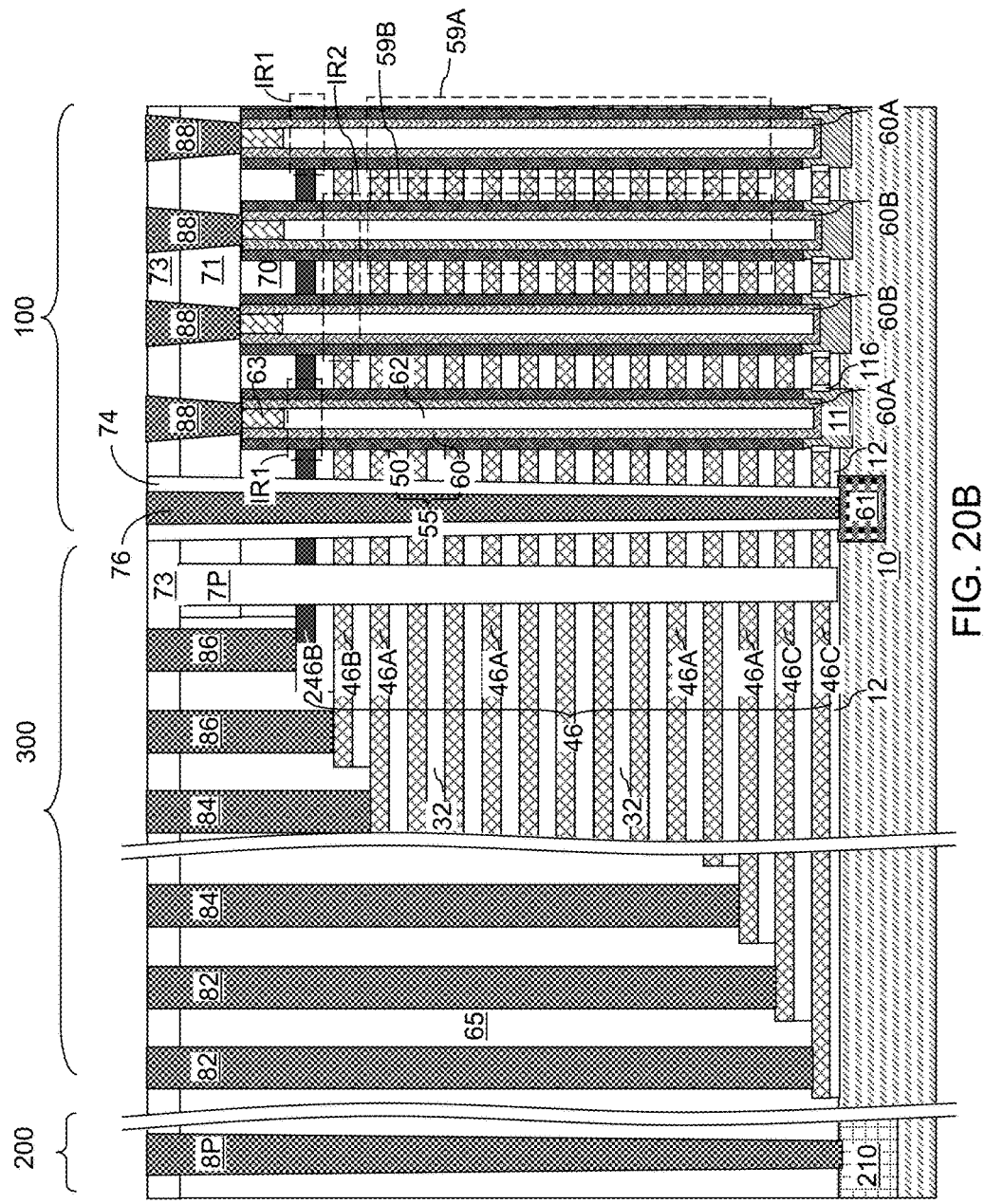

In FIG. 20B, one of the select gate electrodes (e.g., SGD1) has a different composition with a different work function than another select gate electrode (e.g., SGD2) of the same type (e.g., drain select gate electrode located on the same side of the memory cell transistors 59A, 59B). This configuration may be achieved by forming one or more of the sacrificial layers 242 of a different material than the other sacrificial layers 42 in the alternating stack, as shown in FIG. 20A. The sacrificial layers 242 and 42 may be removed during separate steps using different selective etchants and the resulting respective backside recesses may be refilled with different gate electrode materials 246B, 46B in separate replacement steps. For example, layers 242 may comprise polysilicon if layers 42 comprise silicon nitride, and vice-versa. Layers 246B and 46B can be selected from different electrically conductive materials, such as tungsten, tungsten nitride, titanium, titanium nitride, tantalum, tantalum nitride, cobalt, ruthenium and silicides thereof. For example, electrode 246B may comprise cobalt and electrodes 46B, 46A and 46C may comprise tungsten and titanium nitride.

If desired the embodiments of FIGS. 19B and 20B may be used in combination. In other words, one or more of the select electrodes may have both a different composition and a different thickness than one or more of the select electrodes of the same type. In this embodiment, layer 142 in FIG. 19A has a different thickness and a different composition than the other sacrificial layers 42, and select gate electrode 146B has a different thickness and a different composition than the other select gate electrodes 46B of the same type.

Figure 21:
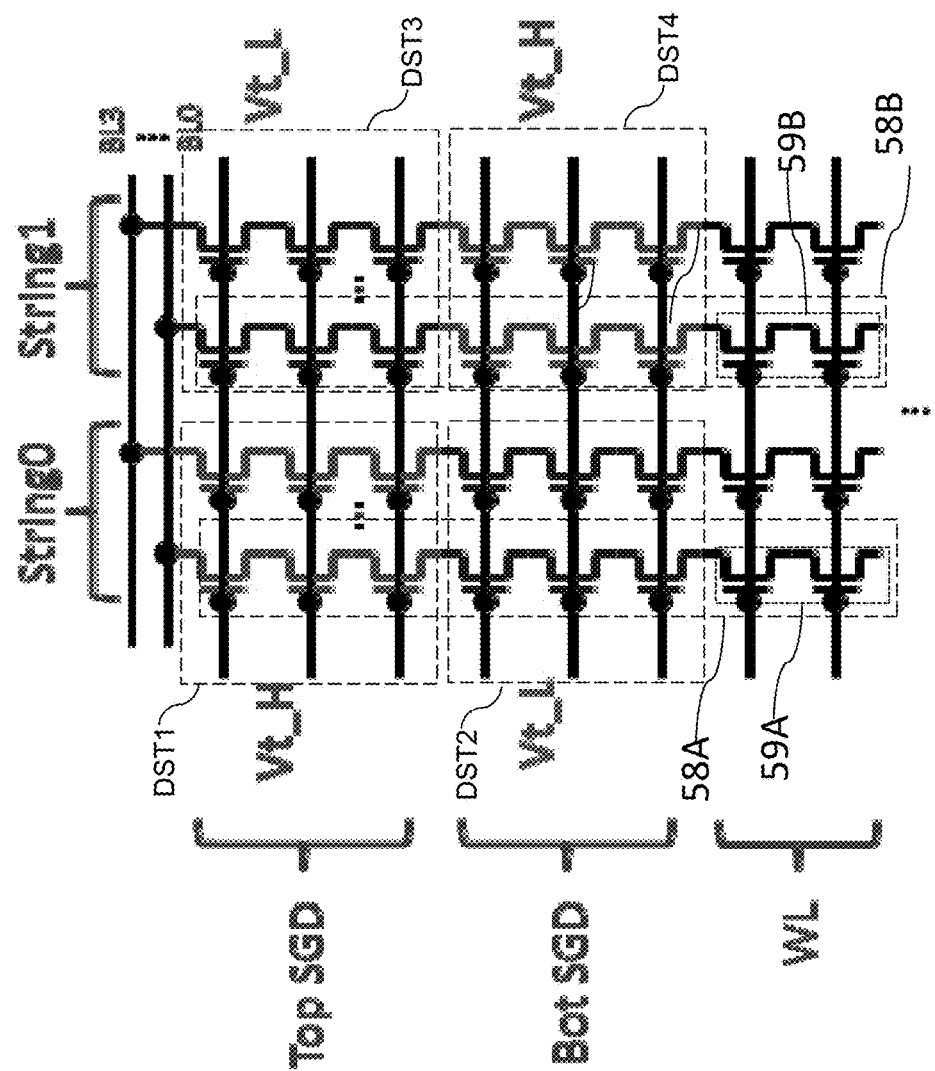
FIG. 21 is a schematic of a circuit including pairs of vertical NAND strings attached to bit lines according to an embodiment of the present disclosure.

Referring to FIG. 21, a schematic of a circuit including pairs of vertical NAND strings attached to bit lines is illustrated. Each pair of vertical NAND strings includes a vertical NAND string within a first string group (e.g., a "String0" group) and a vertical NAND string within a second string group (e.g., a "String1" group). Each string group can include one or more vertical NAND strings. Each pair of the vertical NAND strings is attached to a respective bit line (such as a first bit line "BL0," a second bit line "BL1," a third bit line "BL2," a fourth bit line "BL3," etc.) within the set of bit lines. Two groups of drain-select-level transistors can be provided at an upper end of each vertical NAND string. The two groups of drain-select-level transistors include a top group of drain-select-level transistors (DST1, DST2) (labeled "Top SGD") and a bottom group of drain-select-level transistors (DST3, DST4) (labeled "Bot SGD"). Each group of drain-select-level transistors can include one or more vertical field effect transistors employing drain-select-level electrically conductive layers as gate electrodes. Each vertical NAND string includes word lines (labeled "WL") that are located adjacent to the NAND memory cells located below a bottom end of the two groups of drain-select-level transistors.

A top group of drain-select-level transistors of each vertical NAND string can include portions of upper drain-select-level electrically conductive layers functioning as drain select gate electrodes and portions of a memory stack structure 55 that are laterally surrounded by the portions of upper drain-select-level electrically conductive layers. The number of transistors within the top group of drain-select-level transistors can be, for example, in a range from 1 to 6. FIG. 21 illustrates an embodiment in which the number of transistors within the top group of drain-select-level transistors is 3. A bottom group of drain-select-level transistors of each vertical NAND string can include portions of lower drain-select-level electrically conductive layers functioning as drain select gate electrodes and portions of a memory stack structure 55 that are laterally surrounded by the portions of lower drain-select-level electrically conductive layers. The number of transistors within the bottom group of drain-select-level transistors can be, for example, in a range from 1 to 6. FIG. 21 illustrates an embodiment in which the number of transistors within the bottom group of drain-select-level transistors is 3.

In one embodiment, each pair of vertical NAND strings attached to a same bit line has a cross-coupled threshold voltage configuration. Specifically, the top group of drain-select-level transistors of a first vertical NAND string within each pair of vertical NAND strings has a higher threshold voltage than the top group of drain-select-level transistors of a second vertical NAND string of the same pair of vertical NAND strings. Further, the bottom group of drain-select-level transistors of the first vertical NAND string within each pair of vertical NAND strings has a lower threshold voltage than the bottom group of drain-select-level transistors of the second vertical NAND string of the same pair of vertical NAND strings.

Figure 22A:
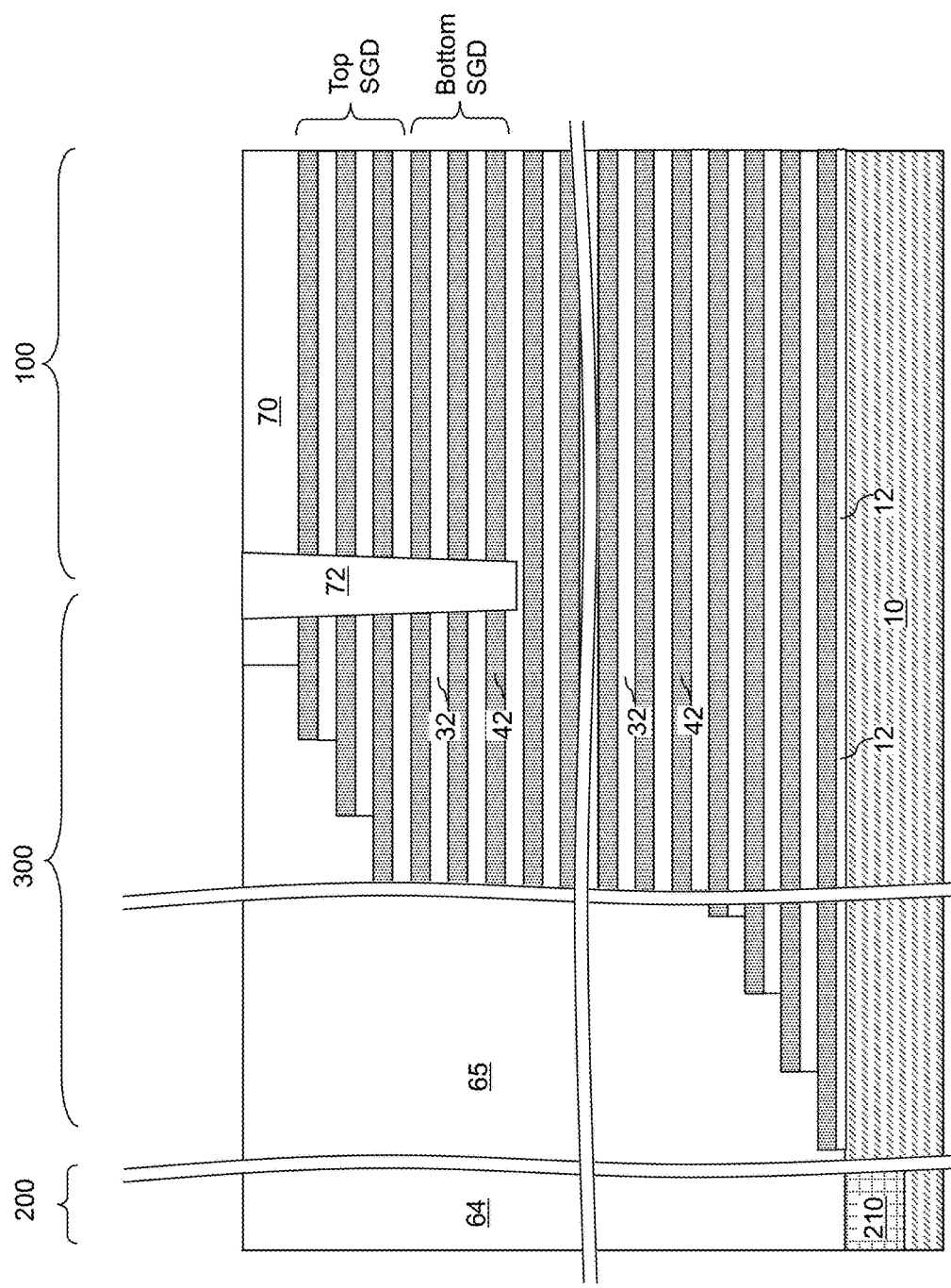
FIG. 22A is a vertical cross-sectional view of a second exemplary structure after formation of a retro-stepped dielectric material portion and isolation dielectric structures according to an embodiment of the present disclosure.

Referring to FIGS. 22A and 22B, a second exemplary structure is illustrated, which can be employed to provide the circuit illustrated in FIG. 21. The second exemplary structure of FIGS. 22A and 22B can be provided by formatting an alternating stack of insulating layers 32 and sacrificial material layers employing the processing steps of FIG. 1, and by forming a retro-stepped dielectric material portion 65 employing the processing steps of FIG. 4 without forming memory openings or an optional first contact level dielectric material layer. Generally, an alternating stack of insulating layers 32 and spacer material layers is formed over a substrate (9, 10). The spacer material layers are formed as electrically conductive layers 46, or can be formed as sacrificial material layers 42 that are subsequently replaced with electrically conductive layers 46.

Dielectric isolation structures 72 can be formed through the insulating cap layer 70 and the material layers located at the drain select levels, which are the levels at which the top groups of drain-select-level transistors and bottom groups of drain-select-level transistors are provided. In other words, the dielectric isolation structures 72 are formed through the layers of the alternating stack (32, 42) that are subsequently employed to provide the drain-select-level electrically conductive layers that function as the drain select gate electrodes for the drain select level transistors.

In one embodiment, the dielectric isolation structures 72 can be formed by applying a photoresist layer over the insulating cap layer 70 and the retro-stepped dielectric material portion 65, lithographically patterning the photoresist layer to form linear openings that extend along a first horizontal direction hd1 and laterally spaced apart along the second horizontal direction, forming isolation trenches that vertically extend through each material layer located at drain select levels, and filling the isolation trenches with a dielectric material such as silicon oxide. Optionally, excess portions of the deposited dielectric material overlying the top surface of the insulating cap layer 70 can be removed, for example, by a planarization process such as chemical mechanical planarization (CMP) and/or a recess etch. Each portion of the deposited dielectric material filling the isolation trenches constitutes a dielectric isolation structure 72. Each dielectric isolation structure 72 laterally extends along the first horizontal direction through each layer of the alternating stack (32, 42) located at levels of drain select transistors to be subsequently formed. Each dielectric isolation structure 72 can have a uniform vertical cross-sectional profile along vertical planes that are perpendicular to the first horizontal direction hd1 that is invariant with translation along the first horizontal direction hd1.

Figure 23A:
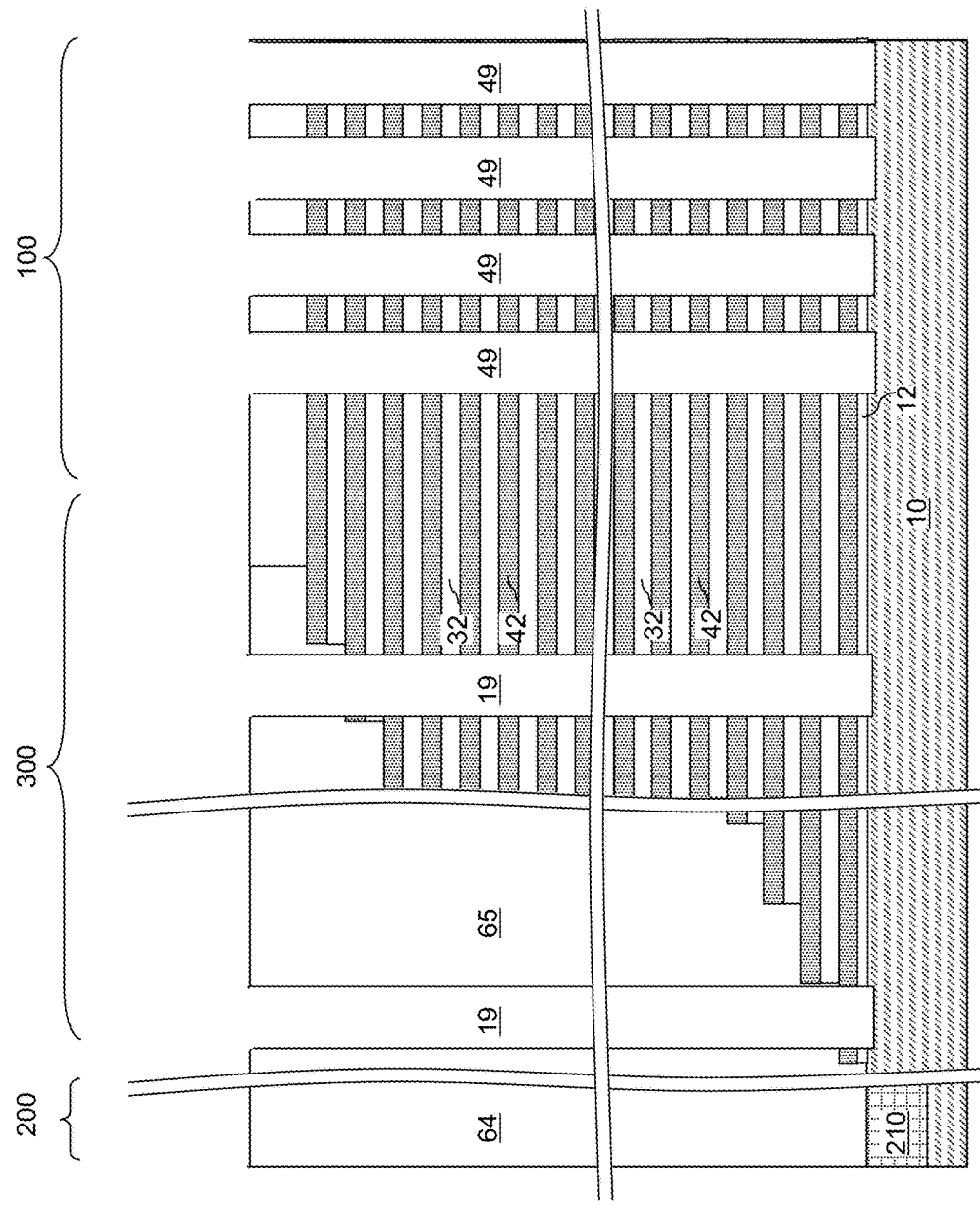
FIG. 23A is a vertical cross-sectional view of the second exemplary structure after formation of memory openings and support openings according to an embodiment of the present disclosure.
Figure 23B:
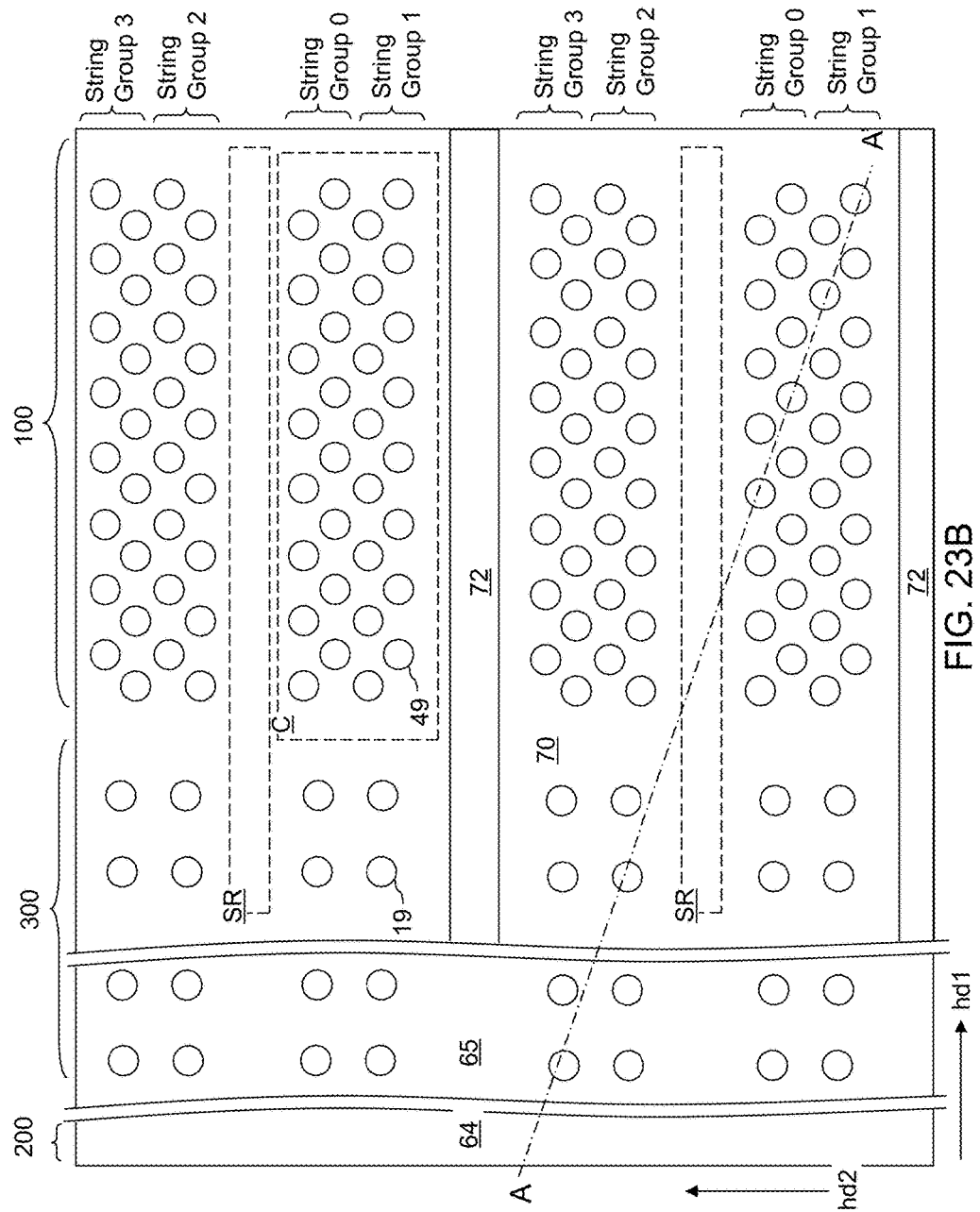
FIG. 23B is a top-down view of the second exemplary structure of FIG. 23A. The vertical plane A-A' is the plane of the vertical cross-sectional view of FIG. 23A.

Referring to FIGS. 23A and 23B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

As shown in FIG. 23B, the memory openings 49 can be formed as clusters C of memory openings 49 in the memory array region 100. The clusters C of memory openings 49 can be laterally spaced among one another along the second horizontal direction hd2 by the dielectric isolation structures 72 and space regions SR in which the memory openings 49 are not present. Each cluster C of memory openings 49 can be configured to include a pair of string groups, such as a pair of a "String Group 0" and a "String Group 1" or a pair of a "String Group 2" and a "String Group 3." In one embodiment, at least one dielectric isolation structure 72 can be provided between each neighboring pair of space regions SR that are spaced apart along the second horizontal direction hd2. At least four string groups, such as a "String Group 0," a "String Group 1," a "String Group 2," and a "String Group 3," can be provided between each neighboring pair of space regions SR that are spaced apart along the second horizontal direction hd2. Generally, if N dielectric isolation structures 72 are provided between each neighboring pair of space regions SR that are spaced apart along the second horizontal direction hd2, (2N+2) string groups can be provided between each neighboring pair of space regions SR.

Each string group includes at least one row of memory openings 49 that laterally extend along the first horizontal direction. In one embodiment, each string group may include two rows of memory openings 49 that are laterally offset from each other along the second horizontal direction hd2. In another embodiment, each string group may include three or more rows of memory openings 49 that are laterally offset among one another along the second horizontal direction hd2. The memory openings 49 in one row may be offset from nearest memory openings 49 in an adjacent row in the first horizontal direction hd1 to form the staggered configuration shown in FIG. 23B.

The string groups can be numbered along the second horizontal direction hd2. The number of the string groups can strictly increase from one space region SR to another space region SR between each neighboring pair of space regions SR. In one embodiment, instead of increasing string group numbers, a modification can be made such that every fourth number is swapped with every third number in order to simplify forming an ion implant lithography mask in a subsequent step. For example, if the string numbers begin with 0, the numbering sequence can be 0, 1, 3, 2 in case four string groups are provided between each neighboring pair of space regions SR; 0, 1, 3, 2, 4, 5 in case six string groups are provided between each neighboring pair of space regions SR; 0, 1, 3, 2, 4, 5, 7, 6 in case eight string groups are provided between each neighboring pair of space regions SR, etc. In other words, the pair of odd numbered groups or a pair of even numbered groups are located next to each other in the second horizontal direction but separated by either a space region SR or a dielectric isolation structure in order for the same ion implant mask to cover the adjacent even or odd numbered groups.

The memory openings 49 within each even-numbered string group (such as a "String Group 0" or a "String Group 2") are herein referred to as first memory openings 49. The memory openings 49 within each odd-numbered string group (such as a "String Group 1" or a "String Group 3") are herein referred to as second memory openings 49.

FIGS. 24A-24F illustrate structural changes in a memory opening 49 up to the processing step for formation of a dielectric core material layer. The same structural change occurs simultaneously in each of the other memory openings 49 and in each support opening 19 in the second exemplary structure of FIGS. 23A and 23B.

Referring to FIG. 24A, a memory opening 49 in the exemplary device structure of FIGS. 23A and 23B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 24B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11.

In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 24D:
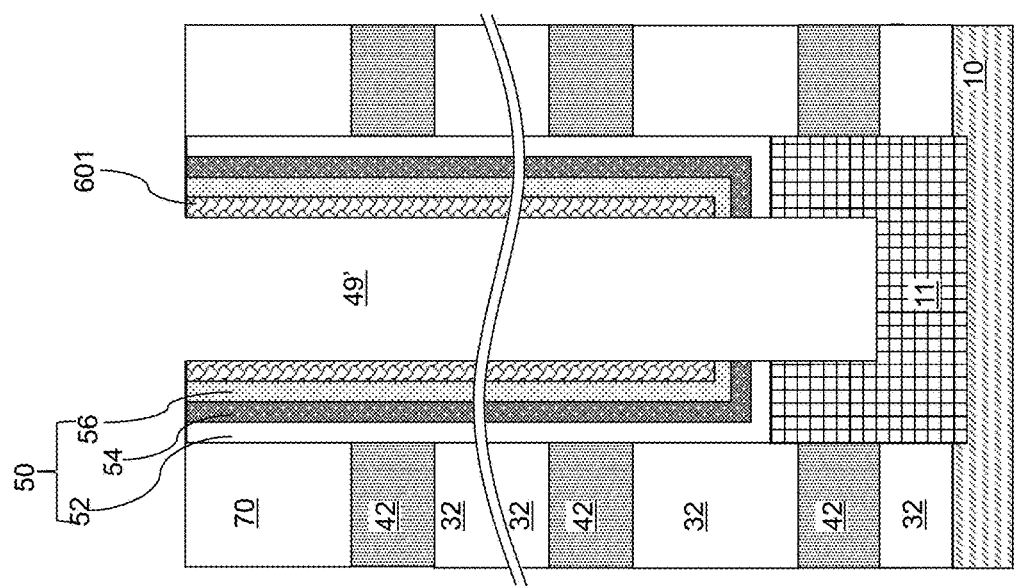
Figure 24C:
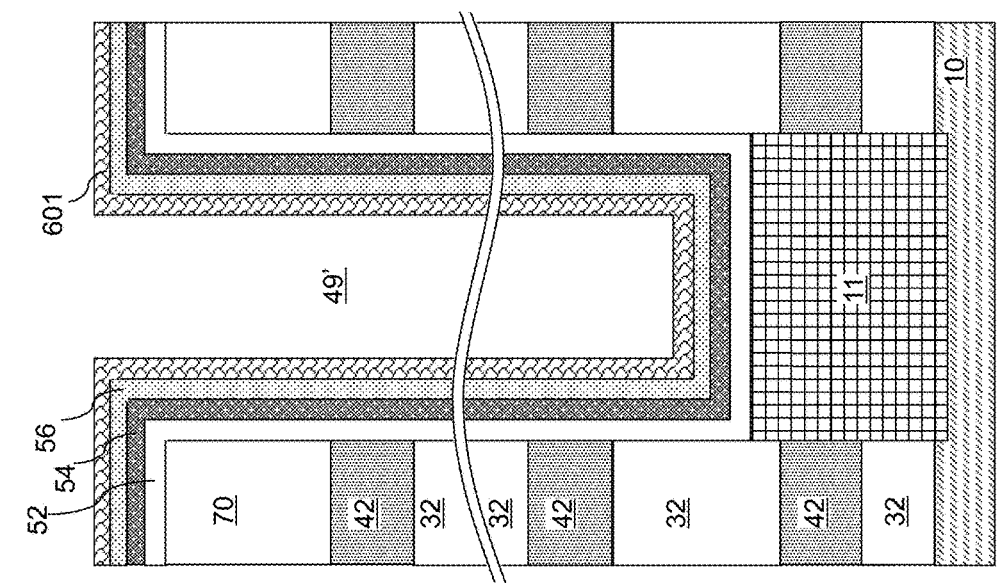

Referring to FIG. 24C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 24D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 24E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 24F, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 25A:
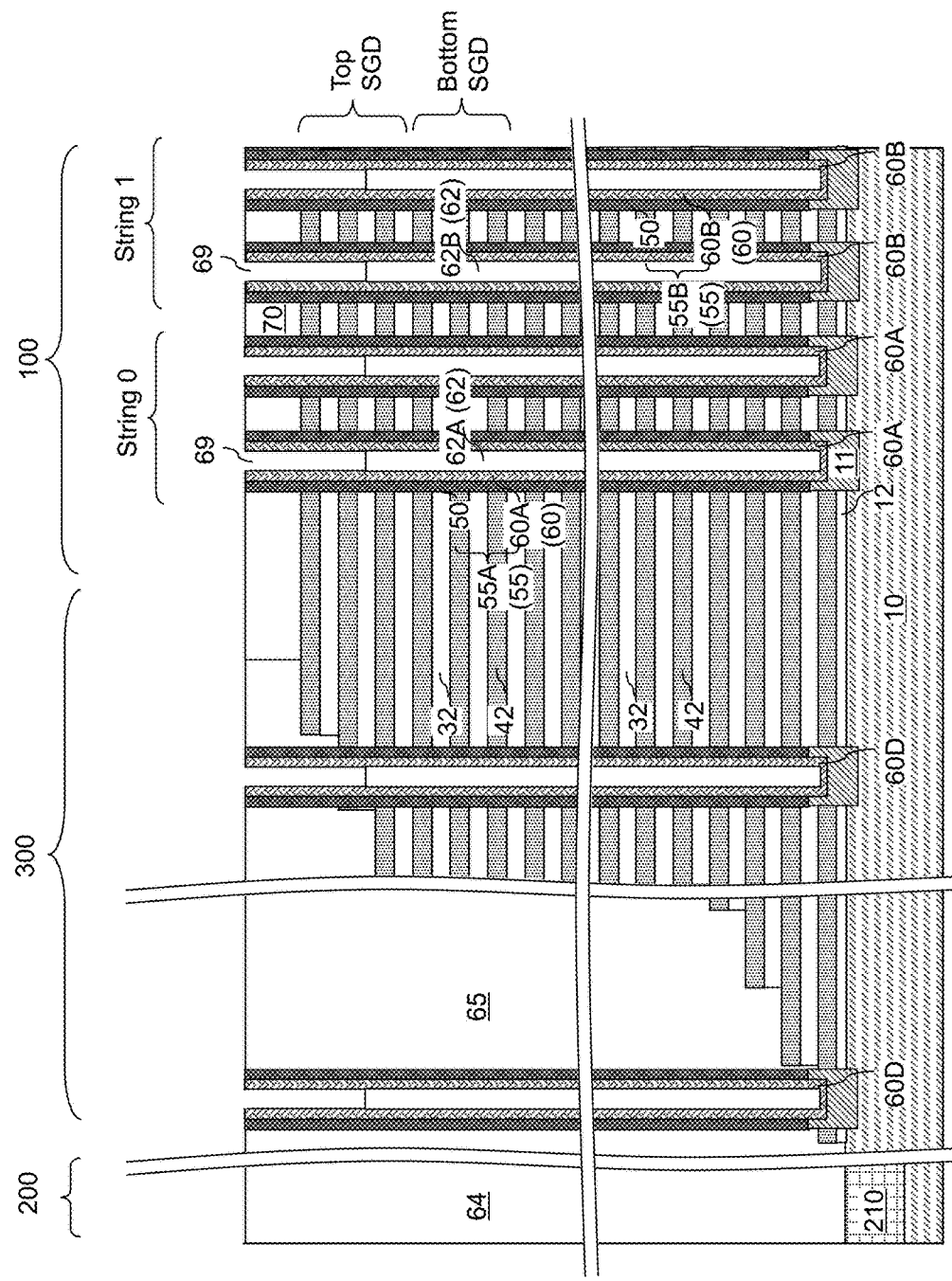
FIG. 25A is a vertical cross-sectional view of the second exemplary structure after formation of lower dielectric cores according to an embodiment of the present disclosure.
Figure 25B:
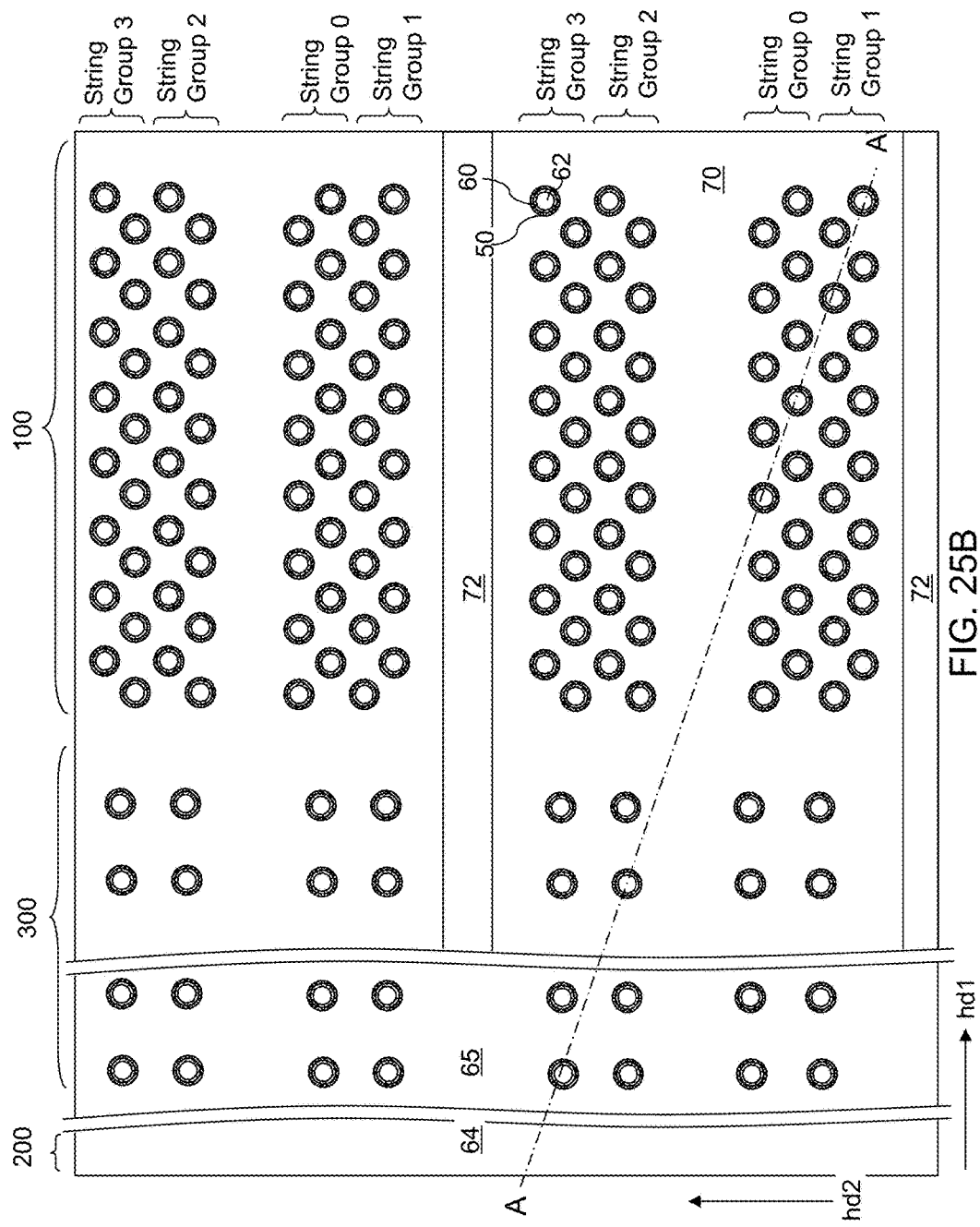
FIG. 25B is a top-down view of the second exemplary structure of FIG. 25A. The vertical plane A-A' is the plane of the vertical cross-sectional view of FIG. 25A.

Referring to FIGS. 25A and 25B, the horizontal portion of the dielectric core layer 62L can be removed, for example, by a recess etch process from above the top surface of the insulating cap layer 70. The recess etch process can be continued until the material of the dielectric core layer 62L is recessed to a height between the top surface of a topmost sacrificial material layer 42 and a bottom surfaces of a bottom sacrificial material layer within the top group of drain-select-level transistors (labeled "Top SGD"). For example, if the top group of drain-select-level transistors are to be formed over the levels of the first, second, and third sacrificial material layers 46 as counted from the top of the alternating stack (32, 42), then the top surfaces of the recessed remaining portions of the dielectric core layer 62L can be formed between the top surface of the topmost sacrificial material layer 42 and the bottom surfaces of the third sacrificial material layer 42 as counted from the top. The remaining portions of the dielectric core layer 62L are herein referred to as lower dielectric cores 62.

The location of the top surfaces of the lower dielectric cores 62 can be selected such that electrical dopant ions that are implanted in a subsequent ion implantation process are implanted at the levels of the top group of drain-select-level transistors. The species of the electrical dopant ions, the ion implantation energy, and the height of the top surfaces of the lower dielectric cores 62 are selected such that the vertical spatial distribution of the electrical dopants to be subsequently implanted will be confined within the levels of the top group of drain-select-level transistors (which can be, for example, the levels of the three topmost sacrificial material layers 42 in case the gate electrodes for the top group of drain-select-level transistors are formed across the levels of the three topmost sacrificial material layers 42). A recess cavity 69 can be present within each unfilled volume overlying the lower dielectric cores 62. A subset of the lower dielectric cores 62 located in the first memory openings is herein referred to as first lower dielectric cores 62A. A subset of the lower dielectric cores 62 located in the second memory openings is herein referred to as second lower dielectric cores 62B.

Portions of the first semiconductor channel layer 601 and the second semiconductor channel layer 602 overlying the insulating cap layer 70 and the retro-stepped dielectric material portion 65 can be removed by a recess etch process. The recess etch process can vertically recess the semiconductor materials of the first semiconductor channel layer 601 and the second semiconductor channel layer 602 selective to the dielectric materials of the insulating cap layer 70 and the lower dielectric cores 62.

Remaining portions of the first semiconductor channel layer 601 and the second semiconductor channel layer 602 in the memory openings 49 constitute vertical semiconductor channels 60. The vertical semiconductor channels 60 can have a doping of the first conductivity type, and can include dopants of the first conductivity type at a dopant concentration in a range from $1.0\times10^{14}/cm^3$ to $1.0\times10^{17}/cm^3$, although lesser and greater dopant concentrations can also be employed. A subset of the vertical semiconductor channels 60 formed in the first memory openings (i.e., the memory openings 49 within the even-numbered string groups) is herein referred to as first vertical semiconductor channels 60A. A subset of the vertical semiconductor channels 60 formed in the second memory openings (i.e., the memory openings 49 within the odd-numbered string groups) is herein referred to as second vertical semiconductor channels 60B. Remaining portions of the first semiconductor channel layer 601 and the second semiconductor channel layer 602 constitute dummy vertical semiconductor channels 60D, which are not electrically biased and function as dummy structures that provide structural support during subsequent processing steps. A combination of a first vertical semiconductor channel 60A and a memory film 50 within a first memory opening is herein referred to as a first memory stack structure 55A. A combination of a second vertical semiconductor channel 60B and a memory film 50 within a second memory opening is herein referred to as a second memory stack structure 55B.

Generally, a combination of a memory film 50 and a vertical semiconductor channel 60 is formed in each of the memory openings 49. A dielectric core material can be deposited and vertically recessed below a top surface of the topmost spacer material layer (such as the topmost sacrificial material layer 42) in the alternating stack (32, 42) to form the lower dielectric cores 62.

Figure 26A:
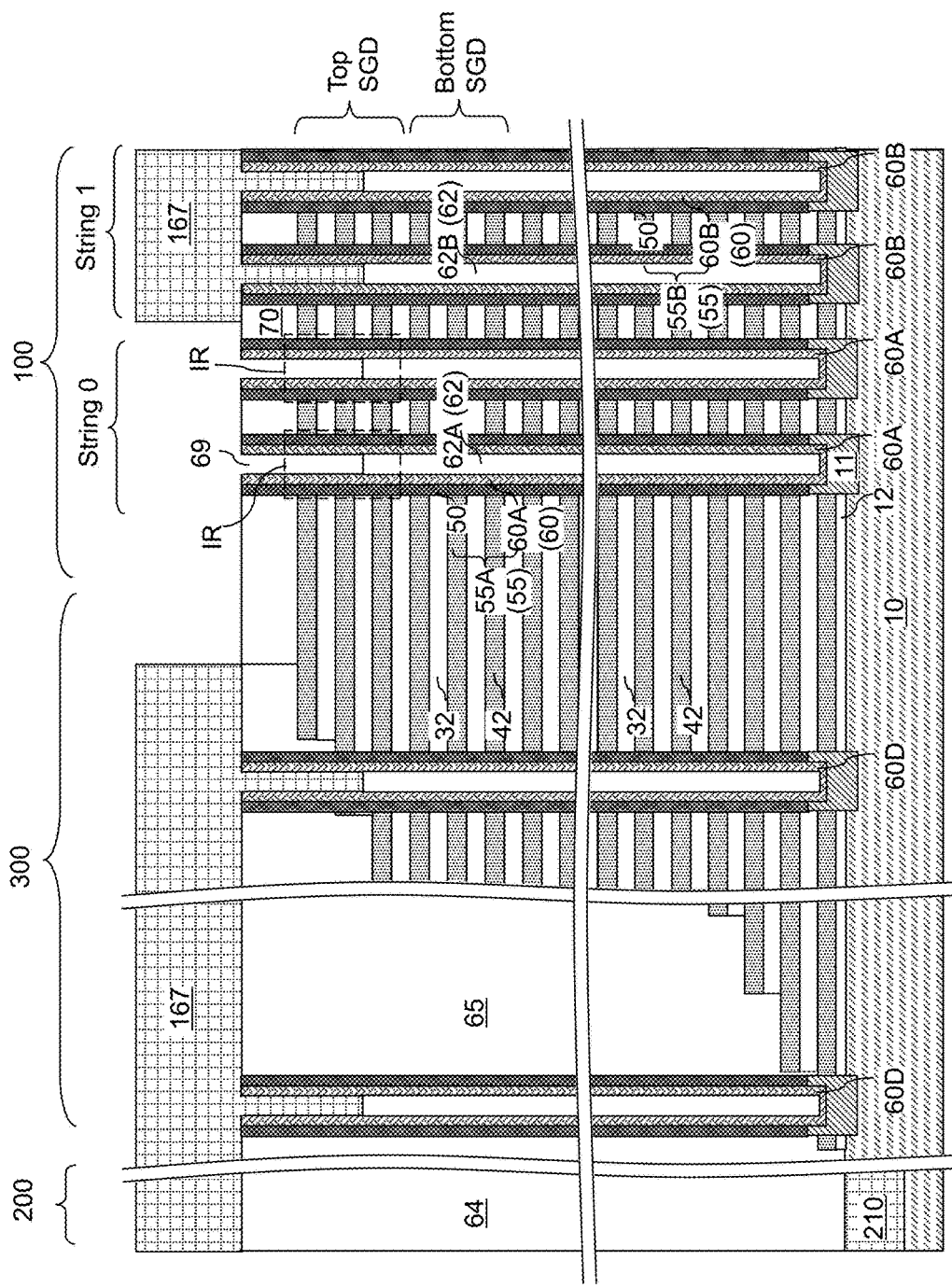
FIG. 26A is a vertical cross-sectional view of the second exemplary structure after ion implantation of electrical dopants into first memory openings according to an embodiment of the present disclosure.
Figure 26B:
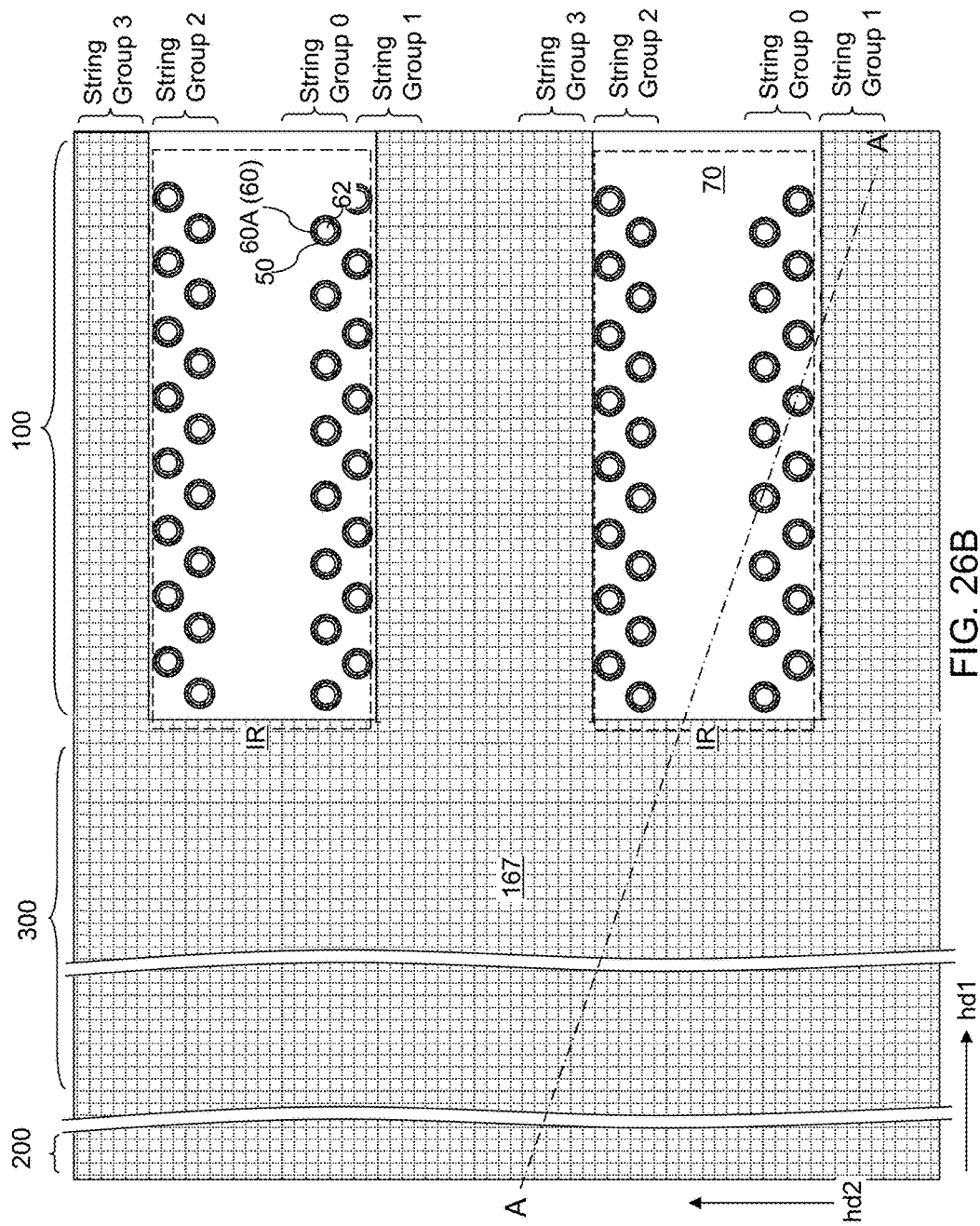
FIG. 26B is a top-down view of the second exemplary structure of FIG. 26A. The vertical plane A-A' is the plane of the vertical cross-sectional view of FIG. 26A.

Referring to FIGS. 26A and 26B, an ion implant mask, such as a photoresist layer 167 can be applied over the insulating cap layer 70 and the retro-stepped dielectric material portion 65, and can be lithographically patterned to form openings in areas of first memory openings 49, i.e., the subset of the memory openings 49 located within the even-numbered string groups. Thus, the areas of the even-numbered string groups are not covered by the patterned photoresist layer 167. Top surfaces of the first vertical semiconductor channels 60A in the first memory openings are physically exposed, and the second vertical semiconductor channels 60B in the second memory openings are covered by the photoresist layer 167. Alternatively, the photoresist layer 167 can cover the first vertical semiconductor channels 60A in the first memory openings, and cover the second vertical semiconductor channels 60B in the second memory openings.

Electrical dopants of the first conductivity type can be implanted into a top portion of each first vertical semiconductor channel 60A in the first memory openings. The species of the electrical dopants of the first conductivity type and the energy of the ion implantation process can be selected such that the implanted top portion of the first vertical semiconductor channels 60A are located at a level of the top group of drain-select-level transistors. The second memory openings are masked with the photoresist layer 167, which functions as an implantation mask. The implanted electrical dopants preferably have the same conductivity type as the semiconductor material of the first and second vertical semiconductor channels (60A, 60B) as initially formed at the processing steps of FIGS. 25A and 25B. For example, if unimplanted regions of the first and second vertical semiconductor channels (60A, 60B) include dopants of the first conductivity type at an average dopant concentration in a range from $1.0 \times 10^{14}/cm^3$ to $1.0 \times 10^{17}/cm^3$, the implanted portions of the first vertical semiconductor channels 60A can include dopants of the first conductivity type at an average dopant concentration in a range from $3.0 \times 10^{16}/cm^3$ to $1.0 \times 10^{18}/cm^3$, although lesser and greater dopant concentrations can also be employed. The region in which the dopants of the first conductivity type are implanted is herein referred to as an implanted region IR. The implanted region IR is located at the levels of the top group of drain-select-level transistors, and does not extend into the levels of the bottom group of drain-select-level transistors.

The implantation energy of the ion implantation process can be selected such that the implanted dopant ions of the first conductivity type are implanted within portions of the first vertical semiconductor channels 60A located at the top group of drain-select-level transistors to be subsequently formed. For example, if the top group of drain-select-level transistors are to be subsequently formed at the levels of the three topmost sacrificial material layers 42, the electrical dopants of the first conductivity type can be implanted above the fourth sacrificial material layer 42 from the top. The height of the top surface of the lower dielectric cores 62 can be located above the fourth sacrificial material layer 42. The energy for ion implantation can be relatively low because the top surfaces of the lower dielectric cores 62 can be recessed close to the bottom end of the levels of the top group of drain-select-level transistors to be subsequently formed. In an illustrative example, if boron is implanted in the ion implantation process, implantation depth in a range from 30 nm to 300 nm can be achieved with ion energy in a range from 10 keV to 100 keV. The nominal implantation angle can be 0 degree, i.e., can be normal to the top surface of the substrate (9, 10). Inherent angular spread of the incoming ion beam during the ion implantation process can provide doping of the portions of the portions of the first vertical semiconductor channels 60A at the levels of the top group of drain-select-level transistors to be subsequently formed (e.g., at the levels of the one, two, three, four, five, or six topmost sacrificial material layers 42 depending on how many of the topmost sacrificial material layers 42 are employed to form the top group of drain-select-level transistors).

The implanted portions of the first vertical semiconductor channels 60A increases the threshold voltage for vertical field effect transistors to be subsequently formed employing the implanted portions of the first vertical semiconductor channels 60A as channels. The electrical dopants of the first conductivity type are implanted into top portions of first lower dielectric cores 62A (which are a subset of the lower dielectric cores 62 that are located in the first memory openings) during implantation of the electrical dopants into the top portions of the first vertical semiconductor channels 60A in the first memory opening. The implanted top portions of the first lower dielectric cores 62A are located at the level of the top group of drain-select-level transistors. In contrast, second lower dielectric cores 62B, which are a subset of the lower dielectric cores 62 located in the second memory openings, are not implanted with the dopants during the ion implantation process. Thus, the threshold voltage for first drain select transistors to be subsequently formed at the implanted level in the first memory openings can be adjusted such that the first drain select transistor has a higher threshold voltage than drain select transistors to be subsequently formed at the same level in the second memory openings. The photoresist layer 167 can be subsequently removed, for example, by ashing.

Figure 27:
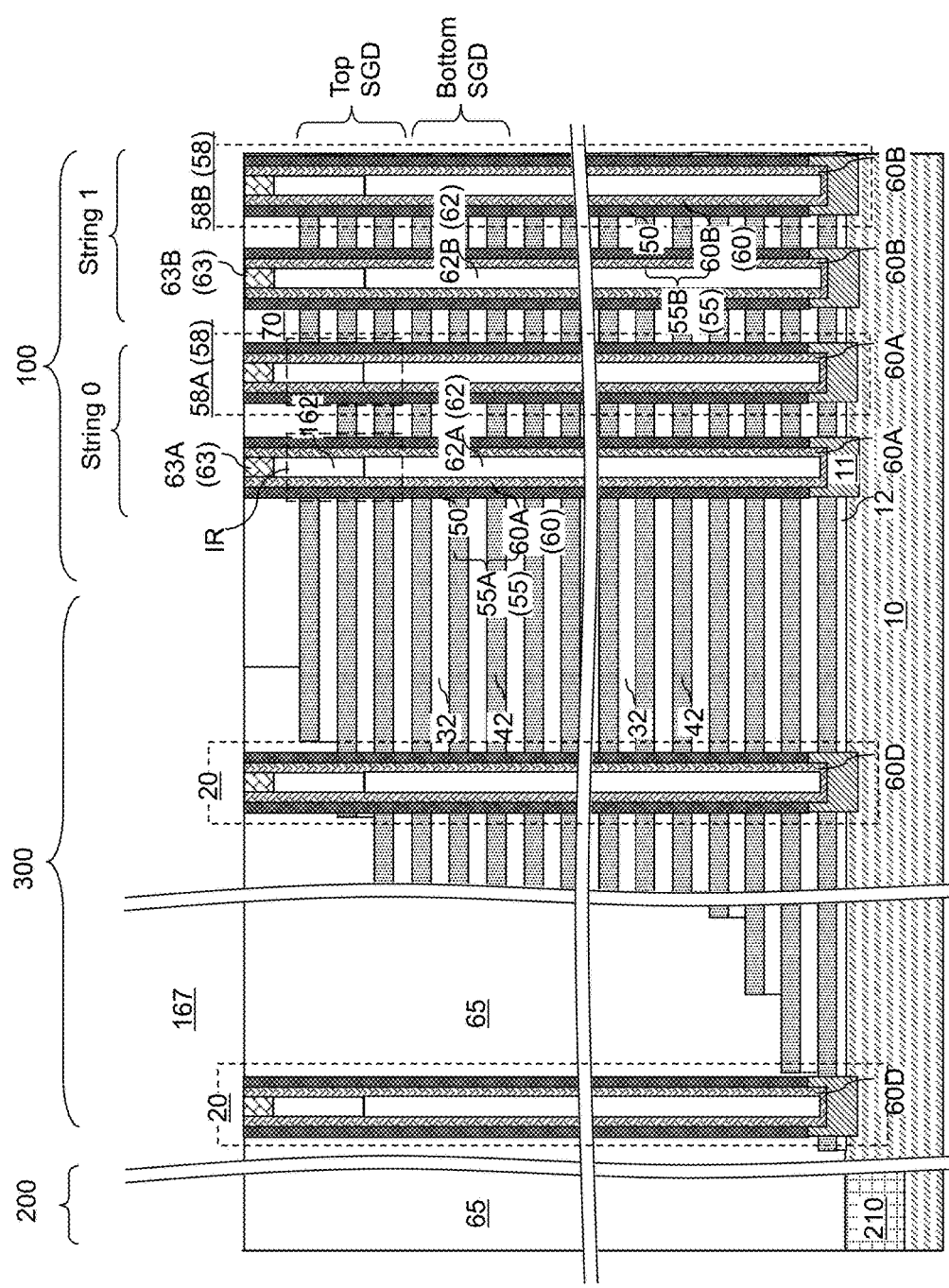
FIG. 27 is a vertical cross-sectional view of the second exemplary structure after formation of upper dielectric cores and drain regions according to an embodiment of the present disclosure.

Referring to FIG. 27, a dielectric material is deposited in the unfilled volumes overlying the lower dielectric cores 62. The deposited dielectric material can be, for example, undoped silicate glass or a doped silicate glass (such as phosphosilicate glass). In case the deposited dielectric material includes a silicate glass, the deposited dielectric material can include a higher hydrogen concentration or a dopant of a second conductivity type that is the opposite of the first conductivity type to provide a higher etch rate than the dielectric material of the insulating cap layer 70 (which can include undoped silicate glass). For example, a low temperature oxide (LTO) can be deposited over the lower dielectric cores 62. A recess etch process can be performed to remove portions of the deposited dielectric material with a higher etch rate than the materials of the insulating cap layer 70 and the retro-stepped dielectric material portion 65. For example, an isotropic etch such as a wet etch employing dilute hydrofluoric acid may be employed. Remaining portions of the recessed dielectric material constitute upper dielectric cores 162. Each memory opening 49 and each support opening 19 can include a vertical stack of a lower dielectric core 62 and an upper dielectric core 162. Each upper dielectric core 162 can be formed on top of a respective one of the lower dielectric cores 62. A top portion of the first lower dielectric cores 62A includes a region doped with dopants of the first conductivity type at a dopant concentration on par with the dopant concentration of the implanted portions of the first vertical semiconductor channels 60A, while the top portion of the second lower dielectric cores 62B does not.

A doped semiconductor material having a doping of the second conductivity type can be deposited in the recessed volumes overlying the upper dielectric cores 162. The top surfaces of the upper dielectric cores 162 can be between the horizontal plane including the top surface of the insulating cap layer 70 and the horizontal plane including the bottom surface of the insulating cap layer 70. Excess portions of the doped semiconductor material can be removed from above the horizontal plane including the top surface of the insulating cap layer 70 by a planarization process, which can be a recess etch process or a chemical mechanical planarization (CMP) process. Remaining portions of the doped semiconductor material constitute drain regions 63. The drain regions 63 include electrical dopants of the second conductivity type (which is the opposite of the first conductivity type) at an atomic concentration in a range form $5.0\times10^{19}/cm^3$ to $1.0\times10^{21}/cm^3$, although lesser and greater dopant concentrations can also be employed. Each of the drain regions 63 is formed on top of a respective one of the upper dielectric cores 162. The drain regions 63 include first drain regions 63A formed in the first memory openings and second drain regions 63B formed in the second memory openings. The drain regions 63 can be doped in-situ during deposition or by ion implantation after deposition, Each memory opening is filled with a respective memory opening fill structure 58, which corresponds to either a first NAND string 58A or a second NAND string 58B. The memory opening fill structure 58 includes an optional pedestal channel portion 11, a memory film 50, a vertical semiconductor channel 60, a lower dielectric core 62, an upper dielectric core 162, and a drain region 63. A set of a contiguous pair of a memory film 50 and a vertical semiconductor channel 60 constitutes a memory stack structure 55, which includes a vertical stack of memory elements therein (such as portions of the charge storage layer 54 located at levels of the sacrificial material layers 42). The memory stack structures 55 comprise first memory stack structures 55A located in the first memory openings and second memory stack structures 55B located in the second memory openings. Each first memory stack structure 55A includes channel portions (e.g., a first vertical semiconductor channel 60A), a blocking dielectric 52, a tunneling dielectric 56, and memory elements (e.g., portions of a charge storage layer 54 located at levels of the sacrificial material layers 42) of first vertical NAND string 58, and each second memory stack structure 55B includes the channel portions, dielectrics, and memory elements of second vertical NAND strings 58B.

Each support opening is filled with a support pillar structure 20, which includes an optional pedestal channel portion 11, a memory film 50, a dummy vertical semiconductor channel 60, a lower dielectric core 62, an upper dielectric core 162, and a drain region 63. The support pillar structures 20 are electrically inactive components. Thus, electrical contacts are not formed on the support pillar structures 20, and the support pillar structures 20 are subsequently employed to provide structural support during subsequent processing steps.

Figure 28A:
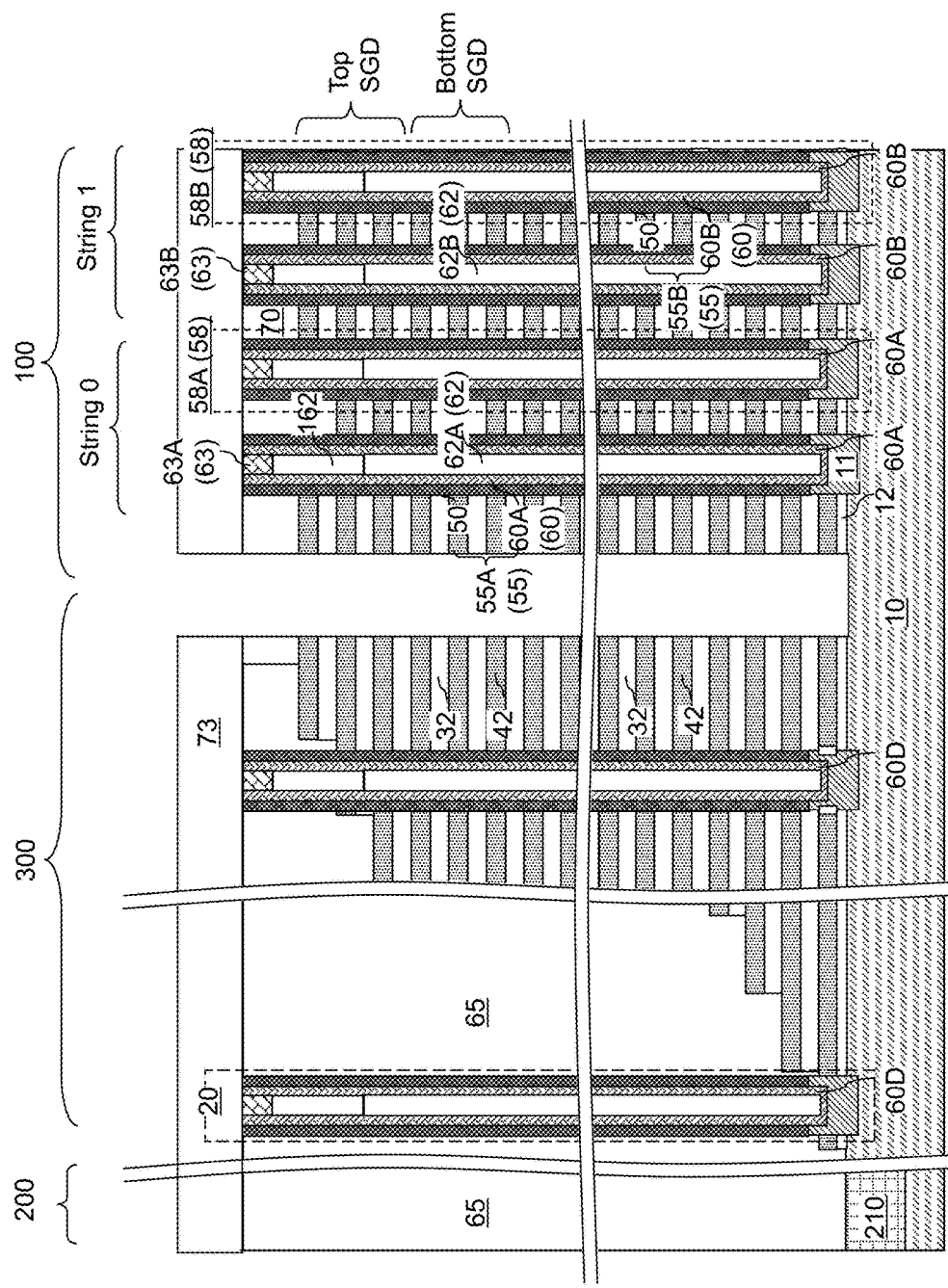
FIG. 28A is a vertical cross-sectional view of the second exemplary structure after formation of backside trenches according to an embodiment of the present disclosure.

Referring to FIGS. 28A and 28B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in space regions SR (shown in FIG. 23B), which are areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. Each backside trench 79 can have a uniform width that is invariant along the lengthwise direction (i.e., along the first horizontal direction hd1). In one embodiment, the backside trenches 79 can include a source contact opening in which a source contact via structure can be subsequently formed.

The backside trenches 79 can include, for example, a first backside trench and a second backside trench that laterally extend along the first horizontal direction hd1 through the alternating stack (32, 42) and laterally spaced apart along the second horizontal direction hd2 such that the first and second backside trenches occupy the volumes of a neighboring pair of spacer regions SR. At least one dielectric isolation structure 72 can be located between, and can be laterally spaced from each of, the first backside trench and the second backside trench. The photoresist layer can be removed, for example, by ashing.

The backside trenches 79 and the dielectric isolation structures 72 laterally divide each layer of the alternating stack (32, 42) at the levels of the drain select gate electrodes. Thus, each patterned portion of the layers of the alternating stack (32, 42) at the levels of the drain select gate electrodes laterally extend along the second horizontal direction hd2 between a neighboring pair of dielectric isolation structures 72 or between a neighboring pair of a backside trench 79 and a dielectric isolation structure 72.

A pair of string groups of memory stack structures 55 can be provided through each patterned strip of sacrificial material layers 42 at the levels of the drain select gate electrodes. Within each string group of memory stack structures 55, the memory stack structures 55 can be arranged in rows that extend along the first horizontal direction hd1. If N dielectric isolation structure(s) 72 is/are provided between a neighboring pair of backside trenches 79, (2N+2) string groups of memory stack structures 55 are provided between the neighboring pair of backside trenches 79. In some embodiments, N is a positive integer. In some embodiment, the dielectric isolation structures 72 may be omitted, and N can be zero.

The backside trenches 79 laterally divide each layer of the alternating stack (32, 42) that underlies the layers of the levels of the drain select gate electrodes. Thus, each patterned portion of the layers of the alternating stack (32, 42) at word line levels (which are located below the levels of the drain select gate electrodes) laterally extend along the second horizontal direction hd2 between a neighboring pair of backside trenches 79.

Figure 29:
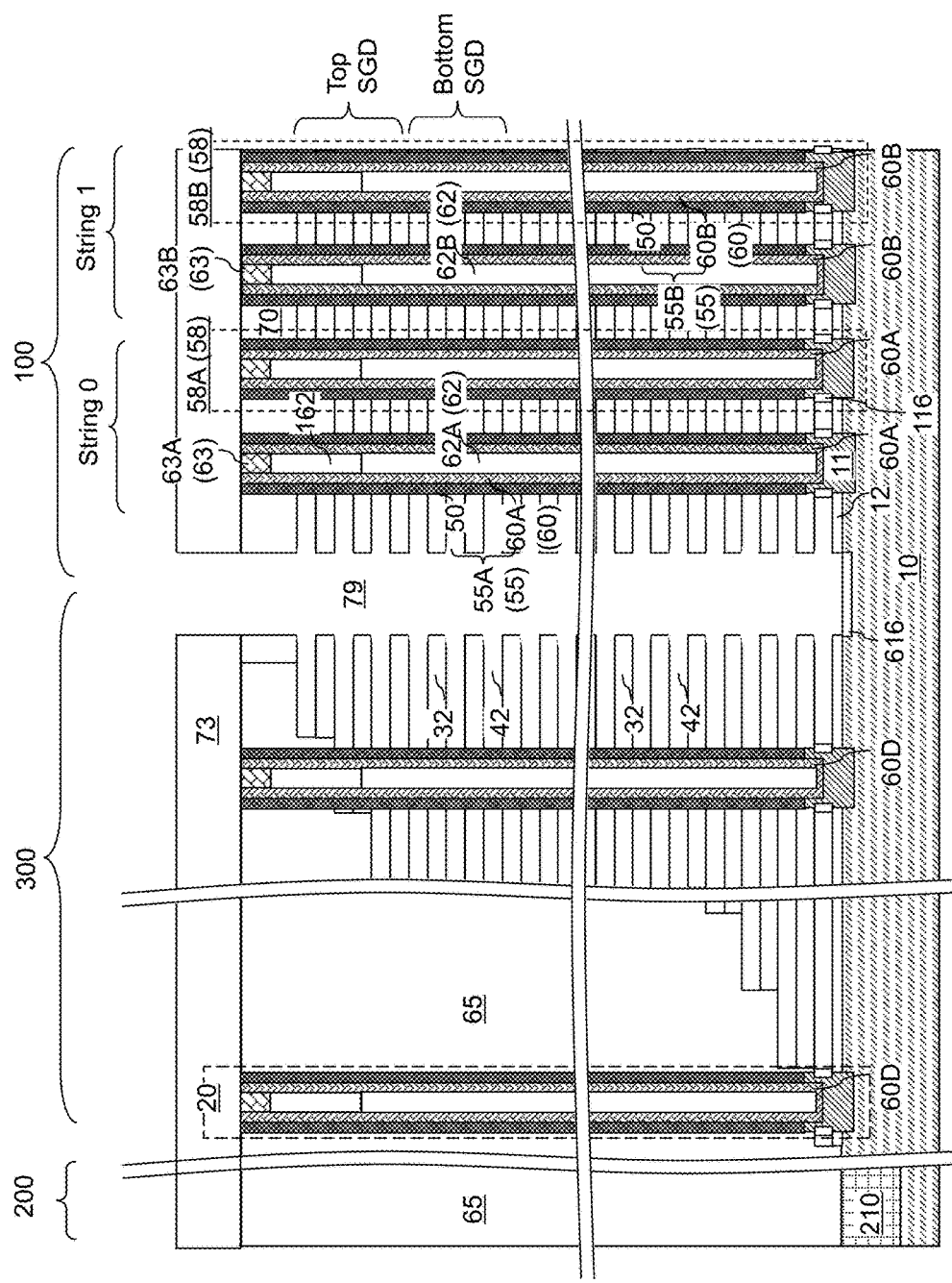
FIG. 29 is a vertical cross-sectional view of the second exemplary structure after formation of backside recesses according to an embodiment of the present disclosure.

Referring to FIG. 29, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus.

The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 30:
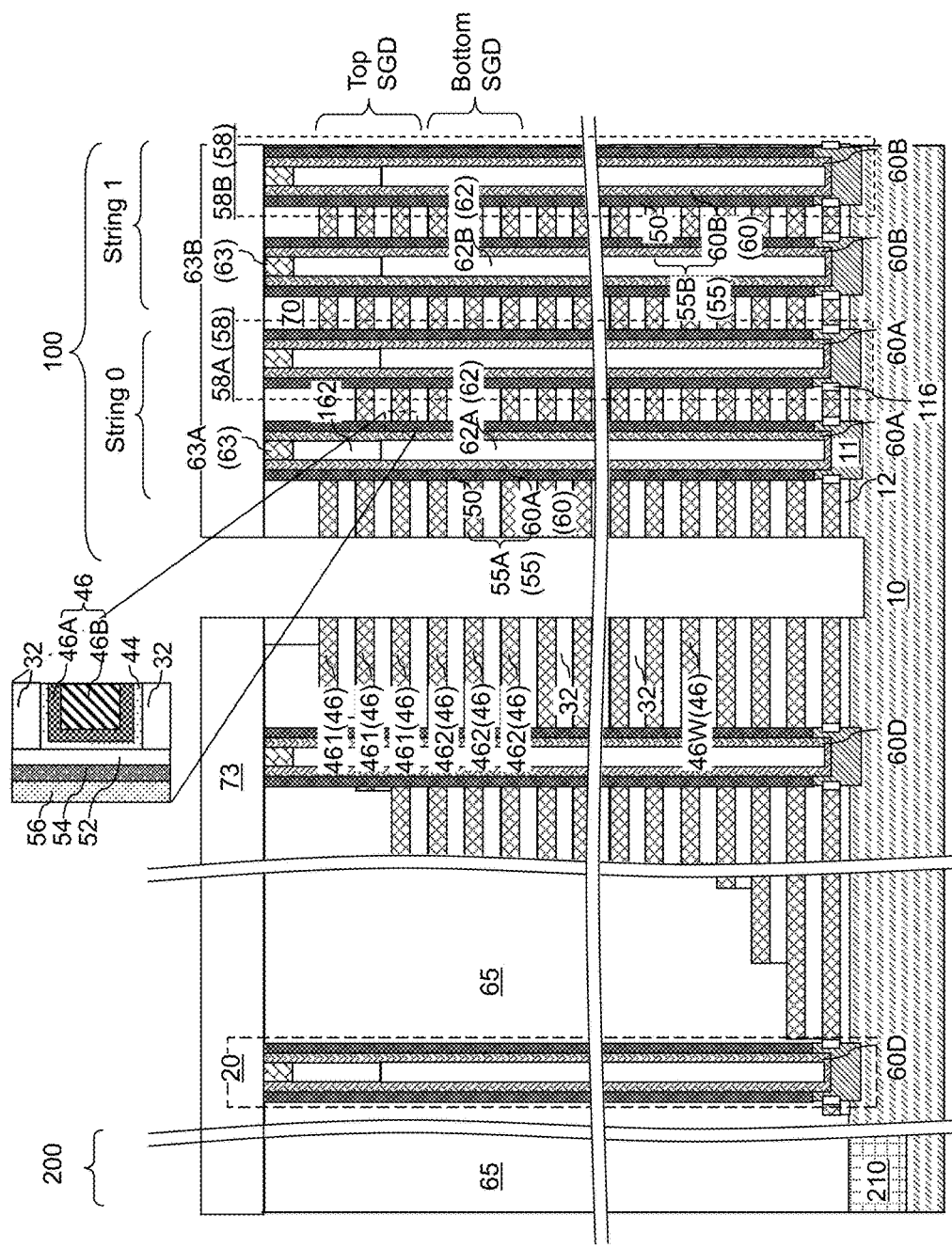
FIG. 30 is a vertical cross-sectional view of the second exemplary structure after formation of electrically conductive layers according to an embodiment of the present disclosure.

Referring to FIG. 30, a backside blocking dielectric layer 44 can be optionally formed in the backside recesses 43. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of each backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity is present within the portion of each backside trench 79 that is not filled with the backside blocking dielectric layer 44.

A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity is present in the portion of each backside trench 79 that is not filled with the backside blocking dielectric layer 44 and the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. The planar dielectric portions 616 can be removed during removal of the continuous electrically conductive material layer. A backside cavity is present within each backside trench 79.

Thus, the sacrificial material layers 42 can be with the electrically conductive layers 46. While the present disclosure is described employing an embodiment in which the spacer material layers are formed as the sacrificial material layers 42, embodiments are expressly contemplated herein in which the spacer material layers are formed as electrically conductive layers 46. In this case, the processing steps of FIGS. 29 and 30 can be omitted.

The electrically conductive layers 46 include at least one first drain-select-level electrically conductive layer 461 that is/are formed at the levels of the top group of drain-select-level transistors, and at least one second drain-select-level electrically conductive layer 462 that is/are formed at the levels of the bottom group of drain-select level transistors. In one embodiment, the at least one first drain-select-level electrically conductive layer 461 can comprise a plurality of first drain-select-level electrically conductive layers that are electrically shorted among one another, or are independently controlled. The at least one second drain-select-level electrically conductive layer 462 can comprise a plurality of second drain-select-level electrically conductive layers that are electrically shorted among one another, or are independently controlled. FIG. 30 illustrates a configuration in which the plurality of first drain-select-level electrically conductive layers 461 include three of first drain-select-level electrically conductive layers 461, and the plurality of second drain-select-level electrically conductive layers 462 include three of second drain-select-level electrically conductive layers 462.

The electrically conductive layers 46 include word line electrically conductive layers 46W located underneath the drain-select-level electrically conductive layers (461, 462). Each word line electrically conductive layer 46W can function as a combination of a plurality of control gate electrodes located at a same level and a word line electrically interconnecting, i.e., electrically shorting, the plurality of control gate electrodes located at the same level. The plurality of control gate electrodes within each word line electrically conductive layer 46W are the control gate electrodes for the vertical memory devices including the memory stack structures 55. In other words, each word line electrically conductive layer 46W can be a word line that functions as a common control gate electrode for the plurality of vertical memory devices.

Figure 31:
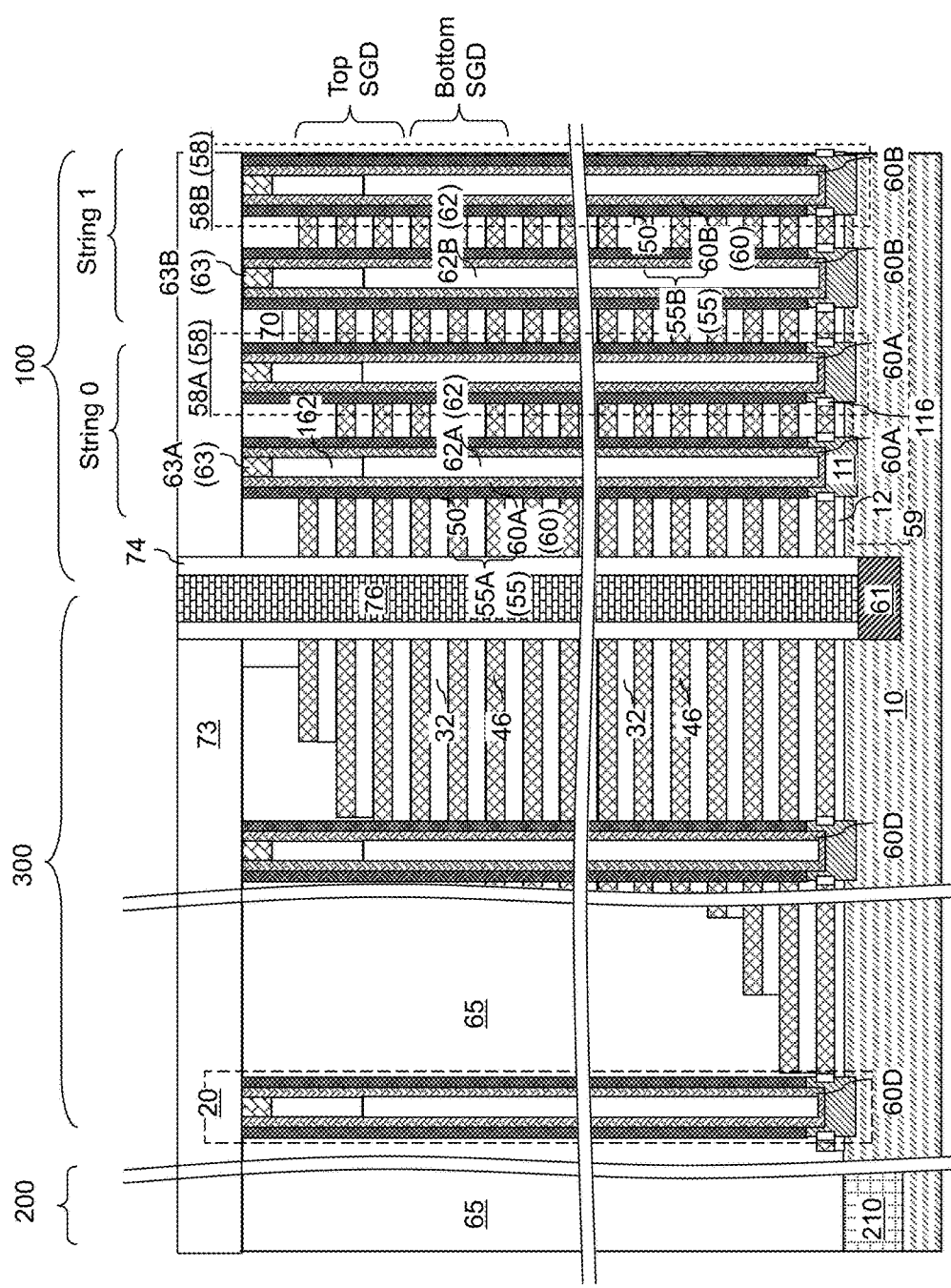
FIG. 31 is a vertical cross-sectional view of the second exemplary structure after formation of source regions, insulating spacers, and backside contact via structures according to an embodiment of the present disclosure.

Referring to FIG. 31, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 32B:
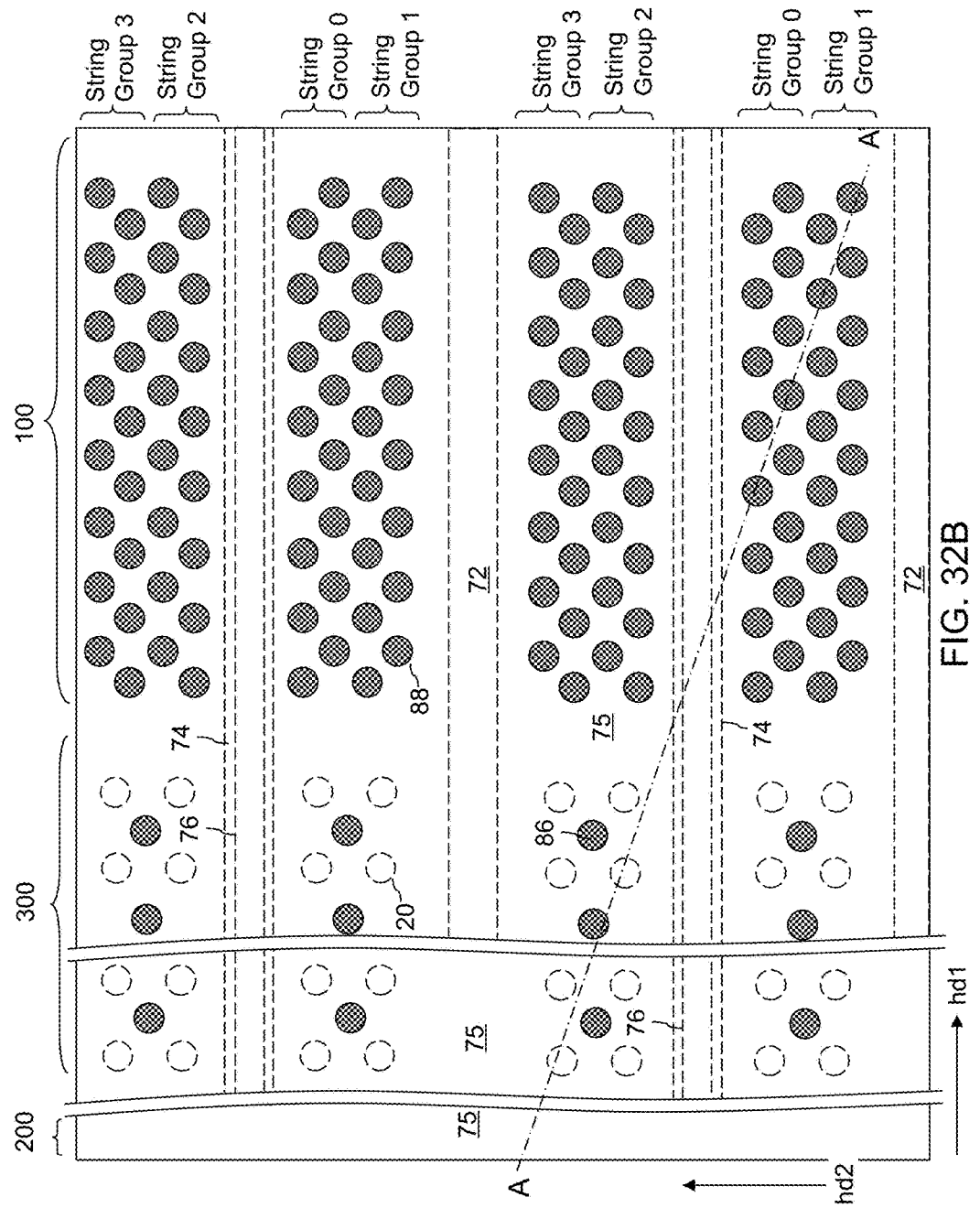
FIG. 32B is a top-down view of the second exemplary structure of FIG. 32A. The vertical plane A-A' is the plane of the vertical cross-sectional view of FIG. 32A.
Figure 32C:
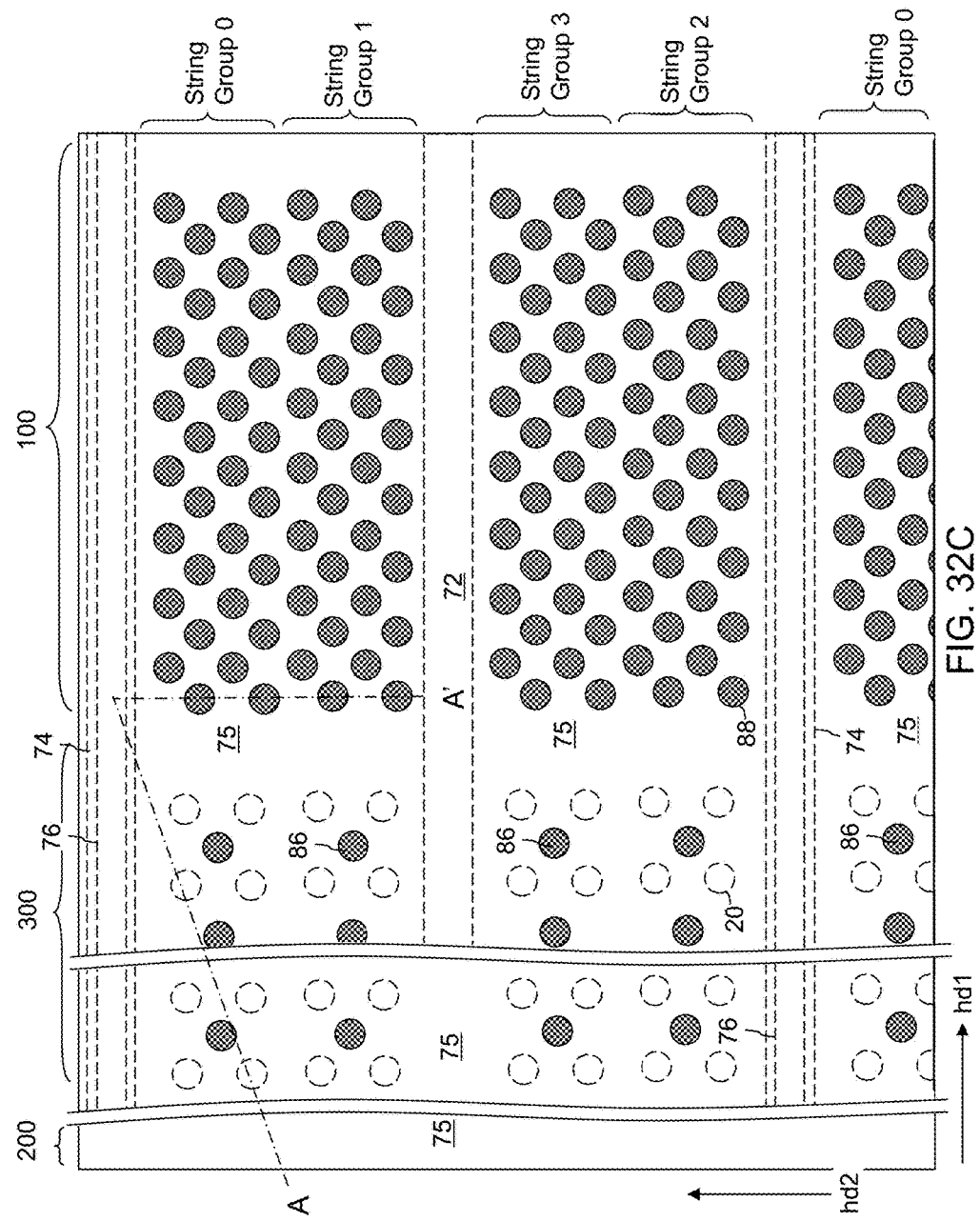
FIG. 32C is a top-down view of an alternative configuration of the second exemplary structure of FIG. 32A. The vertical plane A-A' is the plane of the vertical cross-sectional view of FIG. 32A.

Referring to FIGS. 32A-32C, a via level dielectric layer 75 can be optionally formed over the contact level dielectric layer 73. The via level dielectric layer 75 includes a dielectric material such as silicon oxide, and can have a thickness in a range from 100 nm to 600 nm, although lesser and greater thicknesses can also be employed. Additional contact via structures (88, 86, 8P) can be formed through the via level dielectric layer 75, the contact level dielectric layer 73, and optionally through the retro-stepped dielectric material portion 65. For example, drain contact via structures 88 can be formed through the via level dielectric layer 75 and the contact level dielectric layer 73 on each drain region 63. Layer contact via structures 86 can be formed on the electrically conductive layers 46 through the via level dielectric layer 75 and the contact level dielectric layer 73, and through the retro-stepped dielectric material portion 65. Each electrically conductive layer 46 can be contacted by a respective one of the layer contact via structures 86. Peripheral device contact via structures 8P can be formed through the dielectric material portion 64 or the retro-stepped dielectric material portion 65 directly on respective nodes of the peripheral devices 700.

As discussed above, each string group may include two rows of memory openings, or three or more rows of memory openings 49 that are laterally offset among one another along the second horizontal direction hd2 at the time of formation of the memory openings. Correspondingly, each string group may include two rows of memory stack structures 55, or three or more rows of memory stack structures 55 that are laterally offset among one another along the second horizontal direction hd2 upon formation of the memory stack structures. The total number of rows of memory stack structures 55 (which is the same as the total number of rows of memory opening fill structures 58) per string group depends on the design layout of the memory device. FIG. 32B illustrates an exemplary layout for the case in which the total number of rows of memory stack structures 55 per string group is two. FIG. 32C illustrates an exemplary layout for the case in which the total number of rows of memory stack structures 55 per string group is two. Generally, the ability to subsequently place bit lines extending along the second horizontal direction hd2 with high density may limit the total number of rows of memory stack structures 55 that can be present per string group.

Figure 33A:
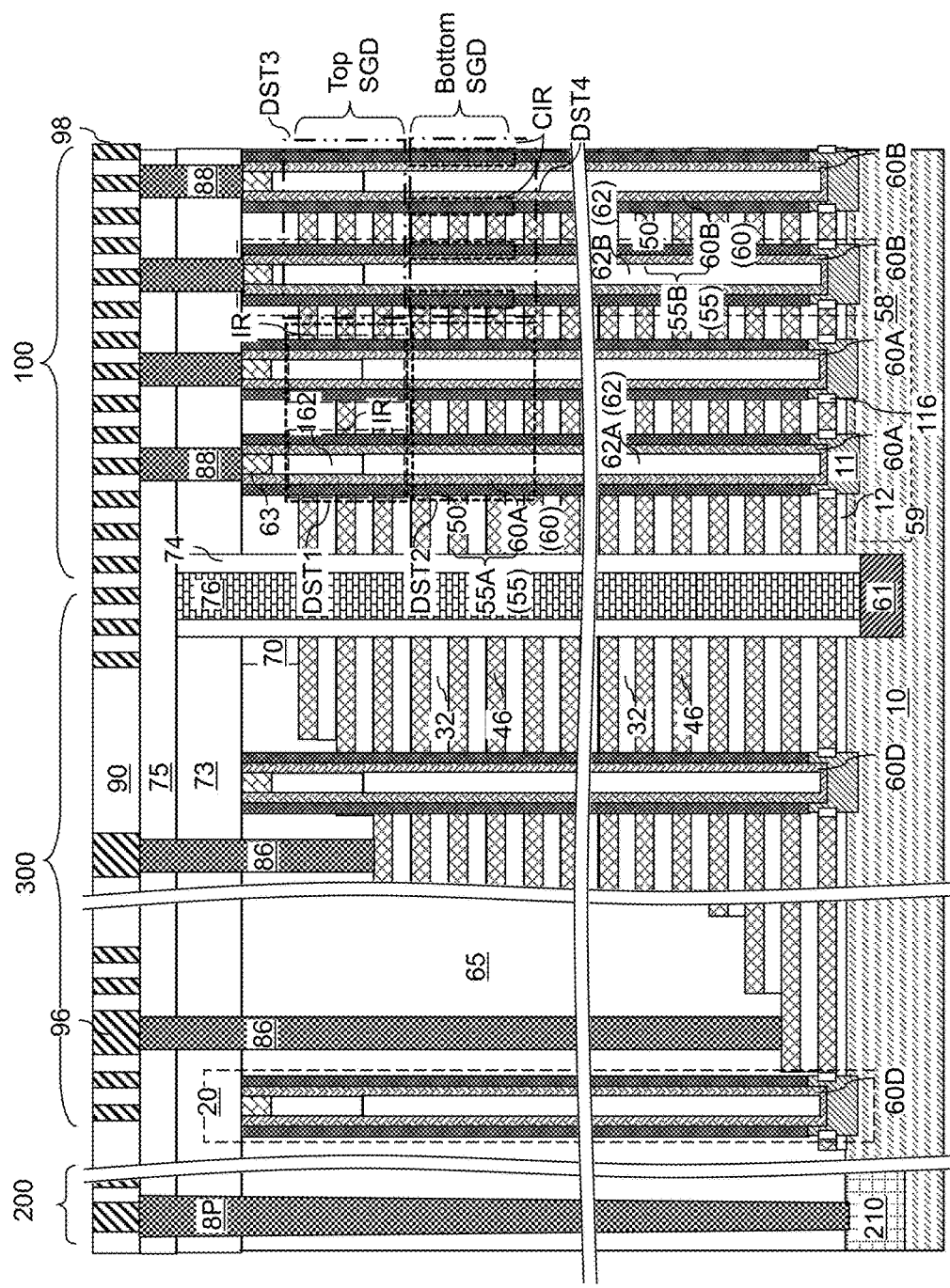
FIG. 33A is a vertical cross-sectional view of the second exemplary structure after formation of bit lines and word line connection line structures according to an embodiment of the present disclosure.
Figure 33B:
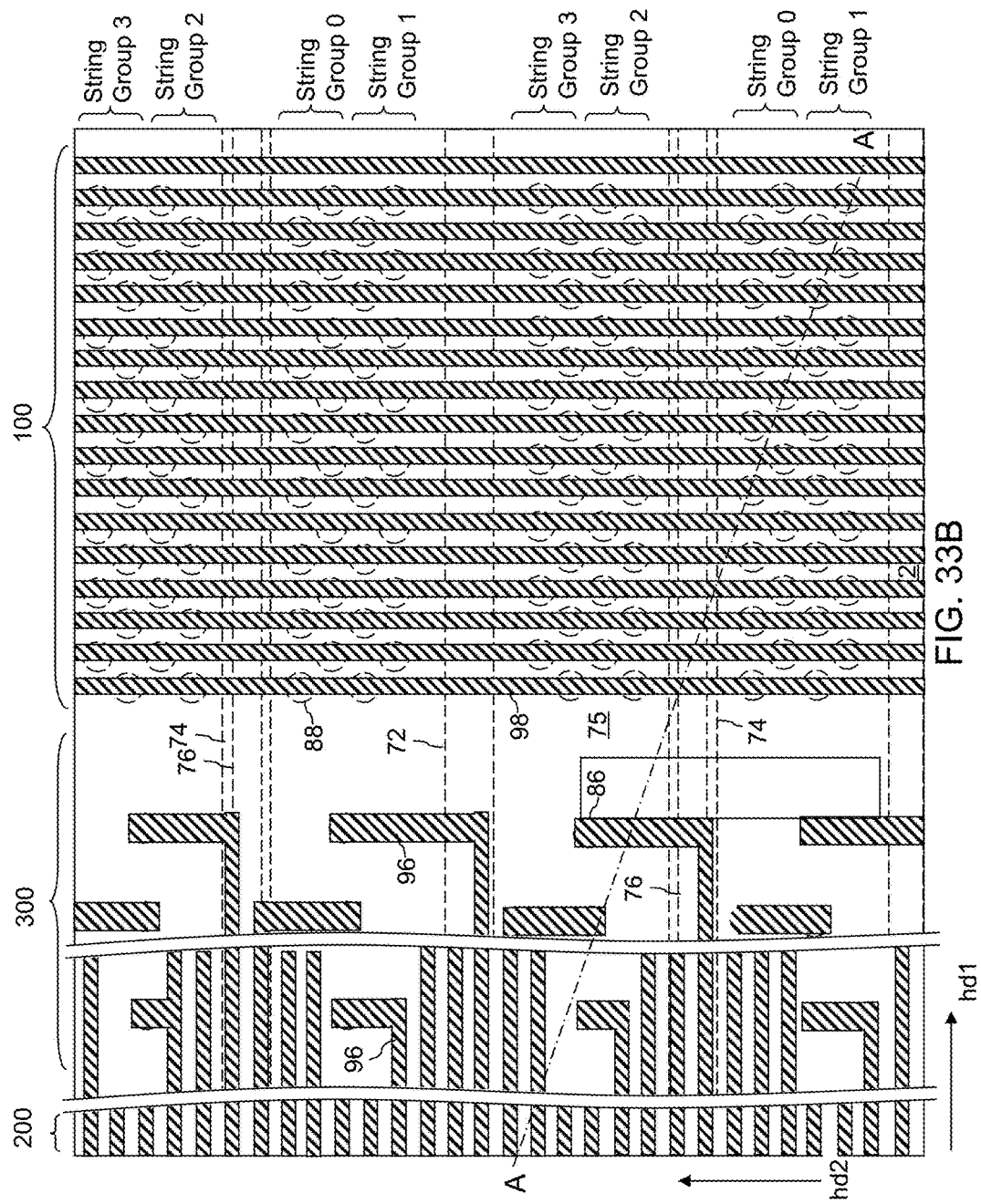
FIG. 33B is a top-down view of the second exemplary structure of FIG. 33A. The vertical plane A-A' is the plane of the vertical cross-sectional view of FIG. 33A.

As shown in FIGS. 33A and 33B, additional dielectric material layers and additional metal interconnect structures, such as bit lines, are subsequently formed. For example, a line level dielectric layer 90 and line level structures (98, 96)

can be formed above the via level dielectric layer 75. The line level structures (98, 96) can include bit lines 98 providing electrical contact to a respective set of drain regions 63, and interconnection line structures 96 that are electrically connected to a respective one of the layer contact via structures 86. In one embodiment, the bit lines 98 can generally extend along the second horizontal direction hd2. In one embodiment, each bit line 98 can be electrically shorted to one drain region 63 per string group. Thus, if N dielectric isolation structures 72 are present between each neighboring pair of backside trenches, a bit line 98 can be electrically shorted to (2N+2) drain regions 63 between the neighboring pair of backside trenches. The (2N+2) drain regions 63 include (N+1) first drain regions 63A and (N+1) second drain regions 63B.

Referring to the circuit schematic of FIG. 21 and all drawings of the second exemplary structure, vertical NAND strings illustrated in FIG. 21 have the same threshold voltages at the bottom group of drain-select-level transistors DST2 and DST4 ("Bot SGD") in the first vertical NAND strings 58A and second vertical NAND strings 58B. The first vertical NAND strings 58A include a respective first memory stack structure 55A, and the second vertical NAND strings 58B include a respective second memory stack structure 55B. The threshold voltages at the bottom group of drain-select-level transistors DST2 and DST4 are the same across the first vertical NAND strings and the second vertical NAND strings upon formation of metal interconnect structures (88, 86, 8P, 98, 96).

The set of all transistors within the level of the top group of drain-select-level transistors ("Top SGD") in each first vertical NAND string functions as a single vertical field effect transistor in a configuration in which a single first drain-select-level electrically conductive layer 461 is provided, or all of multiple first drain-select-level electrically conductive layers 461 are electrically shorted among one another as a single electrical node or are independently controlled. The functional single vertical field effect transistor at the level of the top group of drain-select-level transistors ("Top SGD") in each first vertical NAND string is herein referred to as a first drain select transistor. The set of all transistors within the level of the bottom group of drain-select-level transistors ("Top SGD") in each first vertical NAND string functions as a single vertical field effect transistor in a configuration in which a single second drain-select-level electrically conductive layer 462 is provided, or all of multiple second drain-select-level electrically conductive layers 462 are electrically shorted among one another as a single electrical node or are independently controlled. The functional single vertical field effect transistor at the level of the bottom group of drain-select-level transistors ("Bot SGD") in each first vertical NAND string is herein referred to as a second drain select transistor.

The set of all transistors within the level of the top group of drain-select-level transistors ("Top SGD") in each second vertical NAND string functions as a single vertical field effect transistor in a configuration in which a single first drain-select-level electrically conductive layer 461 is provided, or all of multiple first drain-select-level electrically conductive layers 461 are electrically shorted among one another as a single electrical node or are independently controlled. The functional single vertical field effect transistor at the level of the top group of drain-select-level transistors ("Top SGD") in each second vertical NAND string is herein referred to as a third drain select transistor. The set of all transistors within the level of the bottom group of drain-select-level transistors ("Top SGD") in each second vertical NAND string functions as a single vertical field effect transistor in a configuration in which a single second drain-select-level electrically conductive layer 462 is provided, or all of multiple second drain-select-level electrically conductive layers 462 are electrically shorted among one another as a single electrical node or are independently controlled. The functional single vertical field effect transistor at the level of the bottom group of drain-select-level transistors ("Bot SGD") in each second vertical NAND string is herein referred to as a fourth drain select transistor.

Each channel portion of a first drain select transistor is herein referred to as a first select transistor channel portion, which is a portion of a first vertical semiconductor channel 60A that is implanted with additional electrical dopants of the first conductivity type to provide a higher threshold voltage to the first drain select transistor. Each channel portion of a second drain select transistor is herein referred to as a second select transistor channel portion, which is a portion of a first vertical semiconductor channel 60A that underlies a first select transistor channel portion. Each channel portion of a third drain select transistor is herein referred to as a third select transistor channel portion, which is a portion of a second vertical semiconductor channel 60B. Each channel portion of a fourth drain select transistor is herein referred to as a fourth select transistor channel portion, which is a portion of a second vertical semiconductor channel 60B that underlies a third select transistor channel portion.

The first vertical NAND strings and the second vertical NAND strings are formed through an alternating stack of insulating layers 32 and electrically conductive layers 46. As shown in FIGS. 21 and 33A, each first vertical NAND string 58A comprises a first drain region 63A and first memory cell first charge storage transistors 59A in a series connection with a first drain select transistor DST1 and a second drain select transistor DST2. Each second vertical NAND string 58B comprises a second drain region 63B and second memory cell charge storage transistors 59B in a series connection with a third drain select transistor DST3 and a fourth drain select transistor DST4.

At least one first drain-select-level electrically conductive layer 461 among the electrically conductive layers 46 is formed as a common gate electrode for the first drain select transistor and the third drain select transistor. At least one second drain-select-level electrically conductive layer 462 among the electrically conductive layers 46 is formed as a common gate electrode for the second drain select transistor and the fourth drain select transistor.

Each electrically conductive layer 46 other than the at least one first drain-select-level electrically conductive layer 461 and the at least one second drain-select-level electrically conductive layer 462, such as the word line electrically conductive layers 46W, laterally extends along the first horizontal direction hd1 that is perpendicular to the second horizontal direction hd2 between, and is laterally bounded by, the first backside trench and the second backside trench, which are a neighboring pair of backside trenches 79. Each of the at least one first drain-select-level electrically conductive layer 461 and the at least one second drain-select-level electrically conductive layer 462 laterally extends along the first horizontal direction hd1 between, and is laterally bounded by, the first backside trench 79 and a dielectric isolation structure 72.

A bit line 98 can be electrically connected to a first drain region 63A and a second drain region 63B of a pair of first vertical NAND string and a second vertical NAND string. Formation of metal interconnect structures enables application electrical biases to the electrodes of the first, second, third, and fourth drain select transistors (i.e., the at least one first drain-select-level electrically conductive layer 461 and the at least one second drain-select-level electrically conductive layer 462). The threshold voltage for each fourth drain select transistor can be adjusted such that the fourth drain select transistor has a higher threshold voltage than the third drain select transistor.

Selective injection of electrical charges can be effected by setting the electrical bias voltage to each of the at least one first drain-select-level electrically conductive layer 461 between the low threshold voltage for the third drain select transistors and the high threshold voltage for the first drain select transistors. In this case, the first NAND strings are turned off because the electrical bias voltage (which may be in a range from 1 V to 3 V) to each of the at least one first drain-select-level electrically conductive layer 461 is lower than the threshold voltage (which may be in a range from 3 V to 5 V) required to turn on the first drain select transistors. However, the second NAND strings are turned on under such a bias condition because the third drain select transistor has a lower threshold voltage (which may be in a range from 0 V to 1V) than the electrical bias voltage to the at least one first drain-select-level electrically conductive layer 461. In case the at least one first drain-select-level electrically conductive layer 461 includes multiple first drain-select-level electrically conductive layer 461, the same electrical bias voltage may be applied to each of the multiple first drain-select-level electrically conductive layer 461. Upon application of a programming voltage to the second drain-select-level electrically conductive layer 462, electrical charges can tunnel from the fourth select transistor channel portions into surrounding portions of the memory films 50, e.g., through neighboring tunneling dielectrics 56 into portions of charge storage layers 54.

The electrical charges injected into the portions of the memory films 50 laterally surrounding the fourth drain select transistor channel portions increase the threshold voltage of the fourth drain select transistors by at least 1.0 V. The portions of the memory films 50 into which the electrical charges are injected are herein referred to as charge injection region CIR, which is illustrated in FIG. 33A. The feature of differential threshold voltages at the bottom group of drain-select-level transistors DST2 and DST4 ("Bot SGD") between first vertical NAND strings and second vertical NAND strings, illustrated in FIG. 21, is thus provided through selective charge injection into the memory film portions of the fourth drain select transistors DST4 without injecting electrical charges into any memory film portions of the third drain select transistors DST3.

Figure 34B:
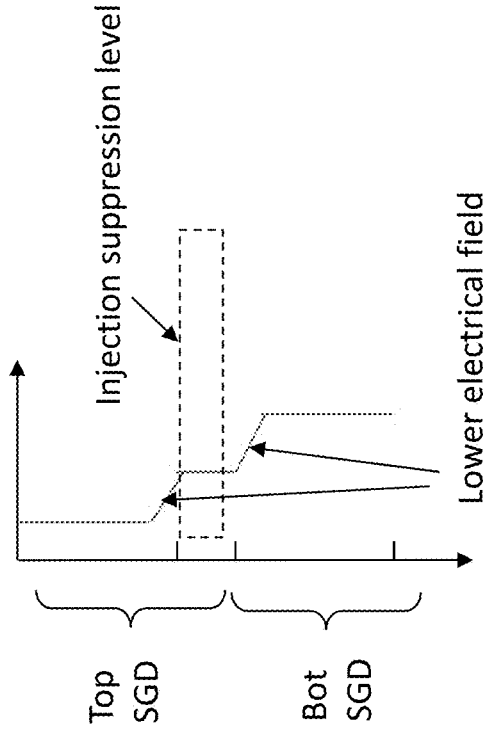
FIG. 34B is a schematic diagram illustrating a first select gate biasing scheme for injecting charges to portions of a charge storage layer at levels of the bottom select gate electrodes according to an embodiment of the present disclosure.
Figure 34A:
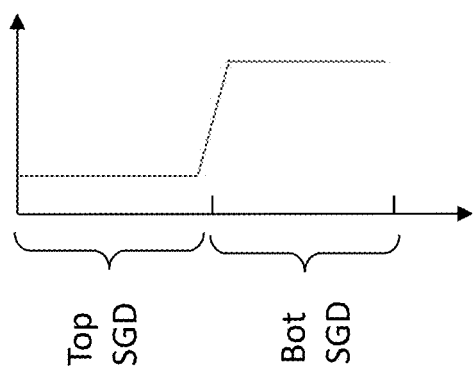
FIG. 34A is a schematic diagram illustrating a first select gate biasing scheme for injecting charges to portions of a charge storage layer at levels of the bottom select gate electrodes according to an embodiment of the present disclosure.

Referring to FIGS. 34A and 34B, a scheme to reduce collateral charge injection into portions of the first vertical NAND strings during charge injection into the memory films 50 of the second vertical NAND strings at the level of the bottom group of drain-select-level transistors ("Bot SGD"). When a programming voltage is applied to each of the at least one second drain-select-level electrically conductive layers 462 (which may be multiple second drain-select-level electrically conductive layers 462) and a bias voltage between the high threshold voltage of the first drain select transistors and the low threshold voltage of the second drain select transistors is applied to each of the at least one first drain-select-level electrically conductive layers 461 as illustrated in FIG. 34A, a large potential difference develops within the portion of each first vertical semiconductor channel 60A located at the boundary between the top drain select level (the "Top SGD" level) and the bottom drain select level (the "Bot SGD" level) as illustrated in FIG. 34A. A high electrical field due to the large potential difference over a short distance can induce collateral charge injection into neighboring portions of the memory films 50 around the first vertical NAND strings.

Referring to FIG. 34B, in case the at least one first drain-select-level electrically conductive layer 461 includes multiple first drain-select-level electrically conductive layer 461, the level of the bottommost electrically conductive layer among the multiple first drain-select-level electrically conductive layer 461 may be turned on for both the first and second vertical NAND strings. For example, the bottommost electrically conductive layer among the multiple first drain-select-level electrically conductive layer 461 may be electrically biased with a higher voltage than the overlying layers among the multiple first drain-select-level electrically conductive layer 461. Alternatively, the vertical extent of dopant implantation at the processing steps of FIGS. 26A and 26B can be limited such that the implanted dopants do not reach the portion of each first vertical semiconductor channel 60A located at the level of the bottommost electrically conductive layer among the multiple first drain-select-level electrically conductive layer 461. Yet alternatively, the vertical doping profile formed by dopant implantation at the processing steps of FIGS. 26A and 26B provides less electrical dopants in the portion of each first vertical semiconductor channel 60A located at the level of the bottommost electrically conductive layer among the multiple first drain-select-level electrically conductive layer 461. In such case, the electrical field around the portion of each first vertical semiconductor channel 60A at the level of the bottommost electrically conductive layer among the multiple first drain-select-level electrically conductive layer 461 can be lower in the configuration of FIG. 34B than in the configuration of FIG. 34A, and collateral charge tunneling in the first vertical NAND strings can be suppressed.

In the configuration of FIG. 34B, the bottommost electrically conductive layer among the multiple first drain-select-level electrically conductive layer 461 may be insufficient to turn off the first vertical semiconductor channels 60A. Turning off of the first vertical semiconductor channels 60A is achieved by the overlying electrically conductive layers among the multiple first drain-select-level electrically conductive layer 461. As such, the bottommost electrically conductive layer among the multiple first drain-select-level electrically conductive layer 461 functions as a dummy gate electrode during charge injection that programs the bottom drain select levels of the second vertical NAND strings. The total number of the multiple first drain-select-level electrically conductive layers 461 may be increased to add the ability to alter the bias voltage for the bottommost electrically conductive layer among the multiple first drain-select-level electrically conductive layer 461. For example, four first drain-select-level electrically conductive layers 461 may be employed in lieu of three first drain-select-level electrically conductive layers 461.

In case the configuration illustrated in FIG. 34B is employed, the at least one first drain-select-level electrically conductive layer 461 comprises multiple first drain-select-level electrically conductive layers 461. The first drain select transistor comprises a series connection of multiple component field effect transistors located at the levels of the multiple first drain-select-level electrically conductive layers 461. Each of the multiple component field effect transistors other than a bottommost one of the multiple component field effect transistors has a higher threshold voltage than the bottommost one of the multiple component field effect transistors. In this case, the third drain select transistor can comprise another series of multiple component field effect transistors having the same threshold voltage as, or having lower threshold voltages than, the bottommost one of the multiple component field effect transistors of the first drain select transistor.

The various embodiments of the present disclosure provide a memory device, which comprises: an alternating stack of insulating layers 32 and electrically conductive layers 46 located over a substrate (9, 10); a first vertical NAND string 58A extending through the alternating stack (32, 46), the first vertical NAND string 58A (e.g., a vertical NAND string within the "String0" group in FIG. 21) comprising a first drain region 63A and first memory cell charge storage transistors 59A (located at the word line "WL" level) in a series connection with a first drain select transistor DST1 (located in the "Top SGD" level) and a second drain select transistor DST2 (located in the "Bot SGD" level); a second vertical NAND string 58B (e.g., a vertical NAND string within the "String1" group in FIG. 21) extending through the alternating stack (32, 46), the second vertical NAND string 58B comprising a second drain region 63B and second memory cell charge storage transistors 59B (located at the word line "WL" level) in a series connection with a third drain select transistor DST3 (located in the "Top SGD" level) and a fourth drain select transistor DST4 (located in the "Bot SGD" level); and a common bit line 98 (such as a bit line labeled "BL0" or "BL3") electrically connected (i.e., electrically shorted) to the first and the second drain regions (63A, 63B). At least one first drain-select-level electrically conductive layer 461 among the electrically conductive layers 46 is a common gate electrode for the first drain select transistor DST1 and the third drain select transistor DST3, and at least one second drain-select-level electrically conductive layer 462 among the electrically conductive layers 46 is a common gate electrode for the second drain select transistor DST2 and the fourth drain select transistor DST4. The first drain select transistor DST1 has a higher threshold voltage than the third drain select transistor DST3 (due to implanted dopants), and the fourth drain select transistor DST4 has a higher threshold voltage than the third drain select transistor DST3 (due to trapped electrical charges).

In an embodiment in which plurality of transistors share a common gate electrode, the transistors effectively function as a single transistor. In one embodiment, the first, second, third, and fourth drain select transistors comprise first, second, third, and fourth drain select transistor channel portions, respectively. The first and second drain select transistor channel portions are portions of a first vertical semiconductor channel 60A within the first vertical NAND string 58A. The third and fourth drain select transistor channel portions are portions of a second vertical semiconductor channel 60B within the second vertical NAND string 58B. The second drain select transistor channel portion has a same dopant concentration as the fourth drain select transistor channel portion. In one embodiment, the first drain select transistor channel portion has a higher dopant concentration than the second and third drain select transistor channel portions.

In one embodiment, the first drain select transistor DST1 is more proximal to the first drain region 63A than the second drain select transistor DST2 is to the first drain region 63A. The third drain select transistor DST3 is more proximal to the second drain region 63B than the fourth drain select transistor DST4 is to the second drain region 63B. The first drain region 63A and the second drain region 63B have a doping of an opposite conductivity type than the first, second, third, and fourth drain select transistor channel portions.

In one embodiment, the first vertical NAND string 58A comprises a first memory stack structure 55A and the second vertical NAND string 58B comprises a second memory stack structure 55B; the first memory stack structure 55A comprises a first memory film 50 vertically extending through each electrically conductive layer 46 in the alternating stack (32, 46) except at least one lower electrically conductive layer (e.g., source select gate electrode(s)) 46 of the alternating stack, and the second memory stack structure 55B comprises a second memory film 50 vertically extending through each electrically conductive layer 46 in the alternating stack except at least one lower electrically conductive layer 46 of the alternating stack (32, 46).

In one embodiment, a portion of the second memory film 50 laterally surrounded by a gate electrode 462 of the fourth drain select transistor DST4 includes trapped electrical charges at a concentration that raises a threshold voltage of the fourth drain select transistor by at least 1.0 V relative the threshold voltage of the third drain select field effect transistor DST3. A portion of the first memory film 50 laterally surrounded by a gate electrode 462 of the second drain select transistor DST4 is substantially free of trapped electrical charges.

In one embodiment, the memory device can include a first dielectric core stack (62A, 162) comprising a first lower dielectric core 62A and a first upper dielectric core 162 that are laterally surrounded by the first memory stack structure 55A and a second dielectric core stack (62B, 162) comprising a second lower dielectric core 62B and a second upper dielectric core 162 that are laterally surrounded by the second memory stack structure 55B. An upper region of the first lower dielectric core 62A is doped with electrical dopants of a first conductivity type, and the first upper dielectric core 162, the second upper dielectric core 162, and the second lower dielectric core 62B are substantially free of electrical dopants.

In one embodiment, a lower region of the first lower dielectric core 62A is substantially free of electrical dopants; and an interface between the first lower dielectric core 62A and the first upper dielectric core 162 is laterally surrounded by a first drain select transistor channel portion that is a channel portion of the first drain select transistor. Portions of the memory films 50 proximal to the vertical semiconductor channels 60 are collaterally implanted during implantation of upper portions of the first vertical semiconductor channels 60A. In one embodiment, the first drain select transistor channel portion and a portion of the first memory film 50 that laterally surrounds the first drain select transistor channel portion include a same species of electrical dopants as the upper region of the first lower dielectric core 62A at an average dopant concentration that is in a range from ⅕ of a peak dopant concentration in the upper region of the first lower dielectric core 62A and twice the peak dopant concentration in the upper region of the first lower dielectric core 62A.

In one embodiment, the at least one first drain-select-level electrically conductive layer 461 comprises a plurality of first drain-select-level electrically conductive layers 461 that are electrically shorted among one another or are independently controlled, and the at least one second drain-select-level electrically conductive layer 462 comprises a plurality of second drain-select-level electrically conductive layers 462 that are electrically shorted among one another or are independently controlled.

In one embodiment, each layer within the alternating stack (32, 46) extends along a first horizontal direction hd1, each electrically conductive layer 46 other than the at least one first drain-select-level electrically conductive layer 461 and the at least one second drain-select-level electrically conductive layer 462 laterally extends along the first horizontal direction hd1 between, and is laterally bounded by, a first backside trench and a second backside trench that laterally extend along the first horizontal direction hd1.

In one embodiment, the memory device comprises a vertical NAND device located over the substrate (9, 10); the electrically conductive layers 46 comprise, or are electrically connected to, a respective word line of the NAND device; the substrate (9, 10) comprises a silicon substrate; and the vertical NAND device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings. The silicon substrate contains an integrated circuit comprising a driver circuit for the memory device located thereon; and the array of monolithic three-dimensional NAND strings comprises: a plurality of semiconductor channels (59, 11, 60), wherein at least one end portion of each of the plurality of semiconductor channels (59, 11, 60) extends substantially perpendicular to a top surface of the substrate (9, 10); a plurality of charge storage elements, each charge storage element located adjacent to a respective one of the plurality of semiconductor channels (59, 11, 60); and a plurality of control gate electrodes (as embodied as patterned portions of the word line electrically conductive layers 46W) having a strip shape extending substantially parallel to the top surface of the substrate (9, 10), the plurality of control gate electrodes comprising at least a first control gate electrode located in the first device level and a second control gate electrode located in the second device level.

The memory device of the embodiments of the present disclosure can provide selection of vertical NAND strings connected to a same bit line 98 and controlled by a same set of first drain-select-level electrically conductive layers 461 and second drain-select-level electrically conducive layers 462 by a combination of threshold voltage differentials provided at two different drain select levels. The threshold voltage differential at a top drain select level is provided by selective ion implantation of electrical dopants of the first conductivity type. The threshold voltage differential at a bottom drain select level is provided by selective charge injection. High energy implantation of electrical dopants directly into the bottom drain select level can be avoided by utilizing selective charge injection.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
an alternating stack of insulating layers and electrically conductive layers located over a substrate;
a first vertical NAND string extending through the alternating stack, the first vertical NAND string comprising a first drain region and first memory cell charge storage transistors in a series connection with a first drain select transistor and a second drain select transistor;
a second vertical NAND string extending through the alternating stack, the second vertical NAND string comprising a second drain region and second memory cell charge storage transistors in a series connection with a third drain select transistor and a fourth drain select transistor; and
a common bit line electrically connected to the first and the second drain regions, wherein:
at least one first drain-select-level electrically conductive layer among the electrically conductive layers is a common gate electrode for the first drain select transistor and the third drain select transistor;
at least one second drain-select-level electrically conductive layer among the electrically conductive layers is a common gate electrode for the second drain select transistor and the fourth drain select transistor;
the first drain select transistor has a higher threshold voltage than the third drain select transistor; and
the fourth drain select transistor has a higher threshold voltage than the third drain select transistor.

2. The memory device of claim 1, wherein:
the first, second, third, and fourth drain select transistors comprise first, second, third, and fourth drain select transistor channel portions, respectively; and
the second drain select transistor channel portion has a same dopant concentration as the fourth drain select transistor channel portion.

3. The memory device of claim 2, wherein the first drain select transistor channel portion has a higher dopant concentration than the second and third drain select transistor channel portions.

4. The memory device of claim 3, wherein:
the first drain select transistor is more proximal to the first drain region than the second drain select transistor is to the first drain region; and
the third drain select transistor is more proximal to the second drain region than the fourth drain select transistor is to the second drain region.

5. The memory device of claim 3, wherein the first drain region and the second drain region have a doping of an opposite conductivity type than the first, second, third, and fourth drain select transistor channel portions.

6. The memory device of claim 1, wherein:
the first vertical NAND string comprises a first memory stack structure and the second vertical NAND string comprises a second memory stack structure;
the first memory stack structure comprises a first memory film vertically extending through each electrically conductive layer in the alternating stack except at least one lower electrically conductive layer of the alternating stack; and
the second memory stack structure comprises a second memory film vertically extending through each electrically conductive layer in the alternating stack except at least one lower electrically conductive layer of the alternating stack.

7. The memory device of claim 6, wherein:
a portion of the second memory film laterally surrounded by a gate electrode of the fourth drain select transistor includes trapped electrical charges at a concentration that raises a threshold voltage of the fourth drain select transistor by at least 1.0 V relative a threshold voltage of the third drain select transistor; and
a portion of the first memory film laterally surrounded by a gate electrode of the second drain select transistor is substantially free of trapped electrical charges.

8. The memory device of claim 6, further comprising:
a first dielectric core stack comprising a first lower dielectric core and a first upper dielectric core that are laterally surrounded by the first memory stack structure; and
a second dielectric core stack comprising a second lower dielectric core and a second upper dielectric core that are laterally surrounded by the second memory stack structure;
wherein:
an upper region of the first lower dielectric core is doped with electrical dopants; and
the first upper dielectric core, the second upper dielectric core, and the second lower dielectric core are substantially free of electrical dopants.

9. The memory device of claim 8, wherein:
a lower region of the first lower dielectric core is substantially free of electrical dopants; and
an interface between the first lower dielectric core and the first upper dielectric core is laterally surrounded by a first drain select transistor channel portion that is a channel portion of the first drain select transistor.

10. The memory device of claim 8, wherein the first drain select transistor channel portion and a portion of the first memory film that laterally surrounds the first drain select transistor channel portion include a same species of electrical dopants as the upper region of the first lower dielectric core at an average dopant concentration that is in a range from ⅕ of a peak dopant concentration in the upper region of the first lower dielectric core and twice the peak dopant concentration in the upper region of the first lower dielectric core.

11. The memory device of claim 1, wherein:
the at least one first drain-select-level electrically conductive layer comprises a plurality of first drain-select-level electrically conductive layers that are electrically shorted among one another; and
the at least one second drain-select-level electrically conductive layer comprises a plurality of second drain-select-level electrically conductive layers that are electrically shorted among one another.

12. The memory device of claim 1, wherein:
each layer within the alternating stack extends along a first horizontal direction;
each electrically conductive layer other than the at least one first drain-select-level electrically conductive layer and the at least one second drain-select-level electrically conductive layer laterally extends along the first horizontal direction between, and is laterally bounded by, a first backside trench and a second backside trench that laterally extend along the first horizontal direction; and
one or more of the at least one first drain-select-level electrically conductive layer and the at least one second drain-select-level electrically conductive layer laterally extend along the first horizontal direction between, and are laterally bounded by, the first backside trench and a dielectric isolation structure located between, and laterally spaced from, the first backside trench and the second backside trench.

13. The memory device of claim 1, wherein:
at least one first drain-select-level electrically conductive layer comprises multiple first drain-select-level electrically conductive layers;
the first drain select transistor comprises a series connection of multiple component field effect transistors located at the levels of the multiple first drain-select-level electrically conductive layers; and
each of the multiple component field effect transistors other than a bottommost one of the multiple component field effect transistors has a higher threshold voltage than the bottommost one of the multiple component field effect transistors.

14. The memory device of claim 1, wherein:
the memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprising at least a first control gate electrode located in the first device level and a second control gate electrode located in the second device level.

* * * * *